(12) United States Patent
McCallister

(10) Patent No.: US 8,611,459 B2
(45) Date of Patent: Dec. 17, 2013

(54) TRANSMITTER LINEARIZED USING LOOK-UP TABLE WITH UNADAPTABLE DATA AND METHOD THEREFOR

(75) Inventor: Ronald Duane McCallister, Scottsdale, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 0 days.

(21) Appl. No.: 13/408,819

(22) Filed: Feb. 29, 2012

(65) Prior Publication Data

US 2013/0223565 A1 Aug. 29, 2013

(51) Int. Cl.
*H04K 1/02* (2006.01)

(52) U.S. Cl.
USPC ........... 375/296; 375/229; 375/295; 375/297; 455/63.1; 455/67.13; 455/69; 455/91; 455/114.3; 455/522; 330/149

(58) Field of Classification Search
USPC ................. 375/229, 295, 296, 297; 455/63.1, 455/67.13, 69, 91, 114.3, 522; 330/149
See application file for complete search history.

(56) References Cited

U.S. PATENT DOCUMENTS

| | | |
|---|---|---|
| 4,591,803 A | 5/1986 | Saleh |
| 5,272,450 A | 12/1993 | Wisherd |
| 6,081,160 A | 6/2000 | Custer et al. |
| 6,697,436 B1 * | 2/2004 | Wright et al. ................. 375/296 |
| 7,106,134 B2 | 9/2006 | Khanifar et al. |
| 7,170,343 B2 | 1/2007 | Jin et al. |
| 7,340,005 B2 * | 3/2008 | Kim et al. ..................... 375/296 |
| 7,469,491 B2 | 12/2008 | McCallister et al. |
| 7,479,828 B2 | 1/2009 | Benedict |
| 7,551,905 B2 | 6/2009 | Kubo et al. |
| 7,773,692 B2 | 8/2010 | Copeland et al. |
| 7,957,707 B2 * | 6/2011 | Staudinger et al. ........ 455/114.2 |
| 2003/0169829 A1 | 9/2003 | Vella-Coleiro |
| 2004/0198268 A1 | 10/2004 | Rashev et al. |

(Continued)

FOREIGN PATENT DOCUMENTS

KR 2001-0083262 A 9/2001

OTHER PUBLICATIONS

Alghanim et al., "Reduction of Electrical Baseband Memory Effect in High-Power LDMOS Devices Using Optimum IF Termination", (Microwave Symposium Digest, 2008 IEEE MTT-S International), Jun. 2008, pp. 415-418, Atlanta, Georgia.

(Continued)

*Primary Examiner* — Leon Flores
(74) *Attorney, Agent, or Firm* — Schmeiser, Olsen & Watts LLP; Lowell W. Gresham

(57) ABSTRACT

A transmitter (50) includes a low power nonlinear predistorter (58) that inserts predistortion configured to compensate for a memoryless nonlinearity (146) corresponding to gain droop and another memoryless nonlinearity (148) corresponding to a video signal. When efforts are taken to reduce memory effects, such as configuring a network of components (138) that couple to an HPA (114) to avoid resonance frequencies within a video bandwidth (140), high performance linearization at low power results without extending linearization beyond that provided by the memoryless nonlinear predistorter (58). A unadaptable look-up table (370) has address inputs responsive to a magnitude parameter (152) of a communication signal (54), a magnitude derivative parameter (204) of the communication signal (54), and a parameter (346, 366) related either directly or indirectly to battery voltage. The unadaptable look-up table (370) produces a gain-correcting signal (284) that adjusts the gain applied to the communication signal (54) prior to amplification.

26 Claims, 18 Drawing Sheets

(56) References Cited

U.S. PATENT DOCUMENTS

| | | | |
|---|---|---|---|
| 2007/0296495 A1* | 12/2007 | Shako et al. | 330/149 |
| 2008/0287076 A1 | 11/2008 | Shen et al. | |
| 2009/0097590 A1 | 4/2009 | McCallister et al. | |
| 2009/0124218 A1 | 5/2009 | McCallister et al. | |
| 2009/0227215 A1 | 9/2009 | McCallister | |
| 2009/0323856 A1 | 12/2009 | McCallister | |

OTHER PUBLICATIONS

Cavers, "A Linearizing Predistorter With Fast Adaptation", (40th IEEE Vehicular Technology Conference), May 1990, pp. 41-47, Canada.

Cha et al., "Memory Effect Minimization and Wide Instantaneous Bandwidth Operation of a Base Station Power Amplifier", (Microwave Journal 2007 Issue), Jan. 2007, pp. 66-76, vol. 50, No. 1, South Korea.

Chalermwisutkul, "Phenomena of Electrical Memory Effects on the Device Level and Their Relations", (Proceedings of ECTI-CON 2008), May 2008, pp. 229-232, Thailand.

Ding et al., "A Memory Polynomial Predistorter Implemented Using TMS320C67XX", (Proceedings of Texas Instruments Developer Conference), Feb. 2004, pp. 1-7, Texas, USA.

Doudorov, "Evaluation of Si-LDMOS Transistor for RF Power Amplifier in 2-6 GHz Frequency Rang", (MS Thesis, Linköping University), Jun. 5, 2003, Linköping, Sweden.

Liu et al., "Deembedding Static Nonlinearities and Accurately Identifying and Modeling Memory Effects in Wide-Band RF Transmitters", (IEEE Transactions on Microwave Theory and Techniques), Nov. 2005, pp. 3578-3587, vol. 53, No. 11, Canada.

Liu et al., "Linearization of Wideband RF Doherty Power Amplifiers with Complex Dynamic Nonlinearities", (Communications and Networking in ChinaCom 2008), Aug. 2008, pp. 974-977, China.

Morgan et al., "A Generalized Memory Polynomial Model for Digital Predistortion of RF Power Amplifiers", (IEEE Transactions on Signal Processing), Oct. 2006, pp. 3852-3860, vol. 54, No. 10, Canada.

Paasschens et al., "Dependence of Thermal Resistance on Ambient and Actual Temperature", (Proceedings of the 2004 Meeting on Bipolar Bicmos Circuits & Technology), Sep. 2004, pp. 96-99, The Netherlands.

Rahkonen et al., "Polynomial 2.1 GHz RF Predistorter IC With Envelope Injection Output", (Norchip Conference Oulu, University of Oulu), Nov. 21-22, 2005, pp. 230-233, Oulu, Finland.

Rey et al., "RF Power Amplifier Modeling Using Polynomials With IIR Bases Functions", (IEEE Microwave and Wireless Components Letters, © 2009 IEEE), pp. 43-46, Canada.

Saleh, et al., "Improving the Power-Added Efficiency of FET Amplifiers Operating with Varying-Envelope Signals", (IEEE Transactions on Microwave Theory and Techniques), vol. 31, No. 1, Jan. 1983.

Schurack et al., "Analysis and Measurement of Nonlinear Effects in Power Amplifiers Caused by Thermal Power Feedback", (IEEE International Symposium on Circuits and Systems), May 1992, pp. 758-761, Munich, Germany.

Stevenson Kenney, et al., "Identification of RF Power Amplifier Memory Effect Origins using Third-Order Intermodulation Distortion Amplitude and Phase Asymmetry", School of Electrical and Computer Engineering, Georgia Institute of Technology, Atlanta, Georgia, 2006 IEEE.

Tornblad et al., "Modeling and Measurements of Electrical and Thermal Memory Effects for RF Power LDMOS", (IEEE/MTT-S International Microwave Symposium), Jun. 2007, pp. 2015-2018, USA.

Vuolevi, et al., "Distortion in RF Power Amplifiers", Chapter 7, 2003, Artech House, Inc., Norwood, Massachusetts.

Younes et al., "An Accurate Complexity-Reduced "PLUME" Model for Behavioral Modeling and Digital Predistortion of RF Power Amplifiers", (© 2010 IEEE), pp. 1-9, Canada.

Zhu et al., "An Overview of Volterra Series Based Behavioral Modeling of RF/Microwave Power Amplifiers", (RF & Microwave Research Group University College Dublin © 2006 IEEE), pp. 1-5, Ireland.

Yong-Sheng et al., "Research of Electro-Thermal Memory Effect of RF Power Amplifier based on LDMOS EFT", (4th Asia-Pacific Conference on Environmental Electromagnetics), Aug. 2006, CEEM'2006/Dalian 4A2-09, pp. 787-791, China.

Li et al., "A Fast Digital Predistortion Algorithm for Radio-Frequency Power Amplifier Linearization With Loop Delay Compensation", (IEEE Journal of Selected Topics in Signal Processing), Jun. 2009, pp. 374-383, vol. 3, No. 3.

Kwon, "Digitally Enhanced CMOS RF Transmitter With Integrated Power Amplifier", (University of Illinois at Urbana-Champaign, 2010 Dissertation), May 2010, Illinois.

International Search Report and the Written Opinion of PCT/US2011/057231, ISA, Jan. 31, 2012.

* cited by examiner

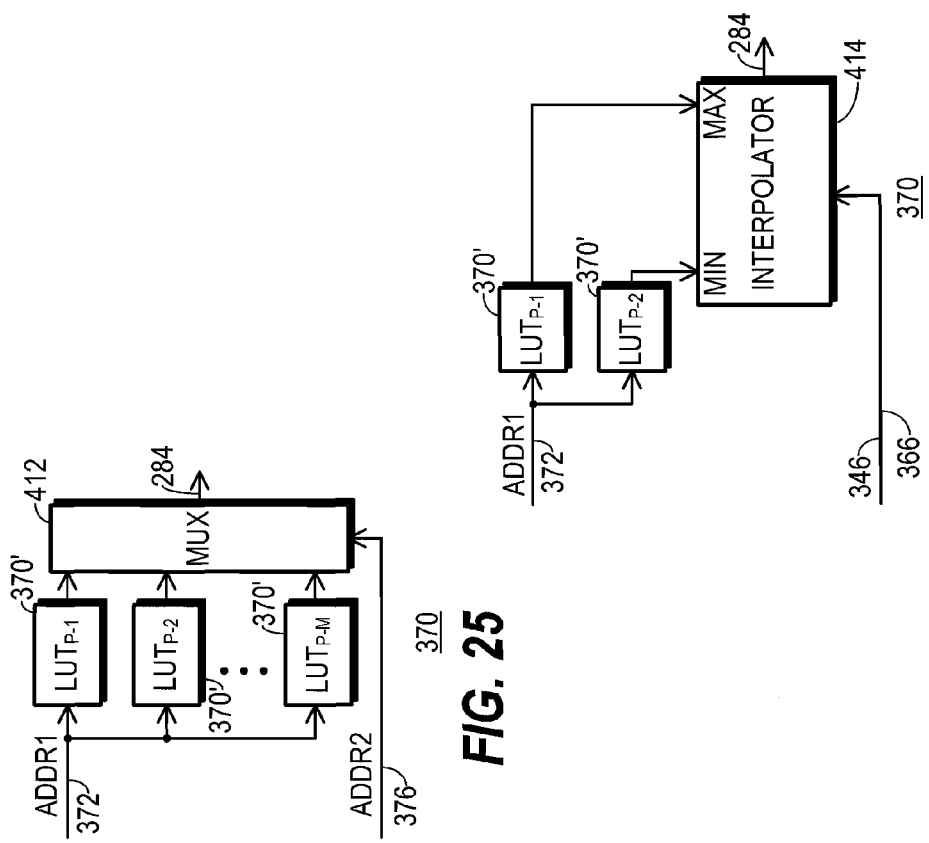
FIG. 25
FIG. 26
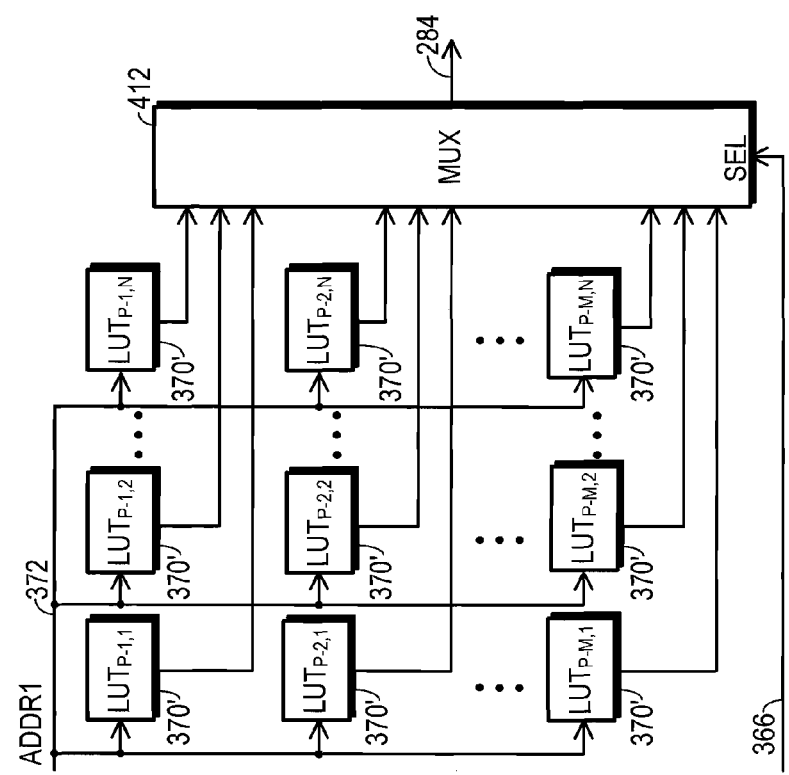
FIG. 24

TRANSMITTER LINEARIZED USING LOOK-UP TABLE WITH UNADAPTABLE DATA AND METHOD THEREFOR

TECHNICAL FIELD OF THE INVENTION

The present invention relates generally to the field of communication systems. Specifically, the present invention relates to predistorters which reduce distortion introduced into a communication signal by an imperfectly linear amplifier.

BACKGROUND OF THE INVENTION

Many popular modulation formats used in the field of digital communications assume the availability of a linear amplifier in a transmitter to boost a communication signal to a level at which it may be successfully broadcast from an antenna, then propagate to and be demodulated by a remotely located receiver. Linearity refers to the ability of an amplifier to faithfully reproduce a signal presented to it without causing the output signal from the amplifier to be distorted in some way. To the extent that the amplifier is imperfectly linear, distortion and spectral regrowth result. If this distortion and spectral regrowth are excessive, then the transmitter may fail to successfully operate within a spectral mask imposed by regulations and/or within power specifications.

Non-linearity in an amplifier causes the generation of signal harmonics as a unwanted byproduct of amplification. The even symmetry component of the non-linearity gives rise to near DC signal energy as well as to RF signal energy. Even ordered harmonics include near DC, low frequency components, collectively referred to as a video signal. The second harmonic forms a video component occupying double the baseband bandwidth, the fourth harmonic forms a video component occupying quadruple the baseband bandwidth, and so on. This envelope-induced video signal modulates amplifier gain causing further deterioration in amplifier linearity.

In some applications it is desirable to improve the power-added efficiency of the amplifier by the use of one or more variable amplifier bias signals. Such variable bias signals exhibit signal dynamics near DC, with frequency components that fall in the video signal bandwidth. They represent another form of video signal that can further modulate amplifier gain, causing still further deterioration in amplifier linearity.

FIG. 1 shows a representative amplifier portion of a conventional RF transmitter. To minimize distortion resulting from the video signal, the bias circuits and matching networks for the amplifier are conventionally configured to have as low an impedance to ground in the video band as possible. The lower the video impedance, the lower the video signal voltage, the smaller the envelope-induced bias modulation, the smaller the variable-bias-signal-induced modulation, and the smaller the distortion resulting from the video signal. In this conventional approach a number of envelope-trapping capacitors 30, often more than the three depicted in FIG. 1, have been included to implement an envelope trap by lowering the impedance in the video signal bandwidth.

FIG. 2 shows a chart of representative bias circuit impedances presented to an amplifier in accordance with a conventional approach that uses envelope trapping. Throughout the video bandwidth, one or more impedance minima 32 are presented, causing the overall impedance to remain in a low impedance range $Z_L$. Each impedance minima 32 occurs at a resonance frequency for the network of components coupled to the HPA. The resonance frequencies are determined by the envelope-trapping capacitors 30 operating in connection with other components that are largely inductive, such as quarter-wave transmission lines (for the fundamental RF band), RF chokes, HPA package bond wires, and the like. Thus, capacitance values are chosen and envelope-trapping capacitors 30 placed in positions in the network of components where different resonance frequencies can be achieved to maintain overall video bandwidth impedance in the low impedance range $Z_L$.

FIG. 2 also shows that in addition to low video impedance the bias circuits coupled to the HPA present a high impedance $Z_H$ throughout the fundamental RF frequency range, and impedance returns to the low impedance range $Z_L$ at higher harmonics. The high impedance range $Z_H$ exhibited in the fundamental RF band results in large part from the high impedance exhibited by the quarter-wave transmission line or RF choke in the fundamental RF band. High impedance for bias circuits in the fundamental RF band is desirable because it blocks the fundamental RF energy away from the bias circuits, causing the fundamental RF energy to flow through the output matching network and across a load $R_L$, which exhibits a much lower impedance in the fundamental RF band. The low impedance range $Z_L$ exhibited by bias circuits at second and higher harmonics results from the presence of RF-trapping capacitors 34 (FIG. 1) to form an RF trap. This band of low impedance is desirable because it helps shunts unwanted RF energy, including higher harmonic energy, to ground, effectively removing it from the output signal and preventing it from interfering with amplifier operation.

Through the use of envelope trapping, the video signal is held to a low level, and the distortion it causes in an amplified output signal is likewise reduced. But the video signal is not eliminated, so the distortion it causes remains to some extent. And, as bandwidths increase it becomes increasingly difficult to distribute a sufficient number of envelope-trapping capacitors 30 and the resulting impedance minima 32 throughout the entire video band in a manner that keeps video impedance sufficiently low, yet also achieves a sufficiently high impedance in the fundamental RF band. When impedance in the fundamental RF band is insufficiently high, amplifier efficiency suffers.

Furthermore, several different physical characteristics of an amplifier cause different nonlinearities, with the video-signal-induced nonlinearity being only one. Another form of nonlinearity is a memory effect, where an influence of the communication signal being amplified at one instant in time may be smeared over a considerable period. In essence, an amplifier acts in part like a collection of filters, or a complicated filter, with numerous undiscovered characteristics.

Conventional efforts aimed at expanding amplifier linearization techniques to include memory effects have found only marginal success. The difficulty associated with linearizing memory effects may result from the fact that conventional amplifiers appear to exhibit many different and distinct long term and short term memory effects cross correlated with one another but each having its own unique spectral characteristics and each contributing a different degree of distortion. The difficulty may have been exacerbated by the use of envelope trapping techniques, and exacerbated further by the use extensive envelope trapping techniques to address wider signal bandwidths, because each impedance minima may be responsible for a distinct memory effect.

One of the more successful conventional efforts at addressing memory effects results from the use of a Volterra model which characterizes the actual behavior of an amplifier, with a currently popular form of this approach being called a generalized memory polynomial (GMP) model. Unfortunately, due to numerous unknown terms, a considerable amount of cross correlation between the terms, and a large span of time over which different memory effects play out, a tremendous amount of power must be consumed to derive a system of equations that model the amplifier, then take the inverse of the system of equations, and implement that inverse system of equations in signal processing hardware. Consequently, this approach is generally viewed as being unacceptable for use in battery-powered transmitters. Moreover, the tremendous processing load of this approach usually dictates that compromises be made in loop bandwidths and in precision in modeling and inversing the amplifier transfer function. Consequently, this approach typically has trouble following signal dynamics and in achieving high quality linearization results.

Another conventional effort at addressing amplifier nonlinearities, including both video-signal induced distortion and memory effects, is called envelope injection. Generally, signal processing circuits process the outgoing communication signal along with a feedback signal obtained from the output of the amplifier in an attempt to generate a baseband signal that is added to, or injected with, the amplifier biasing with the aim of canceling the video signal. But the video signal is a wideband signal that results from a complicated assortment of harmonic components acting on a component network of unknown and complicated impedance, in accordance with unknown nonlinear relationships. And, for cancellation techniques to be effective, cancellation signals should be very precisely generated. Only limited success has been achieved without employing an excessive amount of processing power to resolve the unknown parameters.

As suggested above, characterizing the actual behavior of an amplifier for use in crafting predistortion requires the consumption of a significant and often excessive amount of power. This significant power use is certainly true of the approaches based on Volterra models, but it is also true of other techniques that adapt predistortion characteristics to the particularities of a given amplifier, temperature, and other transmitter circuits. Since the spectral regrowth produced by amplifier nonlinearity covers a larger bandwidth than the bandwidth allocated to the transmitter, predistortion signals intended to linearized an amplifier likewise tend to cover a range of spectrum larger than the bandwidth allocated to the transmitter. And, feedback signals generated from the transmitter's RF output signal that are used to compensate for spectral regrowth and adapt the predistortion characteristics to the transmitter's particularities of a given instant in time also tend to be captured and processed over a larger bandwidth. Reliance on high speed, highly precise processing, including an analog-to-digital converter, and excessive use of sample speeds 4-16 times greater than the fundamental bandwidth are highly undesirable factors in many transmitters, and particularly undesirable in mass market, battery powered devices where efficient use of power and low cost are typically high priority design criteria.

Digitally capturing and processing an extra wide bandwidth signal in the feedback path is a significant contributor to power consumption and to increased costs. Accordingly, a need exists for a transmitter and method that reduces the power conventionally consumed in processing a feedback signal while nevertheless providing effective digital predistortion. And, in order for the digital predistortion to be highly effective, a need exists for a linearized transmitter and transmitter linearizing method that expand linearization efforts to address video-signal induced distortion and memory effects without consuming an excessive amount of processing power.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 24 shows a first alternate embodiment of a look-up table depicted in the predistorter of FIG. 21;

FIG. 25 shows a second alternate embodiment of the look-up table depicted in the predistorter of FIG. 21; and FIG. 26 shows a third alternate embodiment of the look-up table depicted in the predistorter of FIG. 21.

DETAILED DESCRIPTION OF THE PREFERRED EMBODIMENTS

Figure 3:
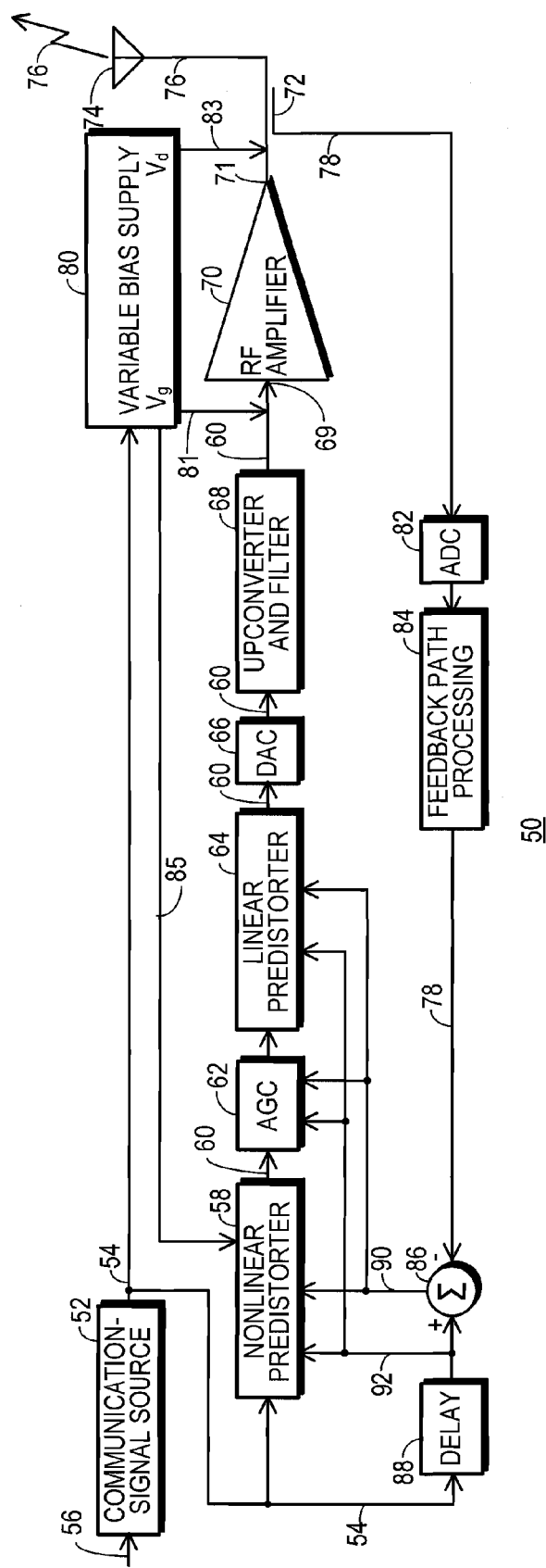
FIG. 3 shows a simplified block diagram of a transmitter configured in accordance with one embodiment of the present invention.

FIG. 3 shows a simplified block diagram of a transmitter 50 configured in accordance with the teaching of one embodiment of the present invention. In the embodiment explicitly depicted in the figures, transmitter 50 is configured to wirelessly transmit an RF communication signal. But those skilled in the art will appreciate that the present invention may also be used in other types of communication systems, including a communication system that transmits optical signals through an optical transmission medium, a system that transmits signals to a magnetic recording medium, and in other applications, such as audio amplification.

Transmitter 50 includes a communication-signal source 52. Communication-signal source 52 provides a digitally modulated, complex, baseband version of a communication signal 54. A communication signal, such as communication signal 54 and others discussed below, is an electronic signal that may undergo a variety of different processing steps and be represented in a variety of different ways, including as one or more digital streams of data or as one or more analog signals. A communication signal has been modulated with information and/or data. The transmission of this information and/or data is the primary purpose of transmitter 50, and a communication signal could be demodulated or otherwise processed to recover the information and/or data.

Communication-signal source 52 may perform any number of activities well known to those skilled in the art of digital transmitters. For example, raw data to be transmitted from transmitter 50 may be digitally modulated using a suitable form of digital modulation, such as QPSK, CDMA, OFDM, or the like. Multiple data streams 56 may have been digitally modulated and combined together for transmission, as is common in a cellular base station, or a single data stream 56 may have been digitally modulated for transmission, as is common in an end-user's wireless device, such as a cell phone, laptop, netbook, electronic book, wireless network adapter, wireless router, and the like. The digitally modulated signal may have been pulse shaped to limit bandwidth while minimizing intersymbol interference (ISI). Additional processing may have been performed to reduce the peak-to-average power ratio. Any or all of these and other types of signal processing activities may be performed at communication-signal source 52.

As a result of the processing performed at communication-signal source 52, communication signal 54 is a baseband, digitally modulated, complex signal that exhibits a bandwidth roughly equal to the bandwidth allocated to transmitter 50 for the transmission of RF energy. This bandwidth is typically allocated by a governmental agency which controls licensing of spectrum and devices that use the spectrum. This bandwidth resides at baseband (i.e., near DC). Desirably, communication signal 54 is an analytic signal having a bandwidth centered at or near 0 Hz.

Communication signal 54 drives a nonlinear predistorter 58. Nonlinear predistorter 58 spectrally processes communication signal 54 to intentionally introduce wide bandwidth distortion into the communication signal. This distortion is introduced upstream of an amplifier that will eventually amplify the communication signal, and it is configured to counteract distortion that the amplifier will impart to the version of the communication signal that it amplifies. This distortion extends over a bandwidth that exceeds the bandwidth of communication signal 54. Although not shown in FIG. 3, the sampling rate of communication signal 54 may be increased to accommodate the increased bandwidth. Nonlinear predistorter 58 converts the communication signal into a predistorted communication signal 60. Nonlinear predistorter 58 is discussed in more detail below in connection with FIGS. 4 and 8-16.

Predistorted communication signal 60 from nonlinear predistorter 58 drives an automatic gain control (AGC) section 62 which normalizes an amplitude parameter of predistorted communication signal 60. In one embodiment, section 62 is implemented as a one-tap adaptive complex multiplier, where adaptation of the tap through the operation of a control loop controls the gain provided to predistorted communication signal 60 to provide the automatic gain control function. Predistorted communication signal 60 from AGC section 62 then drives a linear predistorter 64.

At section 64 the communication signal is spectrally processed to introduce linear predistortion. The linear predistortion is desirably configured to compensate for linear distortion introduced downstream of linear predistorter 64. Predistorted communication signal 60 is presented at the output of linear predistorter 64 in a form that includes both linear and nonlinear predistortion.

Predistorted communication signal 60 propagates from linear predistorter 64 toward a digital-to-analog converter (DAC) 66. DAC 66 converts predistorted communication signal 60 into an analog signal that drives an upconverter and filter section 68. Section 68 frequency shifts predistorted communication signal 60, now in analog form, to the allocated RF fundamental frequency band for transmitter 50 and filters the frequency-shifted signal to pass only a desired sideband. Section 68 produces an RF form of the communication signal. Predistorted communication signal 60, now in RF form, is then fed to an input 69 of an amplifier 70. In one embodiment, amplifier 70 is a radio-frequency (RF) amplifier, or high-power amplifier (HPA), known to those of skill in the art of wireless communications. But those skilled in the art will appreciate that other applications may employ other types of amplifiers, including cascades or other arrangements of several amplifiers.

In the embodiment depicted in FIG. 3, an output 71 of amplifier 70 couples through a directional coupler 72 to an antenna 74. Amplifier 70 amplifies the RF form of communication signal 60 to produce an amplified RF signal 76, which is broadcast from transmitter 50 at antenna 74. Desirably, the nonlinear and linear predistortion respectively introduced upstream through the operations of nonlinear predistorter 58 and linear predistorter 64 are of the correct character and composition to cancel distortions introduced downstream of DAC 66, and amplified RF signal 76 closely corresponds to a linear amplification of communication signal 54 provided by communication-signal source 52, but in analog form and shifted in frequency to the allocated frequency band for transmitter 50.

In order for the upstream predistortions to be of the correct character and composition to cancel distortions introduced downstream of DAC 66 it is desirable in one embodiment that amplified RF signal 76 be monitored and that the upstream predistortions be responsive to amplified RF signal 76. Accordingly, a tap-off port of directional coupler 72 extracts a small portion of amplified RF signal 76 for use as a feedback signal 78. Feedback signal 78 is routed through an analog-todigital converter (ADC) 82, where it is then presented to a feedback path processing section 84. ADC 82 desirably operates at high speed and is phase coherent with the upconversion of section 68 so as to perform downconversion by digital subharmonic sampling. This form of downconversion is desirable because it lessens the corruption of feedback signal 78 that might occur if downconversion is performed through a more analog-intensive form of downconversion. But other forms of downconversion may also be used provided they introduce sufficiently low distortion into feedback signal 78.

Processing section 84 performs digital processing on feedback signal 78. In particular, processing section 84 desirably includes a Hilbert transformation to place feedback signal 78 in a complex, analytic signal form. And, processing section 84 may include a phase rotation to compensate for phase rotation introduced downstream of DAC 66, primarily in a band-pass filter portion of section 68, and a gain adjustment for the nominal linear HPA gain. Eventually, feedback signal 78, now in digital complex form, is supplied to a negative input of a subtraction circuit 86.

Communication signal 54 from communication-signal source 52 is also fed through a delay element 88 to a positive input of subtraction circuit 86. Although not shown, the sample rate of communication signal 54 may be increased prior to application at subtraction circuit 86 to accommodate the full bandwidth of feedback signal 78, which is wider than the bandwidth of communication signal 54. Delay element 88 is configured to temporally align communication signal 54 with feedback signal 78 at subtraction circuit 86. In other words, delay element 88 is configured so that a sample of communication signal 54 processed through a first path which includes delay element 88 and a second path that includes amplifier 70 and feedback path processing section 84 arrive at subtraction circuit 86 at the same time.

An output of subtraction circuit 86 generates an error signal 90 which describes the manner in which amplified RF signal 76 fails to be a linear amplification of communication signal 54. Error signal 90 and communication signal 54 configured in a delayed form 92 are each presented to control inputs of nonlinear predistorter 58, AGC section 62, and linear predistorter 64.

In one embodiment, linear predistorter 64 is implemented using an adaptive equalizer that adjusts equalizer coefficients in response to a least-means square (LMS) based control loop algorithm. The adaptive equalizer of linear predistorter 64 desirably estimates coefficient values for the taps of a finite impulse response (FIR) filter to influence the amount of linear distortion in amplified RF signal 76, then alters these coefficients over time to adjust the predistortion transformation function (transform) applied by the adaptive equalizer and to achieve decreasing amounts of linear distortion until convergence is reached at a minimum amount of linear distortion. The control loop trains linear predistorter 64 to reduce linear distortion in response to correlation between the conjugated form of error signal 90 and delayed communication signal 92. The control loop may be configured to adapt coefficients only during periods of substantially linear amplifier operation. Those skilled in the art may devise other forms of linear predistorters for use in transmitter 50.

In one embodiment, AGC circuit 62 also adjusts its complex tap coefficient in response to an LMS-based control loop algorithm. AGC circuit 62 implements an update algorithm similar to that of linear predistorter 64, except that only a single tap needs to be adapted to normalize the gain applied by amplifier 70, directional coupler 72, and other components in the control loop. Those skilled in the art will appreciate that gain may be normalized by applying amplification or attenuation as may be needed to maintain a substantially constant gain value, such as one. Normalizing an amplitude parameter of predistorted communication signal 60 at AGC circuit 62 is desirable so that error signal 90 accurately characterizes the difference between communication signal 54 and feedback signal 78 notwithstanding any long-term or average gain than may be applied through the analog components of transmitter 50, including amplifier 70. And, the control loop algorithm for AGC circuit 62 may operate at a much faster loop bandwidth than that of linear predistorter 64 and than that of nonlinear predistorter 58 (discussed below). By operating at a much faster loop bandwidth, e.g., 10 KHz-100 KHz versus 10-200 Hz, some of the slower memory effect nonlinearities, such as thermal memory effects, may be tracked through AGC adaptation. Linear predistorter 64 may desirably operate at a lower loop bandwidth to conserve power consumption and to decouple its control loop from that of AGC section 62. To further isolate the control loop for AGC section 62 from other control loops operating in transmitter 50, AGC section 62 may desirably use a leaky integrator in its LMS-based continuous process adaptation control loop.

In one embodiment (not shown in FIG. 3) simple DC signals may be fed to the input and output of amplifier 70 through bias circuits (not shown) for the purpose of biasing amplifier 70. In another embodiment, communication signal 54 from communication-signal source 52 is fed to an input of a variable bias supply 80. Variable bias supply 80 supplies a non-DC input bias signal 81 to input 69 of amplifier 70 and/or a non-DC output bias signal 83 to output 71 of amplifier 70. Bias signals 81 and 83 may be directed to amplifier 70 through suitable bias circuits (not shown).

Variable bias supply 80 may be implemented in a manner consistent with conventional bias control circuits known to those skilled in the art. Thus, variable bias supply 80 may be configured so that one or more of bias signals 81 and 83 roughly track the envelope of communication signal 54. And, when variable bias supply 80 is configured so that one or more of bias signals 81 and 83 roughly track the envelope of communication signal 54, it may be desirable that the variable bias supply 80 implement a process which causes bias signals 81 or 83 to exhibit a bandwidth less than the bandwidth of communication signal 54. Bias signals 81 and 83 represent video bandwidth signals that vary the bias conditions applied to amplifier 70. As discussed below, video bandwidth bias signals 81 and 83 represent a portion of the factors that determine the gain applied by amplifier 70 and the distortion introduced into the communication signal 60 amplified by amplifier 70. In order to account for this portion of the distortion, one or more variable bias parameters 85 are fed from variable bias supply 80 to nonlinear predistorter 58. Variable bias parameters 85 may be precise or imprecise digital representations of varying voltages exhibited by bias signals 81 and/or 83, or other properties of bias signals 81 and/or 83 whose values characterize signals 81 and/or 83.

Figure 4:
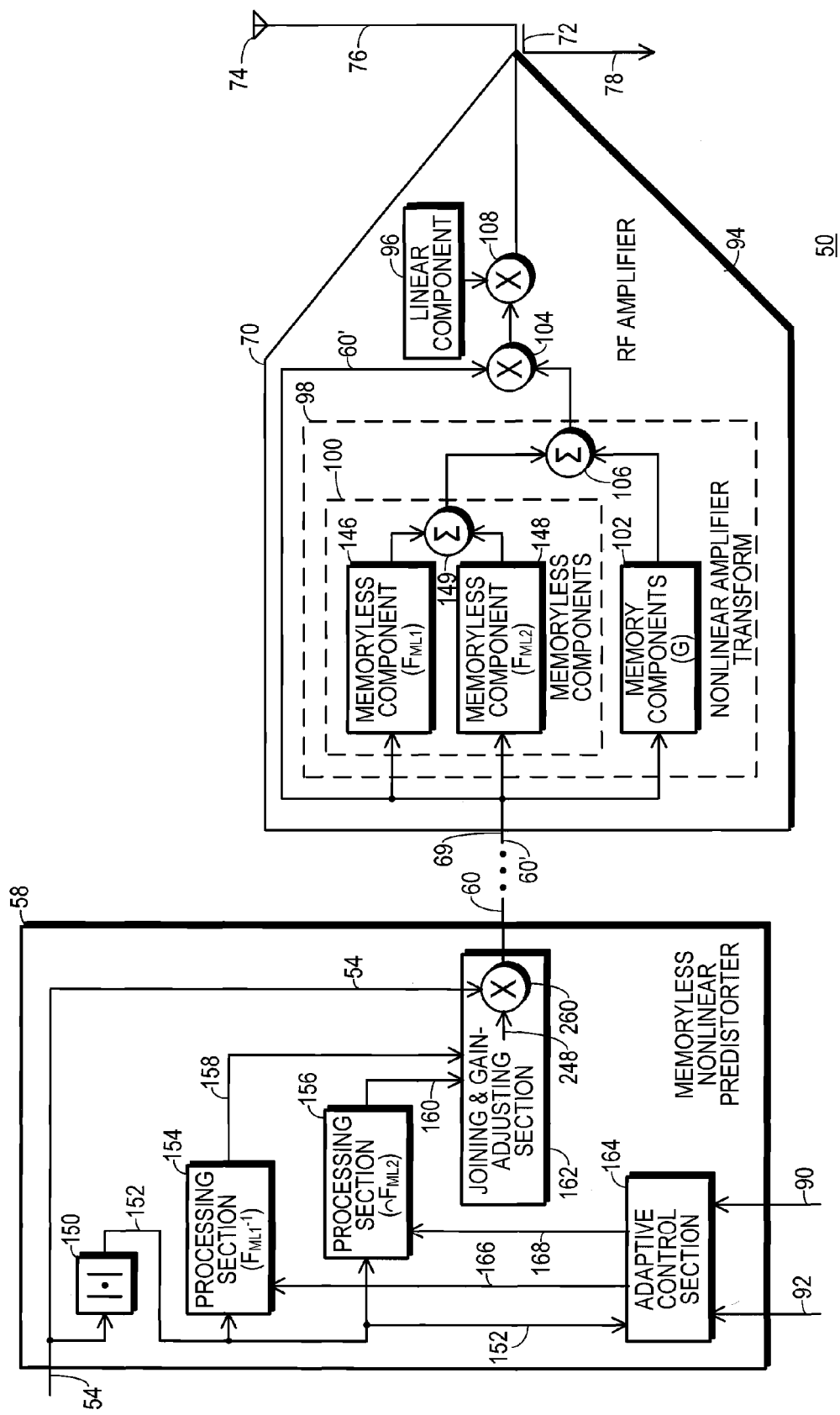
FIG. 4 shows a simplified block diagram of the transmitter of FIG. 3, with details shown concerning a first embodiment of a nonlinear predistorter portion of the transmitter.

FIG. 4 shows a simplified block diagram of transmitter 50 as discussed above and as shown in FIG. 3, but with details concerning a first embodiment of nonlinear predistorter 58 shown, with details of a behavioral model 94 for amplifier 70 shown, and with other details omitted.

The block diagram of model 94 presented in FIG. 4 provides an explanation for the way in which linear and nonlinear influences associated with amplifier 70 appear to behave. Those skilled in the art will appreciate that amplifier 70 is constructed from real components and materials that fail to operate precisely as desired. Accordingly, models, such as model 94, may be devised to explain the manner in which amplifier 70 appears to actually operate. The specific components of model 94 need not be individually observable in a real-world version of amplifier 70.

Model 94 depicts amplifier 70 as having its overall transfer function partitioned into a linear component 96 and a nonlinear component, referred to herein as a nonlinear amplifier transfer function or transform 98. Linear component 96 describes the constant linear gain value ideally applied by amplifier 70. In other words, if amplifier 70 had a perfectly linear response, then amplified RF signal 76 would be accurately described by the multiplication of input signal 60' with constant value linear component 96. Input signal 60' is the communication signal formed from predistorted communication signal 60 provided at input 69 of amplifier 70. But amplifier 70 is not perfectly linear, and nonlinear amplifier transform 98 describes the manner in which it is not.

Model 94 indicates that nonlinear amplifier transform 98 is partitioned into two distinct types of nonlinear components, referred to as nonlinearities herein. Each component is characterized as a distinct distortion in the gain applied by amplifier 70. The two types include memoryless components 100 and memory components 102.

Although not shown, memory components 102 may include any number of individual memory components, or memory effects, coupled in parallel, with each memory component corresponding to a specific memory nonlinearity of amplifier 70. Memory effects 102 include thermal nonlinearities, which may exhibit unknown corner or resonance frequencies in the KHz-100 KHz range, and electrical nonlinearities, which typically exhibit unknown corner or resonance frequencies above 100 KHz. Thermal nonlinearities result from ambient-environment heating and self-heating in the active amplifying device used by amplifier 70. Electrical nonlinearities result from the use of energy storage devices, such as inductances and capacitances, in connection with processing bias signals and the analog version of predistorted communication signal 60 within amplifier 70 and elsewhere in transmitter 50. Memory components 102 apply a transform labeled "G" in FIG. 4.

Memoryless components 100 are discussed in more detail below. RF input signal 60' drives each of components 100 and 102, as well as a multiplication element 104. The sum of signals output from components 100 and 102, as depicted at an addition element 106, represents a gain factor by which amplifier 70 multiplies communication signal 60. This gain factor is nonlinearly related to communication signal 60. This multiplication operation is depicted at multiplication element 104. Model 94 indicates that the output of multiplication element 104 and the output of linear component 96 drive respective multiplicand inputs of a multiplication element 108, with the output of multiplication element 108 providing the output from amplifier model 94. Although not specifically shown, the output of nonlinear amplifier transform 98 is normalized so that it's output from addition element 106 would always equal one if amplifier 70 were perfectly linear. This may be accomplished by attributing a linear gain of "1" along with nonlinear gain to memoryless component 146.

Those skilled in the art will appreciate that model 94 is configured primarily to characterize the influence of nonlinearities. A more complete model may reflect other considerations. The more complete model is not presented here because it is unnecessary to an understanding of the nonlinearities to which the below-discussed features of the preferred embodiments of the present invention are directed.

Figure 5:
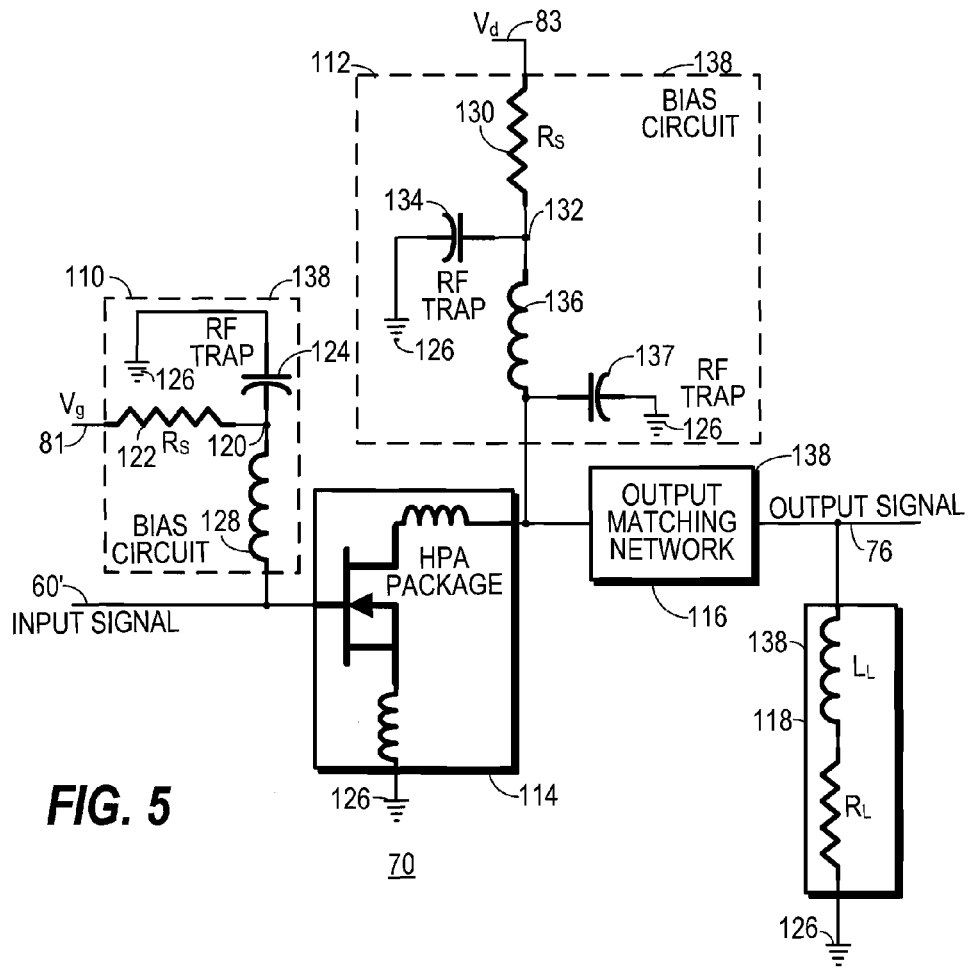
FIG. 5 shows a circuit diagram of a representative amplifier portion of the transmitter of FIG. 3.

FIG. 5 shows a circuit diagram of a representative amplifier 70. Transmitter 50 need not have an amplifier 70 configured precisely as depicted in FIG. 5, but many amplifiers which are suitable for use in transmitter 50 will include the basic blocks shown in FIG. 5, including an input bias circuit 110, an output bias circuit 112, a high power amplifier (HPA) package 114, an output matching network 116, and a load 118. For the purposes of discussing FIG. 5, HPA 114 refers to the active amplifying device or devices used by amplifier 70 to accomplish amplification when appropriately biased and matched.

RF input signal 60' is applied to input bias circuit 110 and to an input port of HPA 114. A fixed or variable input bias voltage, $V_g$, is also applied to input bias circuit 110. Input bias voltage $V_g$ may be provided by variable bias signal 81 from variable bias supply 80 (FIG. 3). A source resistance 122 appears between a common node 120 within input bias circuit 110 and the input bias voltage $V_g$. A capacitance 124 appears between common node 120 and a ground potential 126, and an inductor 128, configured as a quarter wave transmission line for the RF fundamental band or as a discrete inductor, appears between common node 120 and RF input signal 60'.

FIG. 5 depicts HPA 114 as a single MOS FET semiconductor device, but those skilled in the art will appreciate that other types of active devices and that multiple active devices coupled together may serve in the HPA role. In accordance with the particular MOS FET HPA device depicted in FIG. 5, a gate node of HPA 114 provides the input for HPA 114, a source node couples to ground potential 126, and a drain node provides the output for HPA 114. In the preferred embodiments, HPA 114 may be operated in a class A mode, class A/B mode, class B mode, or any other mode known to those of skill in the art. The drain node couples to output bias circuit 112 and to output matching network 116. As noted in FIG. 5, significant inductances are associated with internal HPA bondwires for the drain and source nodes.

A fixed or variable output bias voltage, $V_d$, is also applied to output bias circuit 112. Output bias voltage $V_d$ may be provided by variable bias signal 83 from variable bias supply 80 (FIG. 3). In an alternate embodiment, a fixed bias voltage $V_d$ may be applied to output bias circuit 112 as depicted in FIG. 5, with variable bias signal 83 coupled to output bias circuit 112 through a transformer (not shown) or other coupling device. A source resistance 130 appears between a common node 132 within output bias circuit 112 and the output bias voltage $V_d$. An inductor 136, configured as a quarter wave transmission line for the RF fundamental band or alternately as a discrete RF choke inductor, appears between common node 132 and the output of HPA 114. And, a capacitance 137 appears between the output of HPA 114 and ground potential 126.

Amplified RF signal 76 is provided across load 118, which appears across an output port of output matching network 116 and the common potential 126. Load 118 may be primarily resistive, and/or load 118 may also include a significant inductive component. A significantly inductive load may be present if a distributed active transformer (DAT) or similar component is used to couple multiple active devices to load 118. Collectively, input bias circuit 110, output bias circuit 112, output matching network 116, and load 118 provide a network of components 138 which couples to HPA 114.

In one embodiment, input and output bias voltages $V_g$ and $V_d$ are substantially constant DC voltages. A perfectly linear amplifier with constant DC bias voltages would operate at a constant bias condition. And, input signal 60' and the output signal from HPA 114 would then each consist of an RF fundamental signal combined with a DC component that corresponds to the constant bias condition.

But for real-world amplifier 70, nonlinearity, as described by nonlinear amplifier transform 98 (FIG. 4), causes a series of harmonics of the RF fundamental signal to be present as well. The even symmetry component of the nonlinearity gives rise to near DC signal energy as well as to RF signal energy. The near DC components generated with even ordered harmonics are collectively referred to as a video signal. And, when variable bias supply signals 81 and 83 are used to bias HPA 114, the video signal also includes variable bias supply signals 81 and 83. This video signal is present at least to some degree in input signal 60' and in the HPA 114 output signal. As a result, amplifier 70 operates at variety of bias conditions, where the variety of bias conditions are characterized as having an average bias condition and deviations away from the average bias condition, where the deviations correspond at least in part to the video signal.

Figure 1:
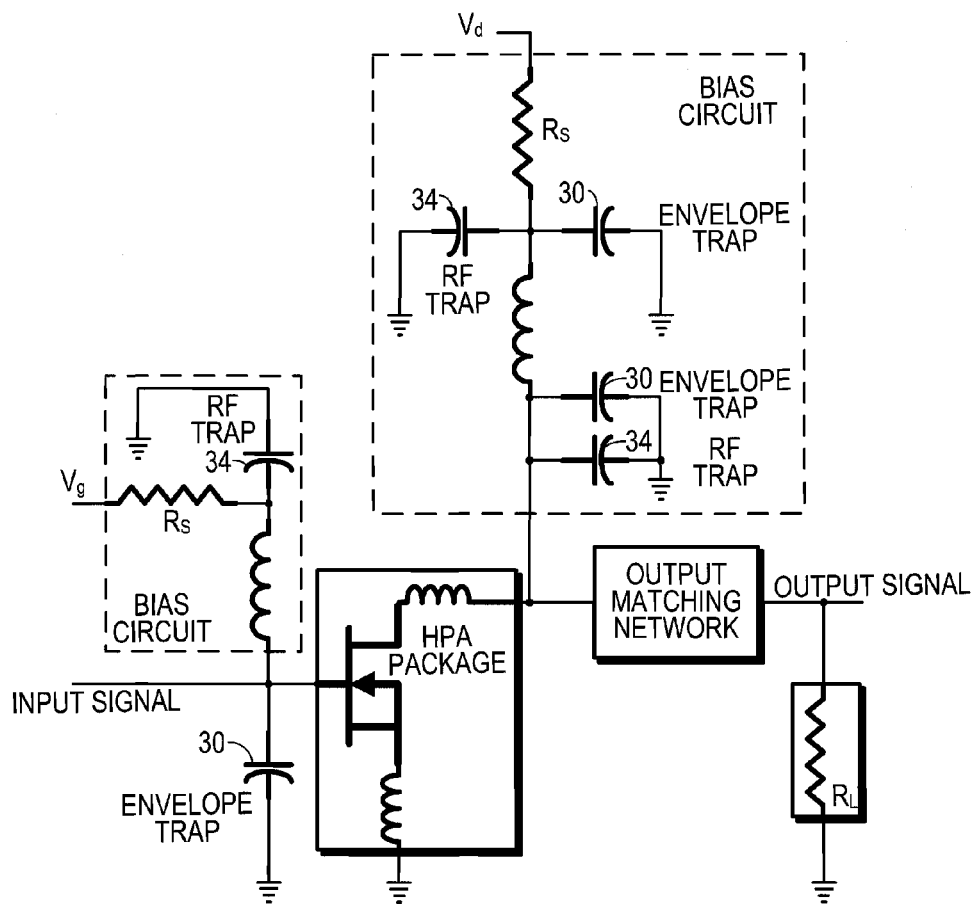
FIG. 1 shows a circuit diagram of a representative amplifier portion of a prior art RF transmitter.
Figure 2:
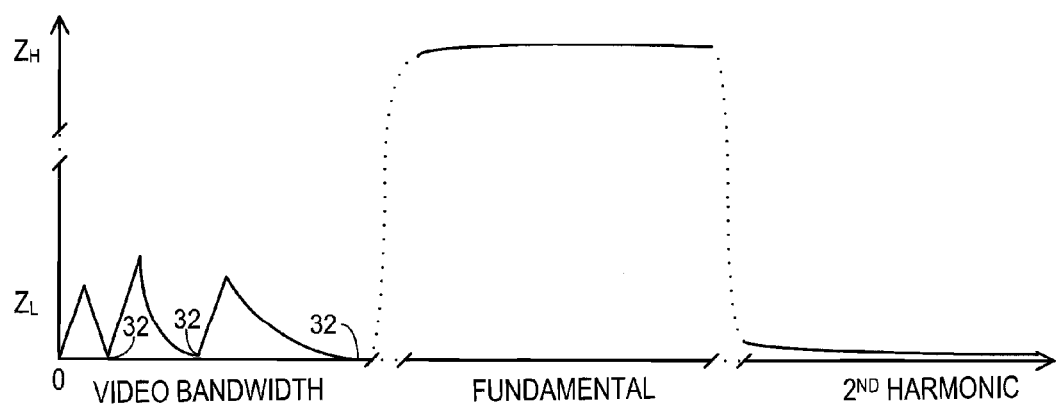
FIG. 2 shows a representative chart of impedances presented to an amplifier over various frequency bands in a prior art transmitter.
Figure 6:
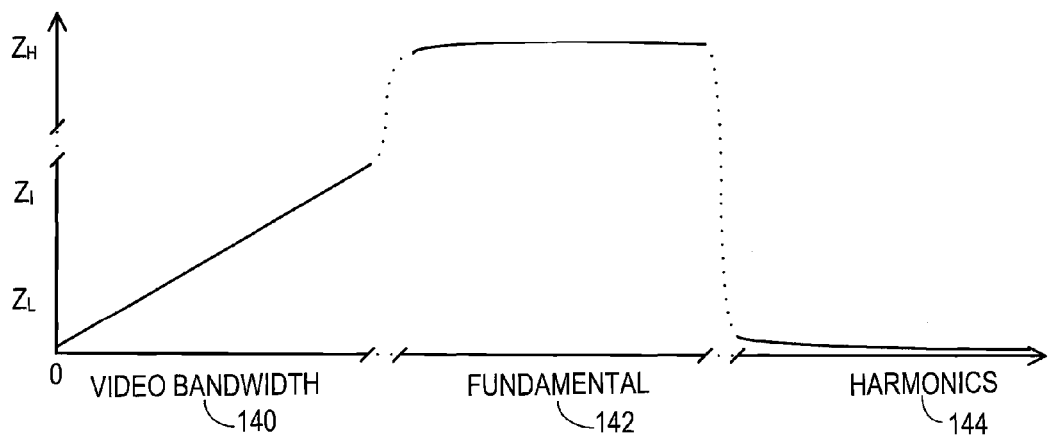
FIG. 6 shows a chart of representative impedances over various frequency bands presented to the active amplifying device of the amplifier portion of the transmitter of FIG. 3.

FIG. 6 shows a chart of representative impedances presented by bias circuits 110 and 112 over various frequency bands. In the preferred embodiment envelope trapping capacitors are omitted from amplifier 70. Consequently, substantially throughout a video bandwidth 140 impedance increases monotonically with increasing frequency. In one embodiment, no more than one impedance minima 32 (FIG. 2) is found in the upper 99% of video bandwidth 140. As discussed below, in some circumstances it may be useful to add an impedance minima 32 very near DC to decouple biasing for HPA 114 from other circuits associated with the bias supply source. Desirably, such an impedance minima 32 has little influence over the impedance profile throughout video bandwidth 140. Impedance need not increase monotonically and may also exhibit a region of substantially constant impedance with increasing frequency. Throughout video bandwidth 140, output matching network 116 and load 118 present a much higher impedance to HPA 114 than is presented by bias circuits 110 and 112, so the increasing or constant impedance depicted in FIG. 6 also describes the impedance presented to HPA 114 for network of components 138 throughout video bandwidth 140.

Video bandwidth 140 represents the bandwidth of the video signal generated by applying nonlinear amplifier transform 98 to RF input signal 60' and by using variable bias signals 81 and 83. Video bandwidth 140 typically exceeds a baseband bandwidth for communication signal 54 (FIG. 3), and for practical purposes, may be viewed as extending from near DC to the maximum sampling rate supported by the digital processing sections within transmitter 50 (FIG. 3) that process different forms of the communication signal. At the higher end of video bandwidth 140, impedance may extend out of a low impedance range, $Z_L$, into an intermediate impedance range, $Z_I$. The impedance values and trajectory in video bandwidth 140 result from the primarily inductive nature in video bandwidth 140 of the network of components 138 and the bondwire inductances for HPA 114.

The MOS FET HPA 114 depicted in FIG. 5 is viewed as a transconductance device, where RF input signal 60' is expressed as a voltage and the output at the drain of HPA 114 is expressed as a current. Any video signal present at the input of HPA 114 adds to the voltage of RF input signal 60'. The output current passing through the drain of HPA 114, including any video signal that is present, passes through bias circuit 112, developing a voltage signal. For video bandwidth 140, the video current signal acts upon the video impedance depicted in FIG. 6 to form a video voltage signal. Since the drain-to-source ($V_{ds}$) bias voltage for HPA 114 represents $V_d$ minus any voltage signal developed across output bias circuit 112, the video signal causes $V_{ds}$ bias conditions for HPA 114 to deviate from the average condition to a degree defined by the video impedance.

In a fundamental RF band 142, the impedance presented to HPA 114 by bias circuits 110 and 112 is desirably as high as practical. Desirably, the impedance is much higher than the highest impedance exhibited in video bandwidth 140. This high impedance substantially blocks fundamental RF energy from flowing into bias circuits 110 and 112. Fundamental RF band 142 represents the RF bandwidth assigned to transmitter 50 and within which RF transmitter 50 transmits. It desirably has a bandwidth approximately equal to the bandwidth of baseband communication signal 54 generated by communication-signal source 52 (FIG. 3). The impedance values and trajectory in RF fundamental band 142 results primarily from the high impedance exhibited by inductors 128 and 136 along with RF trap capacitors 124 and 134 within RF fundamental band 142.

While bias circuits 110 and 112 desirably present a high impedance to HPA 114 within fundamental RF band 142, output matching network 116 and load 118 present a low impedance, causing the bulk of RF fundamental energy to flow through load 118. In an embodiment where load 118 has a significant inductive component, that low impedance may also exhibit a trajectory with constant or increasing impedance for increasing frequency, similar to the video impedance depicted in FIG. 6 for video bandwidth 140.

In a harmonics band 144, impedance is desirably as low as practical. The impedance values in harmonics band 144 result at least in part from RF trapping implemented using capacitance 137, which is configured to provide a resonance frequency at the second harmonic.

Referring to FIGS. 4-6, memoryless components 100 of model 94 describe nonlinearities whose distorting influence on amplified RF signal 76 is completely extinguished within a short period of time. Memoryless components 100 may also be called instantaneous or static components. To the extent that a memoryless nonlinearity exhibits any filtering effects, such filtering effects are characterized by resonance frequencies and/or corner frequencies outside video bandwidth 140. Conversely, memory components 102 of model 94 describe memory effect nonlinearities whose distorting influence on amplified RF signal 76 is smeared over a significant period of time. Memory components 102 may be characterized as a filter or complex of filters having resonance frequencies and/or corner frequencies within video bandwidth 140.

Another distinction between memoryless and memory components 100 and 102 is that parameters which accurately characterize memoryless components 100 may be determined using considerably less processing power than is expended determining parameters which accurately characterize a variety of memory components 102. Power is reduced, at least in part, because unknown temporal parameters associated with such resonance frequencies and/or corner frequencies need not be determined to accurately characterize memoryless nonlinearities.

By substantially omitting envelope trapping capacitors from network of components 138, processing power need not be expended resolving memory effects associated with the video bandwidth 140 resonance frequencies such envelope trapping capacitors form. Network of components 138, substantially without envelope trapping capacitors, has an inductive nature throughout video bandwidth 140, which evidences a filtering effect, and in particular a high-pass filtering effect. But the corner frequency of this high-pass filter is desirably located above video bandwidth 140. Consequently, network of components 138 is desirably configured as a high-pass filter operated as a differentiator within video bandwidth 140.

Model 94 in FIG. 4 indicates that memoryless components 100 include at least two distinct subcomponents. One subcomponent is referred to as an average gain-droop component 146, and the other is referred to as a inductive memoryless component 148. Average gain-droop component 146 applies a mathematical transform labeled $F_{ML1}$, while inductive memoryless component 148 applies a different mathematical transform, labeled $F_{ML2}$. $F_{ML1}$ and $F_{ML2}$ define the respective memoryless nonlinear functions of the magnitude of RF input signal 60' respectively applied at components 146 and 148. Model 94 shows outputs from components 146 and 148 being added together at an addition element 149, and their sum then describing a component of amplifier gain through the operation of addition element 106. As discussed below, this component of amplifier gain accounts for a majority of the nonlinear distortion exhibited by amplifier 70.

Figure 7:
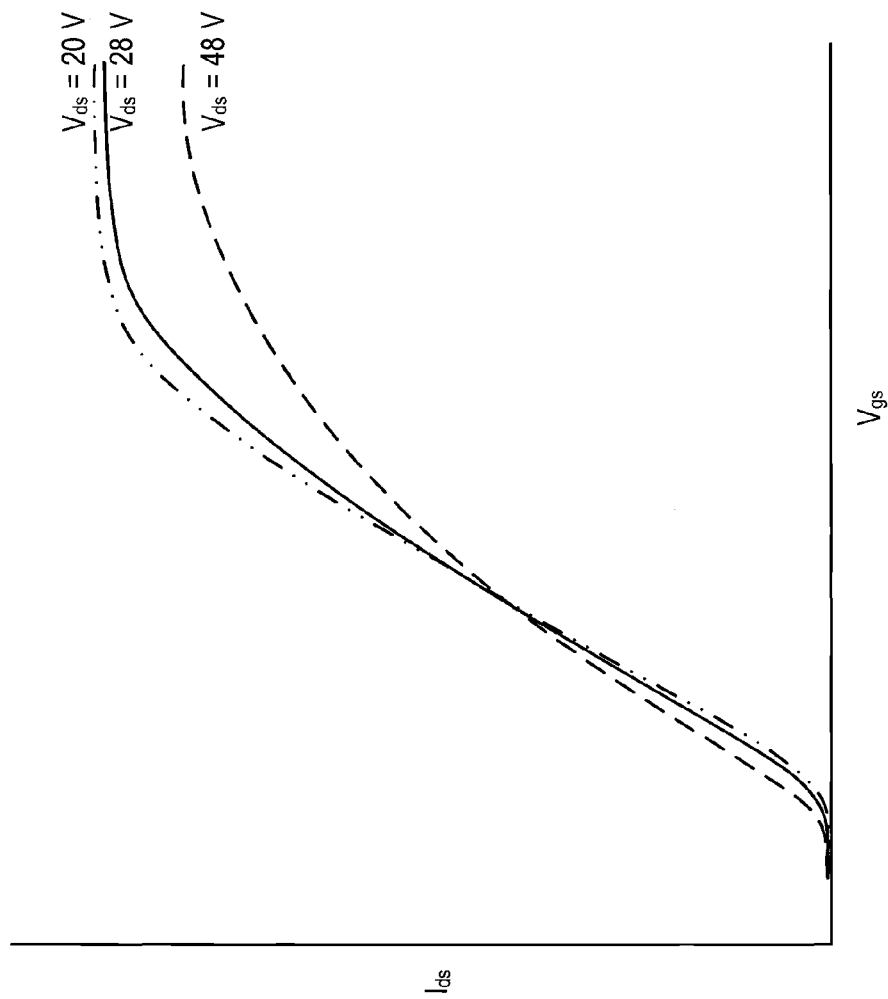
FIG. 7 shows a chart of representative gain curves for the active amplifier device of the amplifier portion of the transmitter of FIG. 3.

FIG. 7 shows a chart of representative transconductance gain curves for HPA 114 while experiencing an average influence within a range of memory effects, including thermal effects. The precise nature of the curve families will differ for different types of active devices which may serve as HPA 114, but certain features are common. In particular, two distinct types of nonlinearities are depicted.

One nonlinearity, which corresponds to average gain-droop component 146 (FIG. 4), is observed at each individual one of the curves shown in FIG. 7. At each single constant $V_{ds}$ bias condition, a nonlinear relationship exists between input signal gate-to-source voltage ($V_{gs}$) and output signal drain-to-source current ($I_{ds}$). Gain droops as $V_{gs}$ increases, and droops significantly at the higher end of the $V_{gs}$ range. This characterizes a nonlinear relationship that is a function of the magnitude of the input signal $V_{gs}$. This gain droop phenomenon is independent of any video signal effect because of the constant $V_{ds}$ bias condition. Likewise, for an average bias condition (e.g., $V_{ds}$=28 V) gain droop characterizes a nonlinearity that is independent of a video signal effect but a function of input signal magnitude. Moreover, this gain-droop phenomenon at any constant $V_{ds}$ or at an average $V_{ds}$ is a memoryless phenomenon because it results from the operation of HPA 114, which is not an energy storage device, such as an inductor or capacitor, when operated at a constant temperature.

Another nonlinearity, which corresponds to inductive memoryless component 148 (FIG. 4) and/or variable bias signals, is observed in connection with the differences between the individual curves shown in FIG. 7. The different curves have trajectories that differ in a variety of ways. For example, at the lower end of the input signal $V_{gs}$ range, moving from the $V_{ds}$=28 V curve to the $V_{ds}$=20 V results in reducing gain, but at the higher end of the input signal $V_{gs}$ range, moving from the $V_{ds}$=28 V curve to the $V_{ds}$=20 V results in increasing gain. Both the direction and the amount of gain changes resulting from operating at different $V_{ds}$ bias conditions are shown to be nonlinear functions of the input signal.

This video nonlinearity which is expressed in the different trajectories of the different curves shown in FIG. 7 is also a memoryless phenomenon because it results from the operation of HPA 114. But its influence is limited by the degree that the video signal causes bias conditions to deviate from an average bias condition, which is determined in part by the video impedance. To the extent that the video impedance remains memoryless by avoiding filter resonance and corner frequencies in video bandwidth 140, it remains a memoryless phenomenon.

This video memoryless nonlinearity component differs from the memoryless gain-droop nonlinearity component because it arises from different physical characteristics of amplifier 70. While gain-droop results from operating HPA 114 over a range of input signal magnitude at any constant bias condition or at an average bias condition, the video nonlinearity results from operating HPA 114 at a variety of different bias conditions, where the variety results at least in part from interaction between the video signal and the video bandwidth 140 impedance of the network of components 138 coupled to HPA 114.

Accordingly, FIG. 7 shows that HPA gain is partially explained as being a memoryless nonlinear function of RF input signal 60' even when bias conditions are constant. In other words, amplifier gain itself is modulated in response to input signal magnitude or envelope. And, when resonances and corner frequencies are substantially avoided in video bandwidth 140, gain is also partially explained as being a different memoryless nonlinear function of RF input signal 60' as bias conditions deviate from an average bias condition. In other words, gain is also modulated by envelope-induced deviations and/or bias-signal-induced deviations from an average bias condition. Between the two nonlinearities, gain-droop component 146 usually exerts a greater influence on the overall gain of amplifier 70 than inductive memoryless component 148. But as the impedance presented to HPA 114 by bias circuits 112 and 110 increases, the video signal voltage developed across bias circuits 112 and 110 likewise increases as does the amount of bias modulation experienced by HPA 114. Thus, greater video bandwidth 140 impedances lead to a worsening inductive memoryless component 148.

In an embodiment of amplifier 70 in which load 118 (FIG. 5) includes a significant inductive component, amplifier 70 may exhibit another memoryless nonlinearity that behaves similar to inductive memoryless component 148, but has a different physical basis. In particular, nonlinear amplifier transform 98 generates odd-ordered harmonics of RF input signal 60' as well as the above-discussed even-ordered harmonics that cause the video signal. The odd-ordered harmonics include components that fall in and near fundamental frequency band 142 (FIG. 6) as well as components that fall in harmonics band 144 (FIG. 6). These odd-ordered harmonic fundamental components may then act upon the inductive load, having a constant or increasing impedance with increasing frequency within fundamental band 142, in a substantially memoryless fashion, as described above for the video signal. While the below-presented discussion is primarily directed to nonlinear consequences of the video signal, it may likewise apply to odd-ordered harmonic fundamental components that act on a significantly inductive load 118.

FIG. 4 depicts a first embodiment of nonlinear predistorter 58 configured as a memoryless nonlinear predistorter. In particular, this memoryless embodiment of predistorter 58 crafts gain predistortions and applies these gain predistortions to communication signal 54. The gain predistortions crafted in predistorter 58 counteract the gain distortions imposed by memoryless components 146 and 148. In this embodiment, memory components 102 are desirably ignored by predistorter 58. In particular, thermal memory effects are assumed to impose such a small amount of distortion that they may be ignored altogether and/or are imposed so slowly that they may be compensated by the gain adjusting function of AGC section 62 (FIG. 3) or elsewhere. Electrical memory effects have been significantly minimized by removing resonance frequencies from the video bandwidth 140 impedance presented to HPA 114 by network of components 138 (FIG. 5). Remaining electrical memory effects are assumed to impose such a small amount of distortion that they may be ignored altogether.

Predistorter 58 includes a magnitude-extracting section 150 which extracts a magnitude parameter from communication signal 54, forming a magnitude signal 152. In the preferred embodiment, the magnitude parameter obtained in section 150 is the pure mathematical magnitude of the complex communication signal 54, but other embodiments may extract other magnitude parameters, such as magnitude squared or square-root of magnitude.

Magnitude signal 152 passes to a processing section 154 and to a processing section 156. Processing section 154 is configured to implement an inverse transform to the $F_{ML1}$ transform applied by memoryless component 146, i.e., $F_{ML1}^{-1}$. Processing section 154 generates a gain-correcting signal 158 that represents the inverse of the gain-modulating signal generated by memoryless component 146 of model 94. Thus, processing section 154 applies an inversing transform $F_{ML1}^{-1}$ that is responsive to gain droop for an average bias condition, average temperature, and an average of all memory effects.

Those skilled in the art will appreciate that precise mathematical averages or means are not explicitly required in identifying the average behavior for bias conditions, temperature deviations, and memory effects. Rather the average refers to, for each possible single value of communication signal 54, a single value that summarizes or represents the general significance of the set of all values that gain droop exhibits over a tracking period for that value of communication signal 54. And, the averages may be determined implicitly rather than explicitly.

The determination of inversing transform $F_{ML1}^{-1}$ is discussed in more detail below in connection with FIG. 8. In general, inversing transform $F_{ML1}^{-1}$ may be established using an LMS-based control loop that updates adaptable data entries in a look-up table (LUT). This LMS-based control loop is desirably configured to exhibit stable, low-noise, low jitter values for the LUT. The loop bandwidth may be greater or lower than the corresponding update loop bandwidth for linear predistorter 64 (FIG. 3), but is desirably much lower than the update loop bandwidth for AGC section 62 (FIG. 3). In other words, a slow loop bandwidth is desirably used, this slow loop bandwidth establishes the tracking period over which gain droop is evaluated, and by evaluating gain droop over this lengthy tracking period the above-discussed averages are implicitly established. Those skilled in the art will appreciate that a slow loop bandwidth does not imply a slow update rate for the LUT. Each table look-up operation may, and desirably is, accompanied by a table update operation, and table look-up operations occur at a sample rate of 4-16 times the signal bandwidth in order to generate a wide bandwidth predistortion signal.

Processing section 156 is configured to implement a transform corresponding to the $F_{ML2}$ transform applied by inductive memoryless component 148, i.e., $\cap F_{ML2}$. As discussed below, the $\cap F_{ML2}$ transform may correspond to the $F_{ML2}$ transform in more than one way. Processing section 156 generates a gain-correcting signal 160 that represents the gain-modulating signal generated by inductive memoryless component 148 of model 94. Thus, processing section 156 applies a transform $\cap F_{ML2}$ that is desirably substantially unresponsive to average bias conditions, but desirably responsive to the gain modulation exhibited by amplifier 70 as bias conditions deviate from the average bias conditions. As explained above, bias conditions deviate from the average bias conditions at least in part due to amplifier 70 applying nonlinear amplifier transform 98 to RF input signal 60', causing even-ordered harmonics which, along with the video impedance of network of components 138, are responsible for the video signal which defines the deviations.

Gain-correcting signals 158 and 160 are each configured to address different components of gain distortion in amplifier 70. And, gain-correcting signals 158 and 160 are contemporaneous with one another. In other words, signals 158 and 160 are respectively generated by processing sections 154 and 156 in parallel or at the same time, and each of signals 158 and 160 is desirably capable of exerting an influence on predistorted communication signal 60 during each sample of communication signal 54. Moreover, since gain-correcting signals 158 and 160 are directed to memoryless phenomena, processing sections 154 and 156 may be implemented and updated while consuming only a small amount of power when compared to predistortion signal generation techniques that address memory effects.

Gain-correcting signals 158 and 160 and communication signal 54 pass to a joining and gain adjusting section 162. In general, joining and gain adjusting section 162 joins gain-correcting signals 158 and 160 together into a combined gain-correcting signal 248 that substantially exhibits an inverse behavior with respect to signal magnitude to the behavior of the signal provided by addition element 149 in model 94 for amplifier 70. And, joining and gain adjusting section 162 applies gain to communications signal 54, including amplification and/or attenuation, in a manner defined by the combined gain-correcting signal. Joining and gain-adjusting section 162 is discussed in more detail below in connection with FIGS. 10-11.

In one embodiment, nonlinear predistorter 58 also includes an adaptive control section 164. Adaptive control section 164 receives magnitude signal 152, error signal 90, and delayed communication signal 92 as inputs. These input signals are used to generate adaptation signals 166 and 168 respectively provided to processing sections 154 and 156. Adaptation signals 166 and 168 train and maintain processing sections 154 and 156 to define the $F_{ML1}^{-1}$ and $\cap F_{ML2}$ transforms they apply to a magnitude parameter of communication signal 54. Portions of adaptive control section 164 are discussed below in connection with FIGS. 8-9.

Figure 8:
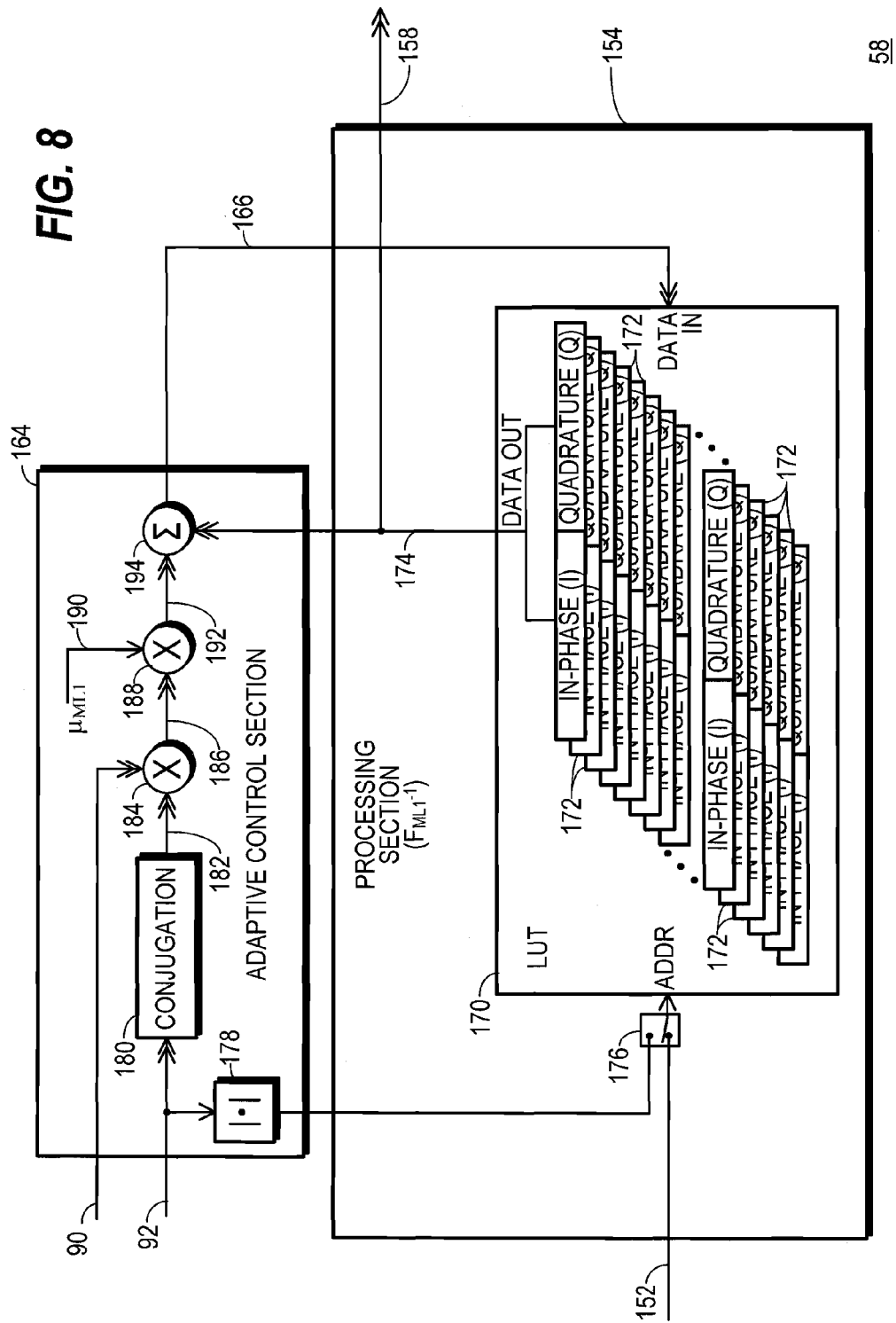
FIG. 8 shows a block diagram of an average-droop processing section and a portion of an adaptive control section of the nonlinear predistorter depicted in FIG. 4.

FIG. 8 shows a block diagram of processing section 154 and a portion of adaptive control section 164 from the memoryless nonlinear predistorter 58 depicted in FIG. 4. In FIG. 8, the complex nature of the communication signals processed in nonlinear predistorter 58 is specifically denoted with a double-arrowhead notation.

Processing section 154 desirably implements a form of gain-based predistortion that uses an adaptable look-up table (LUT) 170. Desirably, LUT 170 is organized to include a multiplicity of adaptable data entries 172, with different adaptable data entries 172 corresponding to different magnitude values that may be presented to the address input of LUT 170. Each data entry is desirably configured as a complex value having in-phase and quadrature components. During each look-up operation, the addressed adaptable data entry 172 is provided at a data output of LUT 170 and referred to herein as an outgoing data entry 174.

A mode switch 176 signifies that processing section 154 may operate in two different modes. Those skilled in the art will appreciate that no actual switch is required but that switch 176 is depicted to indicate two different operations that take place with respect to LUT 170. For example, if LUT 170 is implemented using a dual-port memory device then both operations may take place simultaneously from the perspective of circuits outside of LUT 170. One mode is a normal look-up mode, during which processing section 154 applies its $F_{ML1}^{-1}$ transform to magnitude signal 152 in order to generate gain-correcting signal 158. The other mode is an adaptation mode, during which processing 154 updates or adapts one of its data entries. During the normal look-up mode of operation LUT 170 is addressed by magnitude signal 152. For each sample, the magnitude value is translated into a complex gain value by LUT 170, and the outgoing data entry 174 that defines the complex gain value forms a sample of gain-correcting signal 158. Although not shown, a section may be included at the output of processing section 154 to force gain-correcting signal 158 to generate a stream of a constant, normalized value, such as [0,0] or [0,1], when processing section 156 is being adapted to reduce cross-coupling between processing sections 154 and 156.

During the adaptation mode, adaptable data entries 172 for LUT 170 are calculated by adaptive control section 164, which implements a control loop that processes amplified RF signal 76 as expressed in error signal 90. In one embodiment (not shown), adaptive control section 164 implements a conventional least-means-squared (LMS) algorithm. In this embodiment, adaptive control section 164 performs conversions between Cartesian and polar coordinate systems in making its calculations. Alternatively, adaptive control section 164 may implement a conventional LMS algorithm using the secant method, which requires the performance of division operations.

FIG. 8 depicts a preferred embodiment in which adaptive control section 164 implements a modified LMS algorithm. In the modified LMS algorithm of the FIG. 8 embodiment, a conventional LMS algorithm has been modified in a way that avoids the use of conversions between Cartesian and polar coordinate systems and also avoids division operations.

Referring to FIG. 8, from the perspective of adaptation (i.e., an update operation, or write cycle for LUT 170), a communication signal is applied to control section 164 at a magnitude-extracting section 178. Desirably, magnitude-extracting section 178 performs the same function as is performed by magnitude-extracting section 150. For the adaptation operation, this communication signal is a delayed version of communication signal 54, such as delayed communication signal 92. As discussed above, distortion extends over a bandwidth that exceeds the bandwidth of communication signal 54, so the sampling rate of communication signal 92 is correspondingly increased to accommodate the increased bandwidth. In an alternate embodiment, magnitude-extracting section 178 may be omitted, and the output of magnitude-extracting section 150, appropriately delayed, used in lieu of section 178. The magnitude signal output from section 178 addresses LUT 170 through mode switch 176. It is simply a delayed version of magnitude signal 152.

Communication signal 92 is also provided to a conjugation section 180. Conjugation section 180 implements a conjugation operation, which in the Cartesian coordinate system can be performed by negating the imaginary component of each complex sample. Conjugation section 180 provides a conjugated communication signal 182 that is responsive to communication signal 92. Conjugated communication signal 182 drives a first input of a multiplier 184.

Error signal 90 (also shown in FIGS. 3-4) drives a second input of multiplier 184. Although not shown, additional delay may be inserted upstream of multiplier 184 as necessary so that corresponding increased-rate samples from conjugated communication signal 182 and error signal 90 are aligned in time at multiplier 184.

As shown in FIG. 3 and discussed above, error signal 90 is responsive to amplified RF signal 76 through feedback signal 78. In particular, error signal 90 is responsive to a difference between delayed communication signal 92 and amplified RF signal 76, as expressed through feedback signal 78. This generally represents the portion of amplified RF signal 76 (FIG. 3) that differs from its ideal configuration. Error signal 90 allows the control loop to converge where LUT 170 accurately implements approximately the inverse of the $F_{ML1}$ transform applied by gain-droop memoryless component 146. Multiplier 184 correlates conjugated communication signal 182 with error signal 90 to produce a raw correlation signal 186. Multiplier 184 desirably performs its complex multiplication operation using the Cartesian coordinate system.

Raw correlation signal 186 is received at a two-quadrant complex multiplier 188 along with a scaling, step size, or loop-control constant 190, which is labeled using the variable "$\mu_{ML1}$" in FIG. 8. An output from multiplier 188 generates a scaled correlation signal 192. In the preferred embodiment, multiplier 188 is implemented using the Cartesian coordinate system.

Scaling constant 190 determines how much influence each sample from raw correlation signal 186 will exert on an updated adaptable data entry 172 for LUT 170. Greater influence is associated with faster but less stable convergence for LUT 170, more noise represented in adaptable data entries 172 of LUT 170, and a faster loop bandwidth for the control loop that updates adaptable data entries 172. Scaling constant 190 is desirably chosen to implement a relatively narrow loop bandwidth. This loop bandwidth establishes the tracking period over which gain-droop memoryless component 146 of amplifier model 94 (FIG. 4) is measured. Thus, this tracking period discussed above in connection with memoryless component 146 is relatively slow so that influences of memoryless component 148 and memory components 102 (FIG. 4) occur on a faster time scale and so that the updating of adaptable data entries 172 remains substantially unresponsive to these other nonlinearity influences and substantially avoids tracking memory effects.

However, scaling constant 190 need not be completely time invariant. For example, a faster loop bandwidth may be initially chosen to quickly populate LUT 170 with adaptable data entries 172, then the loop bandwidth may be slowed. And, scaling constant 190 may be set to zero for extended periods when desirable to prevent adaptable data entries 172 from changing. For example, scaling constant 190 may be set to zero while transmitter 50 is not actively transmitting, and scaling constant 190 may be set to zero while other control loops within transmitter 50 are converging.

Scaled correlation signal 192 drives a positive input of a combiner 194. A negative input of combiner 194 receives outgoing data entries 174 from LUT 170. For each sample of scaled correlation signal 192, the outgoing data entry 174 provided to combiner 194 from LUT 170 corresponds to the sample of communication signal 92 to which the scaled correlation signal 192 sample also corresponds. A magnitude parameter for that sample from communication signal 92 serves as an address to LUT 170 to cause LUT 170 to produce the corresponding data entry 174.

Desirably, combiner 194 performs a Cartesian coordinate system addition operation. An output of combiner 194 couples to a data input port of LUT 170 and provides incoming data entries through adaptation signal 166 for storage in LUT 170. Each incoming data entry is stored at the same memory address from which the corresponding outgoing data entry 174 was previously stored. The incoming data entry carried by adaptation signal 166 is expressed in the Cartesian coordinate system.

Accordingly, adaptive control section 164 applies an adaptation update equation to error signal 90, delayed communication signal 92, and outgoing adaptable data entries 172 addressed by a delayed magnitude signal provided in a data stream having an increased sample rate. When the control loop converges, processing section 154 implements transform $F_{ML1}^{-1}$, which approximates the inverse of the $F_{ML1}$ transform applied by memoryless component 146 of model 94.

Figure 9:
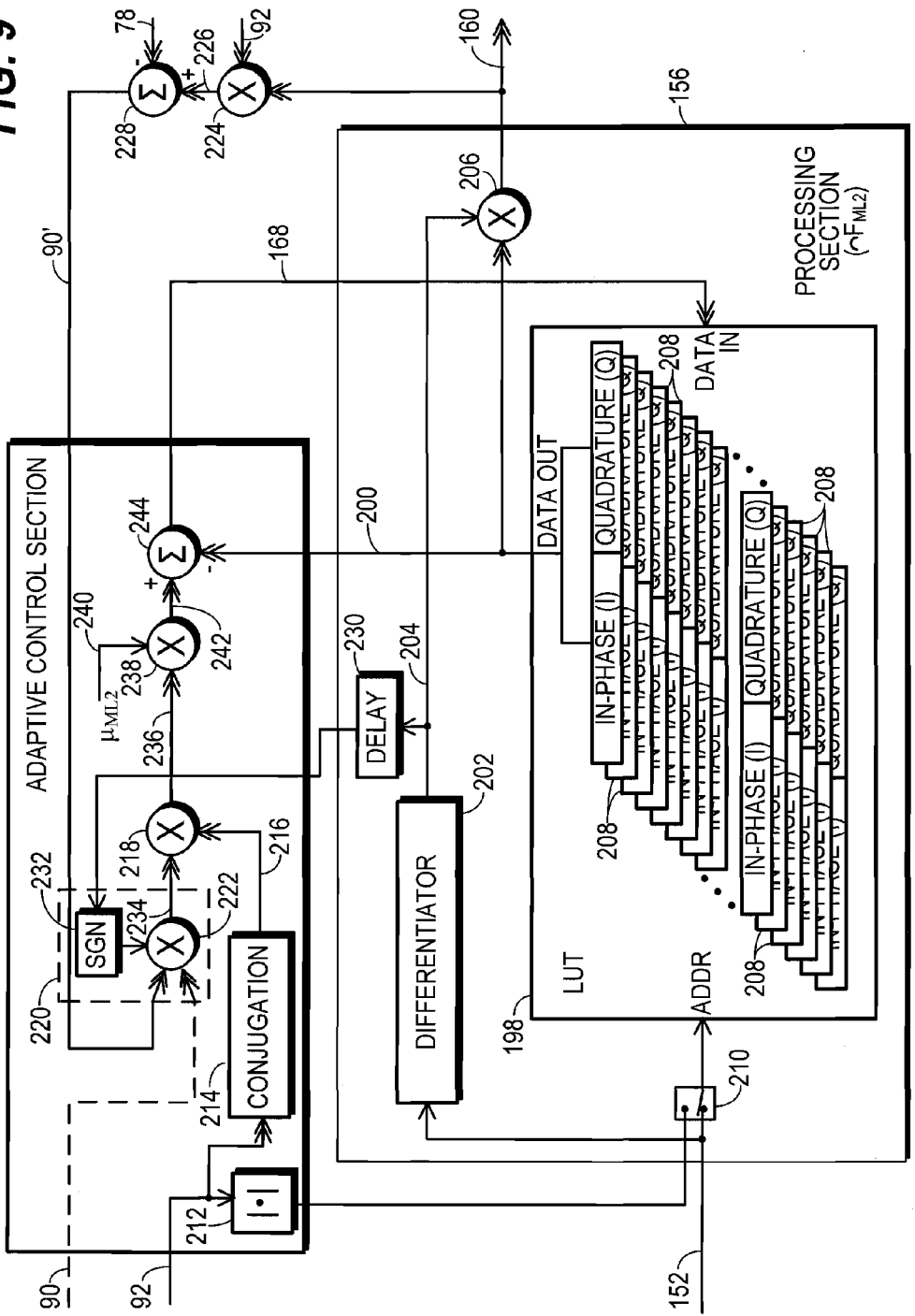
FIG. 9 shows a block diagram of a video processing section and a portion of an adaptive control section of the nonlinear predistorter depicted in FIG. 4.

FIG. 9 shows a block diagram of processing section 156 and a portion of adaptive control section 164 from the memoryless nonlinear predistorter 58 depicted in FIG. 4. In FIG. 9, the complex nature of the communication signals processed in nonlinear predistorter 58 is specifically denoted with the double-arrowhead notation.

Like processing section 154 discussed above, processing section 156 desirably implements a form of gain-based predistortion that uses an adaptable look-up table (LUT), labeled LUT 198. But the transform being implemented by processing 154 was dictated by memoryless gain-droop of HPA 114. While the relationship is nonlinear, gain-droop is fairly well characterized considering signal magnitude alone, and without considering other circuit components. Unlike processing section 154, processing section 156 applies a transform $\frown F_{ML2}$ dictated by network of components 138 (FIG. 5) as well as HPA 114. And, while memory component 148 transform $F_{ML2}$ is a function of signal magnitude, it is a more complex function.

The above-discussed video signal that is responsible for video memoryless component 148 is generated by even harmonics of the input signal. Accordingly, the video current signal generated by these even harmonics at the drain of HPA 114 may be modeled as an instantaneous nonlinear current generator that implements some unspecified nonlinear polynomial function of the magnitude signal, and more specifically a collection of powers of the magnitude signal. This represents a first nonlinear function to be attributed to HPA 114. It is largely accounted for by gain droop, without considering envelope-induced bias modulation.

The video signal then acts upon the video impedance (FIG. 6) of network of components 138. As discussed above, this video impedance resembles a high pass filter that functions as a differentiator because it's corner frequency is above video bandwidth 140 (FIG. 6). Those skilled in the art will appreciate that a differentiator is a circuit whose output is proportional to the derivative of its input with respect to time. The video current signal may be modeled as acting upon a differentiator to produce a video voltage signal. And, when the voltage video signal is viewed as causing deviations from the average bias conditions, HPA 114 imparts a second HPA nonlinearity which defines a voltage-to-gain conversion resulting from these bias condition deviations, as depicted in FIG. 7.

LUT 198 is a polynomial generator that produces a polynomial signal 200 which corresponds to the above-discussed nonlinear current generator and voltage-to-gain conversion. A differentiator 202 has an input driven by magnitude signal 152 provided in a data stream having an increased sample rate. Differentiator 202 models the application of the video current signal upon the video impedance of network of components 138 in a generic fashion. Differentiator 202 is desirably configured to provide a reasonably accurate derivative over half of video bandwidth 140. Differentiator 202 may be implemented using a FIR, IIR, or other architecture in a manner understood to those of skill in the art. An output of differentiator 202 provides a derivative signal 204 which drives a first input of a multiplier 206. Polynomial signal 200 drives a second input of multiplier 206. An output of multiplier 206 provides gain-correcting signal 160. Together, the polynomial generator of LUT 198 and differentiator 202 provide transform $\frown F_{ML2}$ when LUT 198 has been adapted to a point of convergence.

Desirably, LUT 198 is organized to include a multiplicity of adaptable data entries 208, with different adaptable data entries 208 corresponding to different magnitude values that may be presented to the address input of LUT 198 at the increased sample rate. Each adaptable data entry 208 is desirably configured as a complex value having in-phase and quadrature components. During each look-up operation, the addressed adaptable data entry 208 is provided at a data output of LUT 198 and referred to herein as a sample of polynomial signal 200.

A mode switch 210 signifies that processing section 156 may operate in two different modes. Those skilled in the art will appreciate that no actual switch is required but that switch 210 is depicted to indicate two different operations that take place with respect to LUT 198. LUT 198 may be implemented using a dual-port memory device so that both operations may take place simultaneously from the perspective of circuits outside of LUT 198. One mode is the normal look-up mode, during which processing section 156 applies its $\frown F_{ML2}$ transform to magnitude signal 152 in order to generate gain-correcting signal 160. The other mode is the adaptation mode, during which processing section 156 updates one of its adaptable data entries 208. Desirably, processing sections 154 and 156 operate in their normal look-up modes contemporaneously, but sections 154 and 156 need not, and preferably do not, operate in their adaptation modes contemporaneously. During the normal look-up mode of operation, LUT 198 is addressed by magnitude signal 152. For each sample, the magnitude value is translated into a complex gain value by LUT 198 which serves as a sample of polynomial signal 200. The product of a sample from derivative signal 204 and the sample of polynomial signal 200 forms a sample of gain-correcting signal 160. Although not shown, a section may also be included at the output of processing section 156 to force gain-correcting signal 160 to generate a stream of a constant, normalized value, such as [0,0], when one or both of processing sections 154 and 156 are being adapted to reduce cross-coupling between processing sections 154 and 156 or to prevent gain-correcting signal 160 from influencing amplified RF signal 76 (FIGS. 3-4) as it is being updated.

During the adaptation mode, adaptable data entries 208 for LUT 198 are calculated by adaptive control section 164, which implements a control loop that processes amplified RF signal 76. For LUT 198 control section 164 applies a different update equation than is used to update LUT 170 (FIG. 8). FIG. 9 depicts a preferred embodiment in which adaptive control section 164 implements a modified LMS algorithm. In the modified LMS algorithm of the FIG. 9 embodiment, a conventional LMS algorithm has been modified to neutralize a zero expectation effect of derivative signal 204 (derivative signal 204 exhibits an average value of zero) that would otherwise prevent a DC gradient from forming to drive the LMS algorithm.

Referring to FIG. 9, from the perspective of an adaptation operation, or write cycle for LUT 198, a communication signal is applied to a magnitude-extracting section 212 of control section 164 at the increased sample rate. Desirably, magnitude-extracting section 178 performs the same function as is performed by magnitude-extracting section 150. For the update operation, this communication signal is a delayed version of communication signal 54, such as delayed communication signal 92. The magnitude signal output from section 212 addresses LUT 198 through mode switch 210. It is simply a delayed version of magnitude signal 152.

Communication signal 92 is also provided to a conjugation section 214. Conjugation section 214 implements a conjugation operation. Conjugation section 214 provides a conjugated communication signal 216 responsive to communication signal 92. Conjugated communication signal 216 drives a first input of a multiplier 218.

FIG. 9 depicts two different embodiments for two different update equations that may be implemented by adaptive control section 164 in updating LUT 198. In one embodiment, in which the parallel combination of processing sections 154 and 156 directly provide a transform which approximates the inverse of the parallel combination of memoryless components 146 and 148, error signal 90 (also shown in FIGS. 3-4 and 8) drives a first input of a derivative neutralizer 220, and more particularly a first input of a multiplier 222 within derivative neutralizer 220. FIG. 9 depicts this embodiment by the use of a dotted line to symbolize the application of error signal 90 to derivative neutralizer 220.

In an alternate embodiment, processing section 156 is updated so that transform $\cap F_{ML2}$ corresponds to transform $F_{ML2}$ of inductive memoryless component 148 by closely approximating transform $F_{ML2}$. In this embodiment, gain-correcting signal 160 and an appropriately delayed version of the communication signal, such as communication signal 92, drive respective multiplicand inputs of a multiplier 224 to generate a communication signal 226 whose gain has been altered to reflect only the estimated component of total gain modulation due to the video signal influence on bias conditions. Communication signal 226 drives a positive input of a combiner 228, and a form of feedback signal 78 (FIG. 3) output from feedback path processing section 84 (FIG. 3) couples to a negative input of combiner 228. Combiner 228 provides an error signal 90' that drives the first input of derivative neutralizer 220 in this alternate embodiment in lieu of error signal 90 used in the first embodiment.

Each of error signals 90 and 90' are responsive to amplified RF signal 76 through feedback signal 78. In particular, error signal 90 is responsive to a difference between delayed communication signal 92 and amplified RF signal 76. Alternate error signal 90' is responsive to a communication signal whose gain has been altered by the current estimate of $F_{ML2}$ and amplified RF signal 76. Error signal 90 generally represents the portion of amplified RF signal 76 (FIG. 3) that differs from its ideal configuration, and alternate error signal 90' generally represents the portion of amplified RF signal 76 that differs from the ideal configuration modified only by the current estimate of $F_{ML2}$. Error signals 90 and 90' allow the control loop to converge where LUT 198 accurately implements a transform that corresponds to the $F_{ML2}$ transform applied by memoryless component 148 (FIG. 4).

Derivative signal 204 is delayed in a delay element 230 and then applied to a second input of derivative neutralizer 220 at a sign section 232. Within derivative neutralizer 220, an output of sign section 232 couples to a second input of multiplier 222. An output of multiplier 222 serves as the output for derivative neutralizer 220 and provides a DC-offset enhanced error signal 234.

Derivative signal 204 has no DC component. It exhibits a relatively short-term average value of zero. It roughly describes the slope of magnitude signal 152, which must be positive as much as it is negative since magnitude signal 152 is permanently confined within a fixed magnitude range. The same derivative effect may be attributed to the video voltage signal which is responsible for bias condition deviations experienced by HPA 114 (FIG. 5) because it is formed from a video current signal acting upon a high pass filter functioning as a differentiator, as discussed above. Since derivative signal 204 is proportional to gain-correcting signal 160 and since the derivative-generated video voltage signal modulates gain in HPA 114, no long-term DC components can be present in either of error signals 90 or 90'. In order to compensate for this derivative effect, derivative neutralizer 220 multiplies the error signal 90 or 90' by a function that is negative when derivative signal 204 is negative. The inverse of the derivative signal 204 would be ideal for use as this function, but taking inverses is computationally complex and consumes a considerable amount of power. The sign function of section 232 is nevertheless preferred because it is far simpler and consumes very little power while imposing very little cost in convergence. DC-offset enhanced error signal 234 drives a second input of multiplier 218.

Multiplier 218 correlates conjugated communication signal 216 with DC-offset enhanced error signal 234 to produce a raw correlation signal 236. Raw correlation signal 236 is received at a two-quadrant complex multiplier 238 along with a scaling, step size, or loop-control constant 240, which is labeled using the variable "$\mu_{ML2}$" in FIG. 9. An output from multiplier 238 generates a scaled correlation signal 242. Scaling constant 240 operates in a manner similar to scaling constant 190 (FIG. 8) discussed above to determine how much influence each sample of raw correlation signal 236 will exert on an updated adaptable data entry 208 for LUT 198. Scaling constant 240 is desirably chosen to implement a relatively narrow loop bandwidth.

Scaled correlation signal 242 drives a positive input of a combiner 244. A negative input of combiner 244 receives polynomial signal 200 from LUT 198. For each sample of scaled correlation signal 242 and each corresponding sample from polynomial signal 200 provided to combiner 244 from LUT 198 corresponds to the sample of communication signal 92 to which the scaled correlation signal 242 sample also corresponds. A magnitude parameter for that sample from communication signal 92 serves as an address to LUT 198 to cause LUT 198 to produce the corresponding adaptable data entry 208.

An output of combiner 244 couples to a data input port of LUT 198 and provides incoming data entries through update signal 168 for storage in LUT 198. Each incoming data entry is stored at the same memory address from which the corresponding sample of polynomial signal 200 was previously stored.

Accordingly, adaptive control section 164 applies an adaptation update equation to error signal 90 or alternative error signal 90', to delayed communication signal 92, and to adaptable data entries 208 stored in LUT 198 at addresses accessed by a delayed magnitude signal which is applied at the increased sample rate. When the control loop converges, processing section 164 implements transform $\cap F_{ML2}$, which corresponds to the $F_{ML2}$ transform applied by memoryless component 148 of model 94. In one embodiment $\cap F_{ML2}$ is configured with $F_{ML1}^{-1}$ to provide a better estimate of the combined inverse of $F_{ML1}$ in parallel with $F_{ML2}$ than is provided by $F_{ML1}^{-1}$ alone. In another embodiment, $\cap F_{ML2}$ is configured to approximate $F_{ML2}$.

Figure 10:
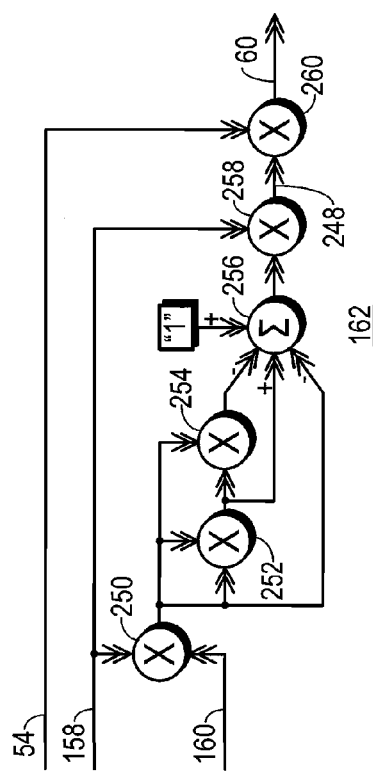
FIG. 10 shows a first embodiment of a joining and gain-adjusting section of the nonlinear predistorter depicted in FIG. 4.

FIG. 10 shows a first embodiment of joining and gain-adjusting section 162 (FIG. 4) of nonlinear predistorter 58 (FIG. 4). In particular, the FIG. 10 embodiment is suitable for use when processing section 156 (FIGS. 4 and 9) configures transform $\cap F_{ML2}$ to approximate $F_{ML2}$ from video memoryless component 148 (FIG. 4). In this embodiment, error signal 90 is supplied to derivative neutralizer 220 (FIG. 9).

Desirably, the parallel transforms of processing sections 154 and 156 (FIG. 4) collectively implement an estimate of the inverse of the parallel combination of $F_{ML1}$ and $F_{ML2}$ for memoryless components 146 and 148. That way the combined gain distortion applied by $F_{ML1}$ and $F_{ML2}$, when applied to a communication signal 60 whose gain has been predistorted by this inverse transform in joining and gain-adjusting section 162 is counteracted. Mathematically, $$(F_{ML1}+F_{ML2})^{-1}=F_{ML1}^{-1}(1+F_{ML2}F_{ML1}^{-1}) \quad \text{EQ. 1}$$

$$=F_{ML1}^{-1}\{1-F_{ML2}F_{ML1}^{-1}+(F_{ML2}F_{ML1}^{-1})^2-(F_{ML2}F_{ML1}^{-1})^3+\ldots\} \quad \text{EQ. 2}$$

Transform $F_{ML1}^{-1}$ may be established as discussed above in connection with FIG. 8. Transform $\cap F_{ML2}$ configured as an approximation of $F_{ML2}$ may be established as discussed above in connection with FIG. 9. Accordingly, the FIG. 10 embodiment of joining and gain-adjusting section 162 joins gain-correcting signals 158 and 160 as suggested by EQ. 2 to produce combined gain-correcting signal 248, and then uses combined gain-correcting signal 248 to define how to modulate the gain of communication signal 54 to generate predistorted communication signal 60.

Within joining and gain-adjusting section 162, a multiplier 250 receives gain-correcting signals 158 and 160 and produces the term $F_{ML2}F_{ML1}^{-1}$. An output of multiplier 250 couples to first and second inputs of a multiplier 252, a first input of a multiplier 254, and a negative input of a combiner 256. An output of multiplier 252 couples to a second input of multiplier 254 and to a positive input of combiner 256, and an output of multiplier 254 couples to a negative input of combiner 256. Multiplier 252 is responsible for the term: $(F_{ML2}F_{ML1}^{-1})^2$ from EQ. 2. Multiplier 254 is responsible for the term: $(F_{ML2}F_{ML1}^{-1})^3$ from EQ. 2. A constant value of [1,1] is applied to a positive input of combiner 256. An output from combiner 256 couples to a first input of a multiplier 258, and gain-correcting signal 158 drives a second input of multiplier 258. The output of multiplier 258 generates combined gain-correcting signal 248.

Communication signal 54 drives a first input of a multiplier 260, and gain-correcting signal 248 drives a second input of multiplier 260. An output of multiplier 260 generates predistorted communication signal 60. At multiplier 260, communication signal 54 is predistorted by adjusting the gain of communication signal 54 in accordance with the dictates of combined gain-correcting signal 248.

In particular, a specific amount of gain, that may differ for each magnitude value that communication signal 54 exhibits within the range of magnitude values exhibited by communication signal 54, has been applied to each sample of communication signal 54. The amount of gain applied is responsive to the derivative of the magnitude of communication signal 54 as well as to the magnitude of communication signal 54. For the stream of samples in communication signal 54, the amount of gain applied at multiplier 260 approximates the inverse of the collective gain associated with memoryless components 146 and 148 of nonlinear amplifier transform 98 (FIG. 4) from model 94 (FIG. 4).

While the FIG. 10 embodiment of joining and gain-adjusting section 162 provides effective results, it requires the use of a number of complex multiplies to implement an estimate of a mathematical inverse. The use of this number of complex multiplies and the power they consume for each sample of communication signal 54 is somewhat undesirable.

Figure 11:
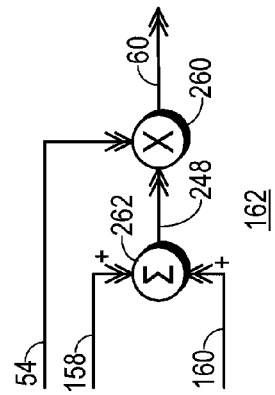
FIG. 11 shows a second embodiment of the joining and gain-adjusting section of the nonlinear predistorter depicted in FIG. 4.

FIG. 11 shows a second embodiment of joining and gain-adjusting section 162 of the nonlinear predistorter 58. The FIG. 11 embodiment represents a simplification over the FIG. 10 embodiment, and it requires fewer complex multiply operations and consumes correspondingly less power. The FIG. 11 embodiment is suitable for use when processing section 156 (FIGS. 4 and 9) configures transform $\cap F_{ML2}$ with $F_{ML1}^{-1}$ to provide a better estimate of the combined inverse of $F_{ML1}$ in parallel with $F_{ML2}$ than is provided by $F_{ML1}^{-1}$ alone. In this embodiment, alternate error signal 90' is supplied to derivative neutralizer 220 (FIG. 9).

In this FIG. 11 embodiment, gain-correcting signal 160 generated through the application of transform $\cap F_{ML2}$ is viewed as an offset to gain-correcting signal 158, which is generated through the application of transform $F_{ML1}^{-1}$. But nothing requires $F_{ML1}^{-1}$ for this embodiment to precisely equal $F_{ML1}^{-1}$ for the other embodiment or to precisely equal the inverse of gain-droop component 146 considered by itself. Accordingly, gain-correcting signal 158 and gain-correcting signal 160 are applied to positive inputs of a combiner 262. An output of combiner 262 provides combined gain-correcting signal 248. As in the FIG. 10 embodiment, communication signal 54 drives a first input of multiplier 260, and combined gain-correcting signal 248 drives a second input of multiplier 260. An output of multiplier 260 generates predistorted communication signal 60. At multiplier 260, communication signal 54 is predistorted by adjusting the gain of communication signal 54 in accordance with the dictates of combined gain-correcting signal 248.

Figure 12:
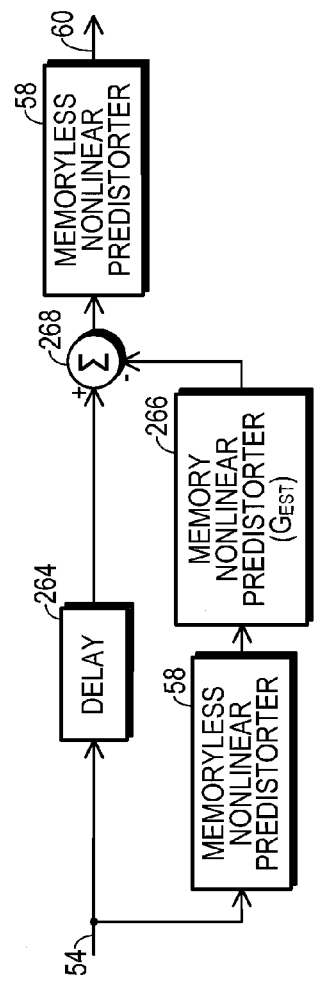
FIG. 12 shows a block diagram of a second embodiment of the nonlinear predistorter portion of the transmitter.

FIG. 12 shows a block diagram of a second embodiment of nonlinear predistorter 58, referred to as nonlinear predistorter 58'. Nonlinear predistorter 58' is not limited to addressing memoryless components 100 of nonlinear amplifier transform 98 (FIG. 4). Thus, nonlinear predistorter 58' may be suitable where thermal memory effects are significant or where electrical memory effects are significant. Electrical memory effects may be significant, for example, where envelope trapping capacitance is used in network of components 138 (FIG. 5). Nonlinear predistorter 58' consumes more power than nonlinear predistorter 58, but is better able to extend predistortion to cover significant memory effects.

In predistorter 58', communication signal 54 drives a delay element 264 and a memoryless nonlinear predistorter 58 at the increased sample rate. Memoryless nonlinear predistorter 58 may be configured as discussed above in connection with FIGS. 4-11. The output from memoryless nonlinear predistorter 58 drives a memory effects nonlinear predistorter 266. Memory effects nonlinear predistorter 266 desirably applies a transform $G_{EST}$, which represents an estimate of transform G applied by memory components 102 from model 94 (FIG. 4). An output of memory effects nonlinear predistorter 266 drives a negative input of a combiner 268 while a delayed version of communication signal 54 from delay element 264 drives a positive input of combiner 268. An output of combiner 268 drives an input of another memoryless nonlinear predistorter 58, which is desirably configured identically to the other memoryless nonlinear predistorter 58 depicted in FIG. 12. An output of this memoryless nonlinear predistorter 58 provides predistorted communication signal 60.

Figure 13:
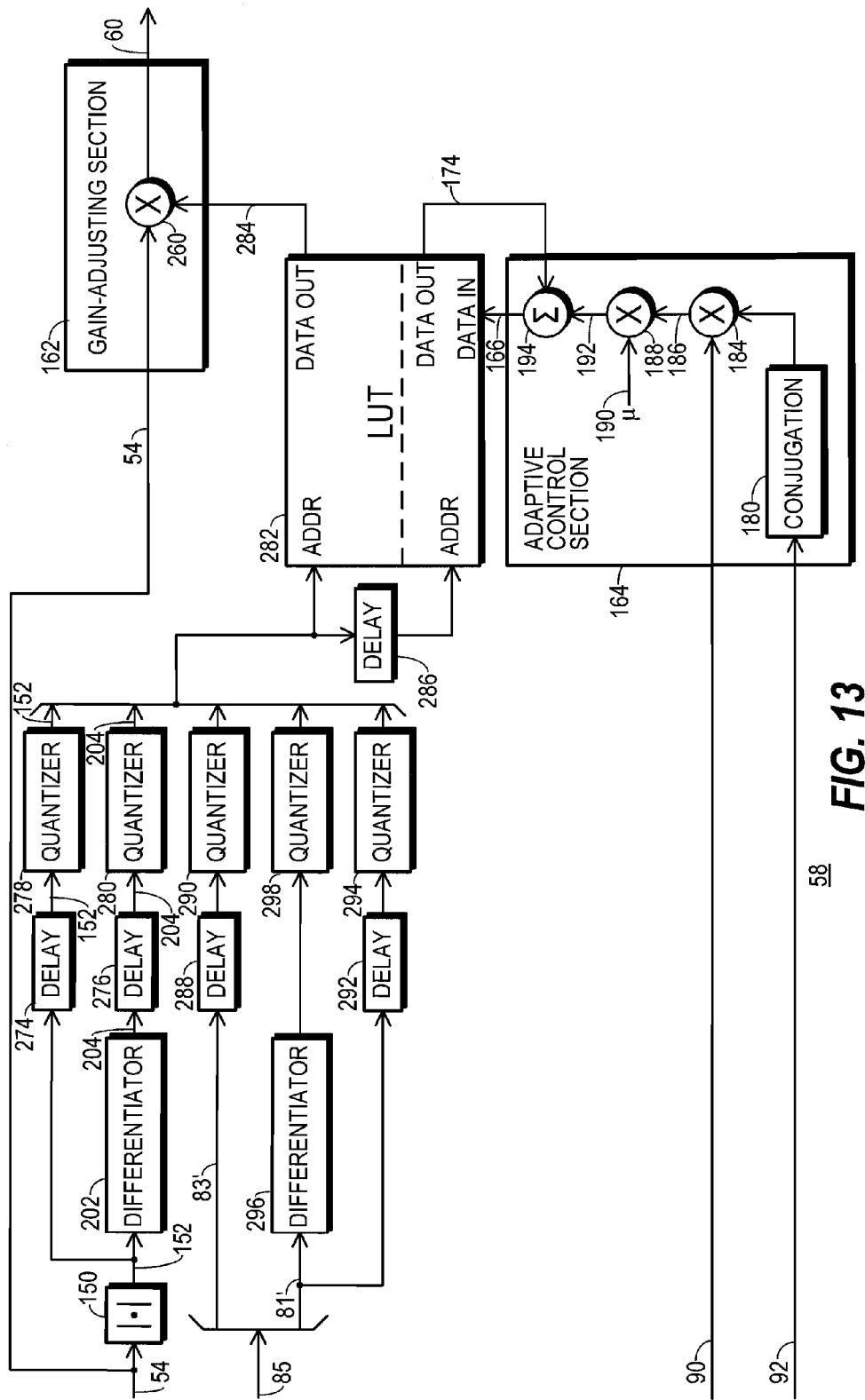
FIG. 13 shows a block diagram of a third embodiment of the nonlinear predistorter portion of the transmitter.

FIG. 13 shows a block diagram of a third embodiment of predistorter 58. In some applications, memoryless nonlinearities 146 and 148 (FIG. 4) may be sufficiently cross correlated and the gain of amplifier 70 (FIGS. 3-4) a sufficiently strong nonlinear function of signal magnitude and amplifier bias that difficulty is encountered in operating separate control loops for the different types of memoryless nonlinearities 146 and 148. This third embodiment of predistorter 58 combines the adaptation control loops.

Figure 14:
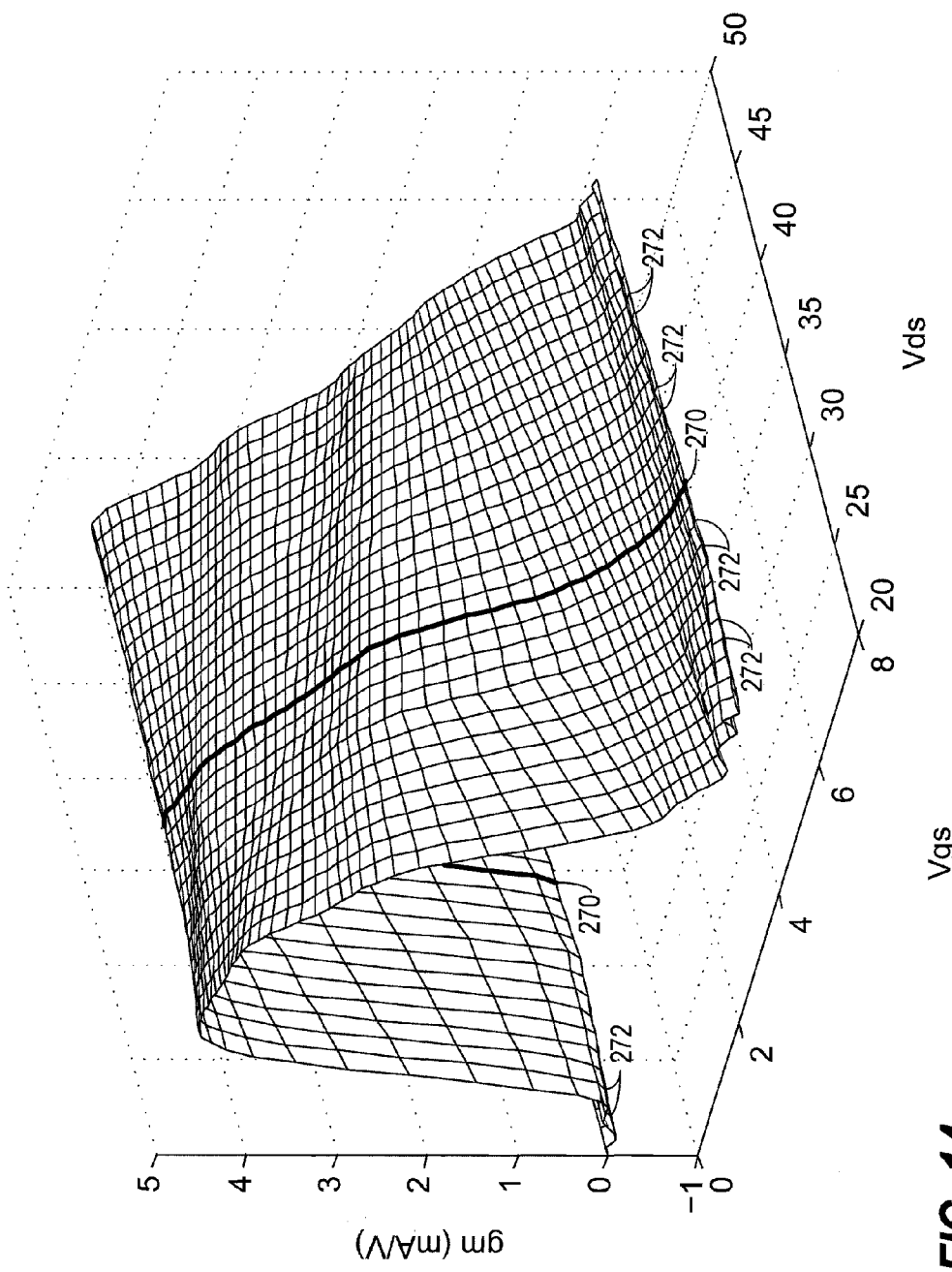
FIG. 14 shows a representative three-dimensional curve showing the gain curves of FIG. 7 in a format which emphasizes how transconductance gain for the active amplifier device varies as a function of gate and drain bias conditions.

FIG. 14 shows a representative three-dimensional curve showing the gain curves of FIG. 7 in a format which emphasizes how transconductance gain for the active amplifier device varies as a function of gate and drain bias conditions and signal magnitude. In particular, the vertical axis of FIG. 14 shows the derivative of output current ($I_{ds}$) with respect to input voltage ($V_{gs}$) of the voltage-current transfer characteristics depicted in FIG. 7, or the transconductance gain of a representative HPA 114 (FIG. 5).

FIG. 14 shows how strongly nonlinear the function that defines transconductance gain for HPA 114 may be over a wide range of input signal and bias conditions. For example, lower $V_{ds}$ bias conditions yield higher gain values and wider ranges of high gain. Gain changes more rapidly with respect to $V_{gs}$ on the increasing slope than on the decreasing slope. And, the value of $V_{gs}$ for which maximum gain occurs decreases as $V_{ds}$ increases. FIG. 14 depicts an average bias condition 270 as a substantially darker contour line for a constant/average $V_{ds}$ within the surface shown in FIG. 14. All other $V_{ds}$ contours 272 within the surface represent deviations from the average bias condition. From average bias condition 270, at some levels of $V_{gs}$ gain decreases with decreasing $V_{ds}$ and at other levels of $V_{gs}$, gain increases with decreasing $V_{ds}$. Thus, independently and accurately identifying the gain curve for average contour 270 apart from deviation contours 272 and/or the gain surface for deviation contours 272 apart from average contour 270 may be difficult in some applications.

The embodiment of predistorter 58 depicted in FIG. 13 treats the entire surface represented in FIG. 14 as a single more complex polynomial function of both magnitude and magnitude derivative so that both the average bias conditions and deviations from average bias conditions may be determined together using a single control loop without separating one from another.

Referring to FIG. 13, the complex signal notation used above in FIGS. 8-11 is dropped for convenience. But those skilled in the art will appreciate that the FIG. 13 embodiment of predistorter 58 may operate on complex signals as shown above in FIGS. 8-11. Communication signal 54 feeds magnitude extraction section 150 at the increased sample rate, as discussed above in connection with FIG. 4. A magnitude parameter or signal 152 of communication signal 54 is generated by section 150 and provided as an input to a delay element 274 and to differentiator 202. Differentiator 202 performs the same derivative-with-respect-to-time function for substantially the same reason as discussed above in connection with FIG. 9 and provides magnitude derivative parameter or signal 204 of communication signal 54 at its output. While differentiator 202 is shown as operating on the very same magnitude parameter 152 that is output from magnitude-extracting section 150, this configuration is not a requirement. In another embodiment, differentiator 202 may differentiate a magnitude-squared or other magnitude parameter signal. Magnitude derivative parameter 204 feeds a delay element 276. Delay elements 274 and 276 are desirably configured so that the versions of magnitude parameter 152 and magnitude derivative parameter 204 appearing at the outputs of delay elements 274 and 276 are aligned in time. These time-aligned versions of magnitude parameter 152 and magnitude derivative parameter 204 are respectively provided to quantizers 278 and 280. Quantizers 278 and 280 are desirably configured to restrict the parameters they quantize to a smaller discrete number of values. Quantized versions of magnitude parameter 152 and magnitude derivative parameter 204 then drive different address inputs of an adaptable look-up table (LUT) 282. Quantizers 278 and 280 are configured to scale and truncate magnitude parameter 152 and magnitude derivative parameter 204 so that no more address bits in LUT 282 are used than are necessary to achieve a desired level of performance.

FIG. 13 depicts one or more variable bias parameters 85 as being input to predistorter 58 to drive a variety of boxes and then provide additional address inputs to LUT 282. Variable bias parameters 85 and these boxes are discussed below. But variable bias parameters 85 and such boxes may be omitted when, for example, fixed bias signals are provided to bias circuits 110 and 112 (FIG. 5). In this situation, LUT 282 may perform its table look-up operations in response to only magnitude parameter 152 and magnitude derivative parameter 204.

Look-up table 282 forms a polynomial generator which applies a polynomial function to parameters presented at its address inputs. In this situation, the polynomial generator of LUT 282 applies a polynomial function to magnitude parameter 152 and magnitude derivative parameter 204. The polynomial generator output from LUT 282 provides a gain-correcting signal 284 to a first input of multiplier 260 in gain-adjusting section 162. Communication signal 54 drives a second input of multiplier 260 in gain-adjusting section 162. Gain-adjusting section 162 and multiplier 260 operate as discussed above in connection with FIG. 4 and FIGS. 10-11. But unlike the embodiments discussed above, in this embodiment no joining function is needed because only a single gain-correcting signal 284 is produced from a single polynomial generator.

The polynomial function applied by LUT 282 is determined in response to an LMS adaptation control loop, in a manner similar to that described above in connection with FIG. 8. FIG. 13 depicts LUT 282 as a two-port memory, with first and second address input ports and first and second data output ports for accessing a common set of adaptable data entries in LUT 282. The first ports are used as discussed above for applying a polynomial function to magnitude parameters 152 and 204 and for generating gain-correcting signal 284. The second ports are used for continuously adapting LUT 282 so that its polynomial function may more accurately and completely describe the gain performance of amplifier 70, as depicted in FIG. 14 for example.

Adaptive control section 164 is responsive to error signal 90 and to communication signal 92. Communication signal 92 represents a form of communication signal 54 delayed into time alignment with error signal 90. Adaptive control section 164 generates adaptation signal 166 as described above in connection with FIG. 8. The same parameters that drive address inputs for the first port of LUT 282 are delayed in a delay element 286 and applied to the address inputs for the second port of LUT 282. Delay element 286 is configured to temporally align magnitude parameter 152 and magnitude derivative parameter 204 with adaptation signal 166 from adaptive control section 164. Adaptation signal 166 drives a data input associated with the second port of LUT 282.

Accordingly, since a single control loop is provided and a single polynomial that is a function of both magnitude parameter 152 and magnitude derivative parameter 204 is provided, improved performance over the embodiment of predistorter 58 shown in FIGS. 8-11 may be achieved in some applications.

As discussed above, magnitude derivative parameter 204 is responsive to the portion of the video signal that results from even-ordered harmonics of the RF version of predistorted communication signal 60' input to amplifier 70 (FIG. 5). These even-ordered harmonics produce a video bandwidth drain current that operates on the substantially inductive network of components 138 coupled to HPA 114 to modulate the bias conditions for HPA 114 (FIG. 5). But this does not account for additional bias condition modulation that results from the use of variable bias signals 81 and 83 (FIG. 3) whose signal dynamics also fall in the video bandwidth. In order to properly account for this additional bias condition modulation, LUT 282 may also include an address input having one or more address bits responsive to one or more variable bias parameters 85 (FIG. 3).

As shown in FIG. 13, variable bias parameters 85 may include a variable drain bias parameter 83' that characterizes variable bias signal 83 (FIG. 3) coupled to the drain of HPA 114 (FIG. 5). Since variable drain bias parameter 83' also modulates $V_{ds}$, improved accuracy results from making the polynomial generated in LUT 282 account for this form of modulation. Thus, variable drain bias parameter 83' is processed through a delay element 288 and a quantizer 290 to time-align and quantize parameter 83' prior to concatenating parameter 83' with the other address inputs of LUT 282.

Likewise, variable bias parameters 85 may include a variable gate bias parameter 81' that characterizes variable bias signal 81 (FIG. 3) coupled to the gate of HPA 114 (FIG. 5). Variable gate bias signal 81 modulates the bias conditions of HPA 114 in two ways. Such modulation directly causes the gate bias condition to change, which causes HPA 114 to alter its transconductance gain, as depicted in FIG. 14. Thus, variable gate bias parameter 81' is processed through a delay element 292 and a quantizer 294 to time-align and quantize parameter 81' prior to concatenating parameter 81' with the other address inputs of LUT 282.

And, variable gate signal 81 also indirectly modulates the bias conditions of HPA 114 by being amplified through HPA 114 to generate a video bandwidth component of drain current proportional to variable bias signal 81. This component of drain current acts upon the substantially inductive network of components 138 to generate another video bandwidth drain voltage signal component proportional to the derivative of variable bias signal 81, since network of components 138 is substantively inductive and resonance frequencies in the video bandwidth impedance are avoided by omitting video trapping capacitors. Thus, variable gate bias parameter 81' is processed through a differentiator 296 and a quantizer 298 to differentiate parameter 81' with respect to time and to quantize derivative parameter 81' prior to concatenating the derivative of parameter 81' with the other address inputs of LUT 282. While delay elements are shown in other signal paths that drive address inputs of LUT 282, FIG. 13 omits a delay element in this signal path because it is assumed to be the slowest of the signal paths. But regardless of which signal path is slowest, those skilled in the art can apply appropriately configured delay elements where needed to achieve time alignment at the address inputs of LUT 282.

By making the polynomial generator implemented in LUT 282 responsive to variable bias parameters, predistorter 58 achieves an even more accurate definition of the manner in which signal magnitude and bias conditions alter the gain exhibited by HPA 114, and improved performance in the linearization of transmitter 50 results.

With up to five different parameters driving the address inputs of LUT 282, the size of LUT 282 may become undesirably large for some applications, particularly when some of the parameters are presented to LUT 282 using more than just a few bits of resolution. An excessively large LUT may be undesirable in some applications for two reasons. First, a larger LUT drives up costs and consumes more power. And second, a larger LUT requires longer to adapt to convergence upon a stable and accurate definition of its polynomial.

Figure 15:
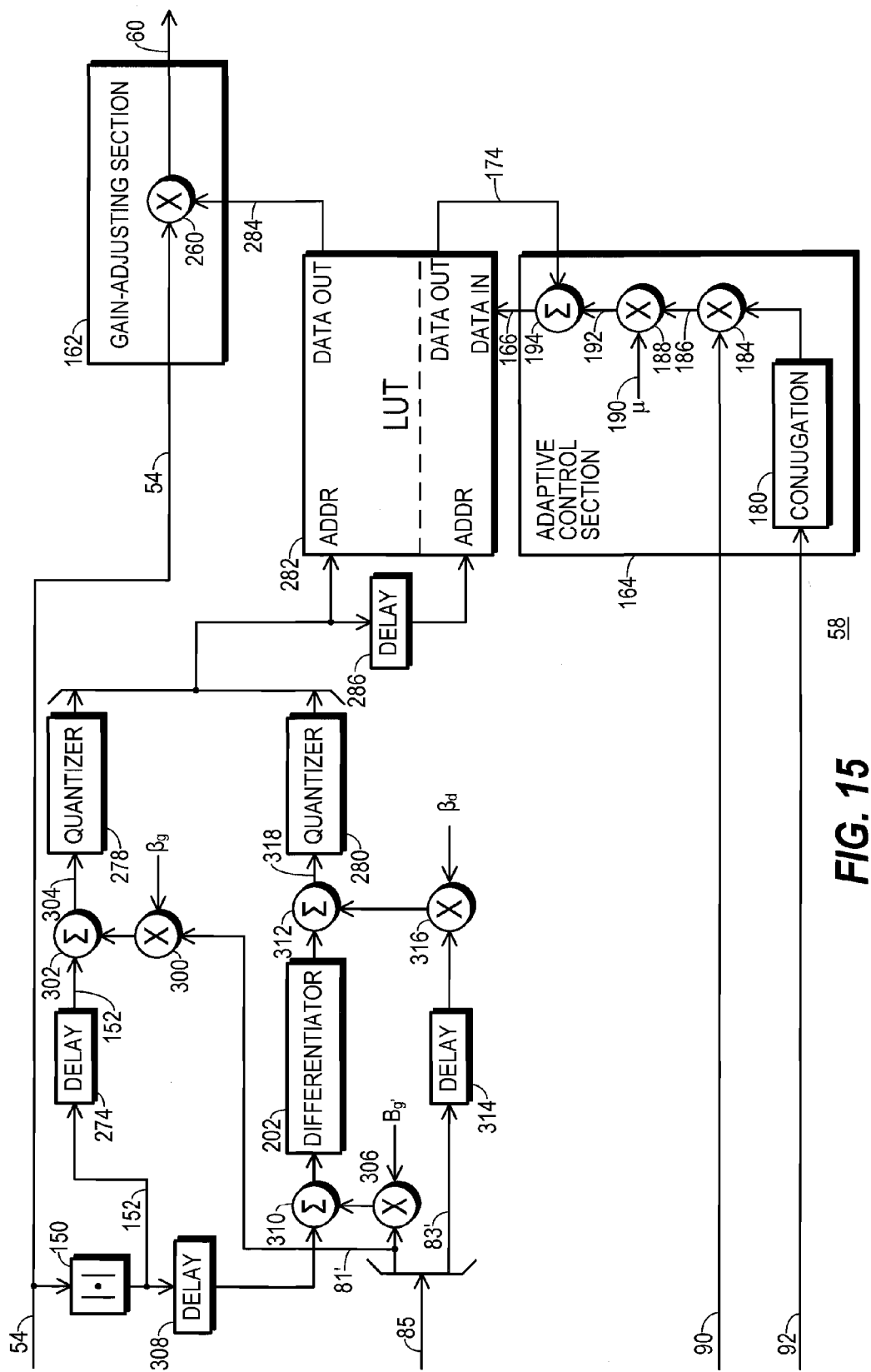
FIG. 15 shows a block diagram of a fourth embodiment of the nonlinear predistorter portion of the transmitter.

FIG. 15 shows a block diagram of a fourth embodiment of predistorter 58. In the FIG. 15 embodiment the above-discussed parameters that drive one or may drive address inputs to adaptable LUT 282 have been combined to reduce the size of LUT 282. As in FIG. 13, FIG. 15 drops the complex signal notation used above in FIGS. 8-11.

The FIG. 13 embodiment of predistorter 58 uses up to five different, albeit related, parameters to independently drive up to five different address inputs of LUT 282, where each of the five different address inputs may include one or more address bits. The five different parameters may be grouped into two different groups. Each parameter in one group of parameters is proportional to different modulations of $V_{gs}$ (FIG. 14). This group of parameters includes magnitude parameter 152 and variable gate bias parameter 81'. Each parameter in another group of parameters is proportional to different modulations of $V_{ds}$ (FIG. 14). This group of parameters includes magnitude derivative parameter 204, variable drain bias parameter 83', and the derivative of variable gate bias parameter 81'. The FIG. 15 embodiment of predistorter 58 combines the parameters that characterize modulations of $V_{gs}$ prior to driving a first address input of LUT 282 and also combines the parameters that characterize modulations of $V_{ds}$ prior to driving a second address input of LUT 282, where each of these first and second address inputs may include any number of address bits.

Other than for the use of a smaller memory which implements LUT 282 using fewer address bits than may be required in the FIG. 13 embodiment discussed above, this FIG. 15 embodiment configures and interconnects LUT 282, adaptive control section 164, and gain-adjusting section 162 substantially as discussed above in connection with FIG. 13. And, magnitude-extracting section 150 generates magnitude parameter 152 from communication signal 54 substantially as discussed above in connection with FIG. 13. Delay element 274 also delays magnitude parameter 152 for time alignment purposes. But in this FIG. 15 embodiment, variable gate bias parameter 81' is scaled by a scaling constant $\beta_g$ in a scaling section 300 and combined with a delayed version of magnitude parameter 152 provided by delay element 274 in an adder 302 to form a combined gate modulation parameter 304. Combined gate modulation parameter 304 is quantized in quantizer 278, then passed to a first address input of LUT 282. This first address input of LUT 282 may have fewer address bits than the total number of address bits needed to accommodate the magnitude parameter and variable gate bias parameter in the FIG. 13 embodiment.

Variable gate bias parameter 81' is also scaled by a different scaling constant, $\beta_{g'}$, in a scaling section 306 and combined at an adder 310 with a version of magnitude parameter 152 that has been delayed in a delay element 308. The output from adder 310 drives differentiator 202. At the output of differentiator 202 a combination parameter represents the combination of the two derivative parameters from the FIG. 13 embodiment and is supplied to an input of an adder 312. Variable drain bias parameter 83' is delayed in a delay element 314 then scaled by a scaling constant $\beta_d$ in a scaling section 316 and combined into this combination parameter at adder 312. A combined drain modulation parameter 318 is quantized in quantizer 280, then passed to a second address input of LUT 282. This second address input of LUT 282 may have fewer address bits than the total number of address bits needed to accommodate the magnitude derivative parameter, variable drain bias parameter, and derivative of variable gate bias parameter in the FIG. 13 embodiment.

Each of scaling constants $\beta_g$, $\beta_{g'}$, and $\beta_d$ may be determined empirically during manufacture. Alternately, each of scaling constants $\beta_g$, $\beta_{g'}$, and $\beta_d$ may be independently determined in control loops (not shown) which monitor error signal 90 and dither the respective scaling constants $\beta_g$, $\beta_{g'}$, and $\beta_d$ in a controlled manner until the power of error signal 90 is minimized. Desirably, such control loops are decoupled from one another in any of a variety of ways known to those skilled in the art and exhibit a loop bandwidth sufficiently slow that they do not interfere with the control loops used to update LUT 282, AGC 62, and linear predistorter 64 (FIG. 3).

Accordingly, this FIG. 15 embodiment of predistorter 58 achieves substantially the same performance as the FIG. 13 embodiment using a smaller memory for LUT 282, or achieves improved performance over the FIG. 13 embodiment using the same size or a smaller memory for LUT 282. Through the use of a smaller memory for LUT 282, shortened convergence times may also be achieved.

Figure 16:
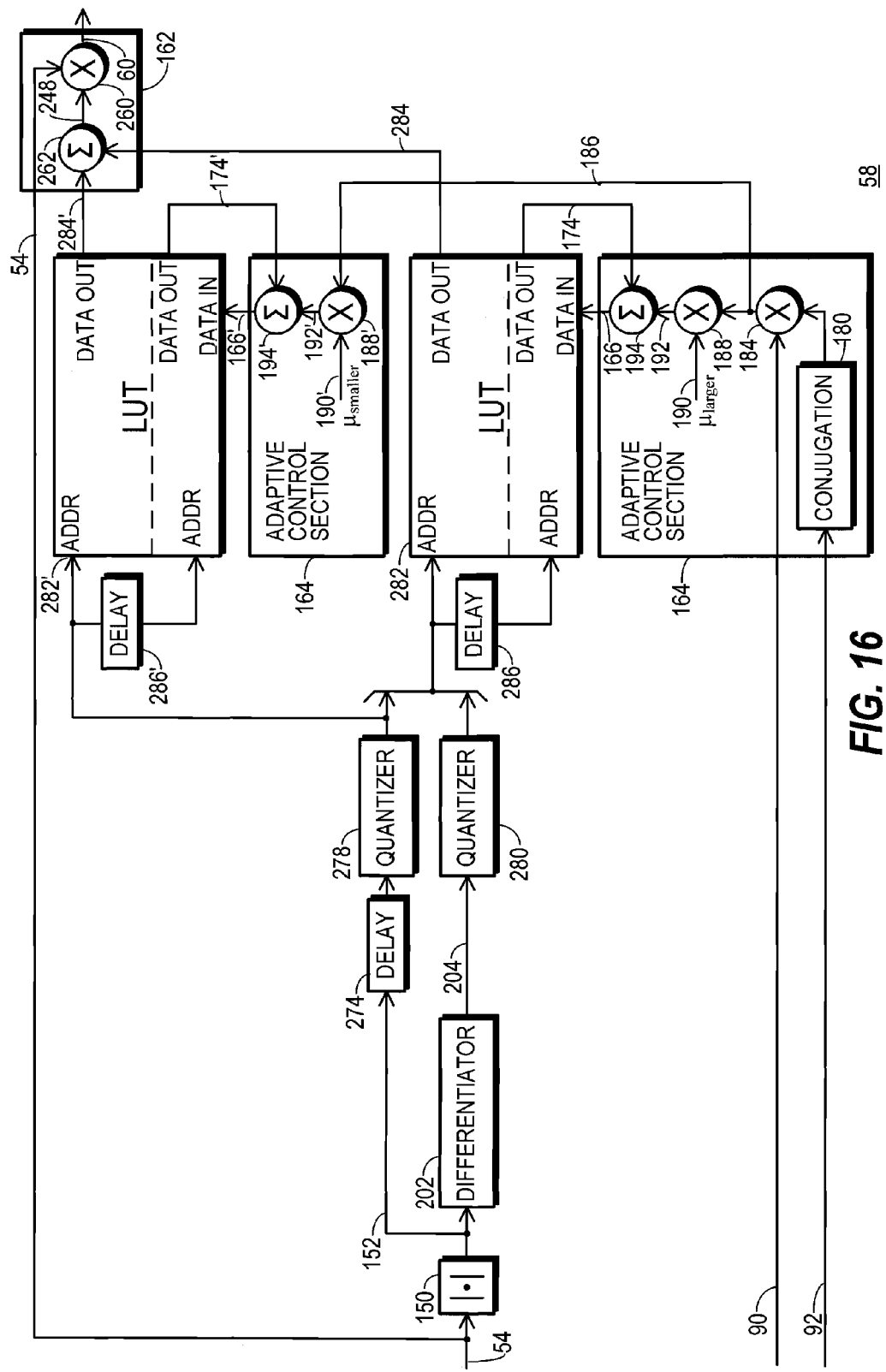
FIG. 16 shows a block diagram of a fifth embodiment of the nonlinear predistorter portion of the transmitter.

FIG. 16 shows a block diagram of a fifth embodiment of nonlinear predistorter 58. The FIG. 16 embodiment provides an additional optimization which results from recognizing that the majority of nonlinear distortion in transmitter 50 is explained by accurately capturing the gain variation that results solely in response to magnitude parameter 152. In general, the most significant bits of gain-correcting signal 284 tend to be influenced only by variations in magnitude parameter 152, while the least significant bits of gain-correcting signal 284 tend to be influenced by each of the above-discussed five parameters used to address adaptable LUT 282 in the FIG. 13 and FIG. 15 embodiments of predistorter 58. This may result in a less efficient use of memory in LUT 282 than is desired for a given level of performance.

In this FIG. 16 embodiment the above-discussed variable bias signal parameters have been omitted for the sake of discussion. But these parameters may be added to the FIG. 16 embodiment by following the teaching of FIGS. 13 and 15. As in FIGS. 13 and 15, FIG. 16 drops the complex signal notation used above in FIGS. 8-11.

In this FIG. 16 embodiment, magnitude-extracting section 150 operates as discussed above to generate magnitude parameter 152. Likewise, differentiator 202 operates as discussed above in connection with FIG. 13 to generate magnitude derivative parameter 204. Delay element 274, quantizers 278 and 280, LUT 282, and adaptive control section 164 all operate substantially as discussed above in connection with FIG. 13. Thus, LUT 282 is responsive to magnitude parameter 150 and magnitude derivative parameter 204. LUT 282 may also be responsive to variable bias parameters (not shown) as discussed above. However, LUT 282 may be, but is not required to be, configured so that gain-correcting signal 284 provides fewer bits of resolution. The use of a smaller number of bits for data output from LUT 282 may result in a memory savings.

In this FIG. 16 embodiment of predistorter 58, a second adaptable LUT, referred to in FIG. 16 as LUT 282', is provided with its own portion of adaptive control section 164. LUT 282' is responsive to magnitude parameter 152 and may obtain parameter 152 from quantizer 278 as shown in FIG. 16 or may obtain parameter 152 from a different quantizer (not shown) which expresses parameter 152 using a different number of bits. In order to minimize the size of LUT 282', LUT 282' is desirably unresponsive to magnitude derivative parameter 204 and to variable bias parameters 85. Thus, LUT 282' desirably has fewer memory words and fewer address input bits than LUT 282. LUT 282' implements a polynomial function whose output forms a gain-correcting signal 284'. Gain-correcting signal 284 is joined with gain-correcting signal 284' within joining and gain-adjusting section 162 at adder 262. An output of adder 262 provides combined gain-correcting signal 248, which is used to adjust gain of communication signal 54 in a multiplier 260 of joining and gain-adjusting section 162. Although not shown, gain-correcting signals 284 and 284' are scaled relative to each other so that gain-correcting signal 284 corresponds at least to bits of less significance in combined gain-correcting signal 248 and gain-correcting signal 284' corresponds at least to bits of more significance in combined gain-correcting signal 248.

The portion of adaptive control section 164 associated with LUT 282' responds to the same error signal 90 and delayed communication signal 92 that are used in adapting the polynomial of LUT 282. So, only the final stages of the LMS algorithm implemented through adaptive control section 164 are repeated for LUT 282'. In particular, raw correlation signal 186 is used for both LUT 282 and LUT 282'. But for LUT 282', raw correlation signal 186 drives a first input of a multiplier 188', where a second input receives a scaling constant 190'. An output of multiplier 188' drives a first input of a combiner 194', where a second input receives data output from LUT 282' during the update process. An output from combiner 194' provides adaptation signal 166', which drives the "data in" port of LUT 282'. And, a delay element 286' delays the magnitude parameter that drives the address input of LUT 282' into temporal alignment with adaptation signal 166' for presentation at the second port of LUT 282'.

The FIG. 16 embodiment of predistorter 58 uses memory more efficiently, which allows predistorter 58 to achieve at least the same performance using about the same or less memory in LUT's 282 and 282'. Since LUT 282' is significantly smaller than LUT 282, it may converge more quickly than LUT 282. And, it may be configured to use a smaller step-size scaling constant 190' than is used for the step-size scaling constant 190 associated with LUT 282. The smaller step size results in a narrower loop bandwidth, a less jittery implementation of its polynomial function, and more accurate results. Conversely, since LUT 282 may use a larger step-size scaling constant 190 that somewhat compensates for the use of a larger memory that otherwise converges more slowly.

Although not shown, since LUT's 282 and 282' are at least partially converging on a common solution, in some applications their adaptation control loops may conflict with one another to some degree. Any such conflict may be resolved using techniques known to those of skill in the art, including implementing one of the integrators resulting from combiners 194 and 194' operating in combination with their respective LUT's as a leaky integrator.

Figure 17:
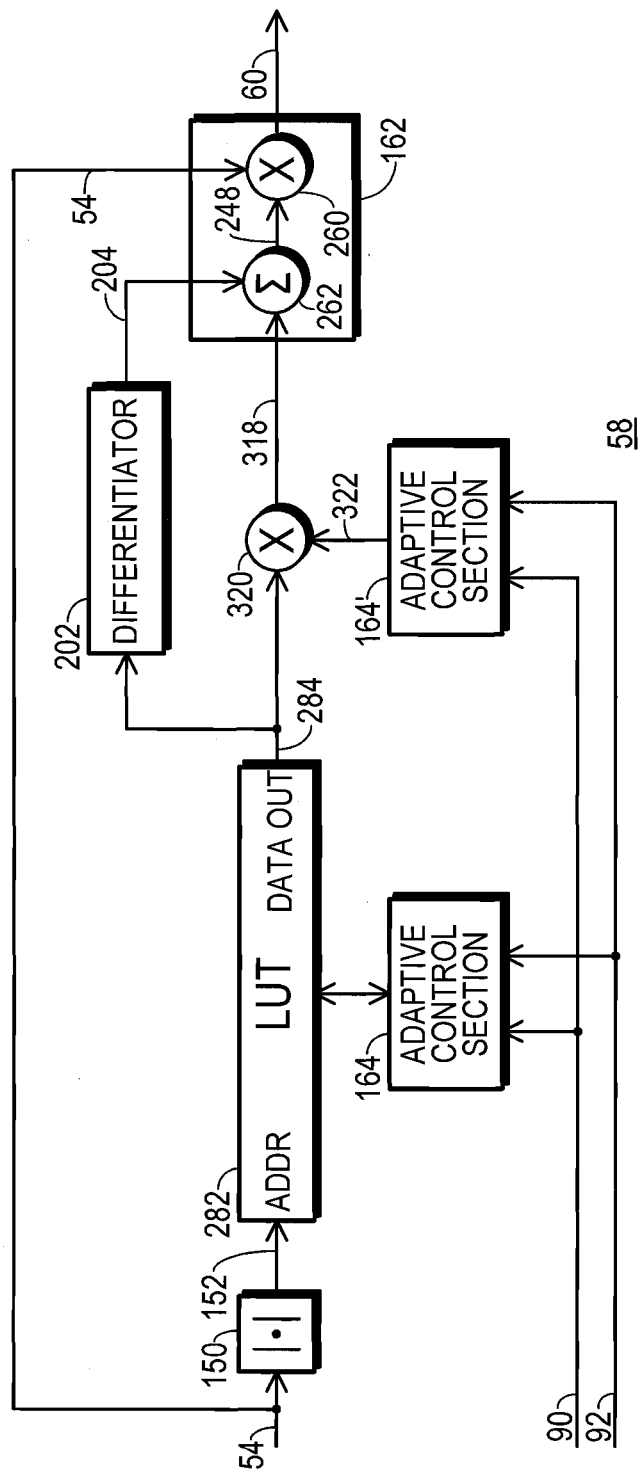
FIG. 17 shows a block diagram of a sixth embodiment of the nonlinear predistorter portion of the transmitter.

FIG. 17 shows a block diagram of a sixth embodiment of the nonlinear predistorter portion of the transmitter. The FIG. 17 embodiment provides an additional optimization which results from recognizing that, in some amplifiers 70 (FIG. 5), the specific semiconductor or other technology used in manufacturing HPA 114 may result in an active device that does not exhibit as strongly nonlinear a gain attribute with respect to drain-to-source voltage ($V_{ds}$) as may be exhibited by other technologies and as depicted in FIG. 14. In these situations, the differentiation operation carried out by differentiator 202 may be placed after, rather than before, the nonlinear polynomial generator implemented in LUT 282 due to the roughly linear relationship between gain and drain bias voltage. This optimization allows LUT 282 to be driven with fewer address bits, permitting the use of a smaller adaptable look-up table and a faster adaptation and convergence on the nonlinear polynomial function implemented by LUT 282.

In this FIG. 17 embodiment, the above-discussed variable bias signal parameters have been omitted for the sake of discussion. But these parameters may be added to the FIG. 17 embodiment by following the teaching of FIGS. 13 and 15. As in FIGS. 13, 15, and 16, FIG. 17 drops the complex signal notation used above in FIGS. 8-11.

In this FIG. 17 embodiment, magnitude-extracting section 150 operates as discussed above to generate magnitude signal 152 in response to communication signal 54. Magnitude signal 152 drives address inputs of adaptable LUT 282, perhaps through a quantizer (not shown) as discussed above in connection with FIGS. 13, 15, and 16. LUT 282 operates as discussed above, with adaptable data entries updated in response to the operation of adaptive control section 164. As discussed above, adaptive control section 164 is responsive to error signal 90 and to communication signal 92, which is a delayed form of communication signal 54 at the increased sample rate. LUT 282 generates gain correcting signal 284, which is responsive to communication signal 54 and more particularly is responsive to a nonlinear polynomial function of the magnitude parameter of communication signal 54.

In this FIG. 17 embodiment, gain-correcting signal 284 drives two separate paths. One path provides the differentiation function discussed above. Gain-correcting signal 284 drives differentiator 202. Differentiator 202 takes a derivative with respect to time of a signal responsive to communication signal 54, and in this particular embodiment of gain-correcting signal 284, to generate derivative signal 204. A second path converts gain-correcting signal 284 into an independent gain-correcting signal 318. At a multiplier 320, gain-correcting signal 284 is multiplied by another gain factor 322 provided by an adaptive control section 164'. Adaptive control section 164' closes a feedback loop to maintain gain factor 322 at the level that minimizes correlation between error signal 90 and communication signal 92. Adaptive control section 164' may implement an LMS control loop, a dither control loop, or any other feedback control technique known to those skilled in the art. Desirably, the feedback control loop closed by adaptive control section 164' is adequately decoupled from and does not interfere with the operation of other control loops discussed herein. Such decoupling may occur, for example, by configuring adaptive control section 164' to exhibit a loop bandwidth considerably narrower than the loop bandwidths of other the control loops discussed herein.

Independent gain-correcting signal 318 and derivative signal 204 together drive joining and gain-adjusting section 162. Although not shown in FIG. 17, an appropriate delay may be inserted into one of the two driving paths so that the driving signals are coincident in time when they arrive at section 162. And, in yet another embodiment (not shown) multiplier 320 may alternatively be located in the path that generates derivative signal 204 while gain correcting signal 284 is used to directly drive joining and gain-adjusting section 162.

Within section 162, combiner 262 adds derivative signal 204 and independent gain-correcting signal 318 to produce a combined gain-correcting signal 248 that is responsive to the magnitude of communication signal 54 and to derivative signal 204. As discussed above, at multiplier 260, the gain of communication signal 54, which drives one input of multiplier 260, is adjusted as indicated by combined gain-correcting signal 248, which drives another input of multiplier 260. An output of multiplier 260 provides predistorted communication signal 60. Accordingly, multiplier 260 distorts communication signal 54 in response to derivative signal 204. But derivative signal 204 is generated downstream of LUT 282.

The embodiments of predistorter 58 depicted in FIGS. 13, and 15-17 may also be used in the FIG. 12 embodiment, which additionally addresses memory effects.

Referring back to FIGS. 5 and 6, it may be noted that the impedance presented to HPA 114 in video bandwidth 140 extends well into an intermediate impedance range and that output bias circuit 112 and HPA 114 together form a voltage divider driven by $V_d$, with the drain of HPA 114 serving as the output of the voltage divider. At higher levels of conductivity for HPA 114, vast amounts of $V_{ds}$ video signal modulation may result. While the above-discussed embodiment works acceptably well for some forms of HPA 114, and in particular with lower conductivity forms of HPA 114, higher conductivity forms of HPA 114 can operate over a wider signal range when the impedance presented to HPA 114 in video bandwidth 140 is held to a lower level. This lower level may nevertheless extend into intermediate impedance range $Z_i$. And, as discussed above, this lower level is desirably strongly inductive and/or resistive throughout video bandwidth 140 so as to minimize memory effects.

Figure 18:
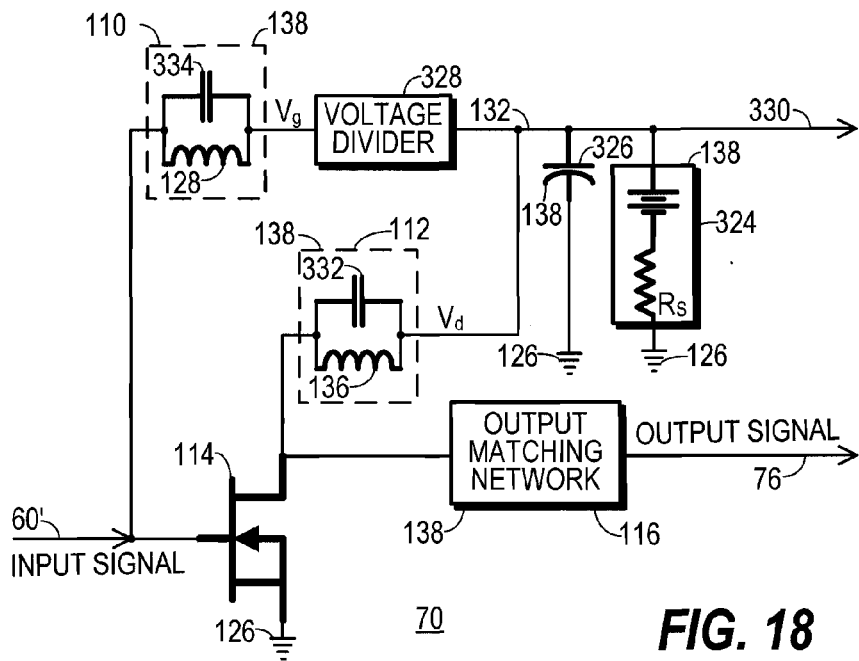
FIG. 18 shows a circuit diagram, in simplified form, of an alternate embodiment of the amplifier portion of the transmitter of FIG. 3.

FIG. 18 shows a circuit diagram, in simplified form, of an alternate embodiment of the amplifier portion of the transmitter of FIG. 3. FIG. 18 differs from the circuit diagram of FIG. 5 by primarily providing a different input bias circuit 110 and a different output bias circuit 112. As discussed above in connection with FIG. 5, network of components 138 coupled to HPA 114 are again configured to exhibit an impedance to HPA 114 that either remains constant with increasing frequency or increases with increasing frequency substantially throughout video bandwidth 140 (FIG. 6). But bias circuits 110 and 112 show an improved ability to maintain a low impedance throughout video band 140. Throughout video bandwidth 140, the impedance presented to HPA 114 is primarily inductive in nature, but is only lightly inductive. For the purposes of discussing FIG. 18, HPA 114 again refers to the active amplifying device or devices used by amplifier 70 to accomplish amplification when appropriately biased and matched, regardless of the specific semiconductor or other technology used to manufacture HPA 114.

RF input signal 60' is applied to input bias circuit 110 and to an input port of HPA 114. In accordance with the arbitrarily selected MOS FET HPA device depicted in FIG. 18, the gate node of HPA 114 provides this input port, the source node couples to ground potential 126, and the drain node provides the output for HPA 114. The drain node couples to output bias circuit 112 and to output matching network 116. Amplified RF signal 76 is provided by output matching network 116. A load for signal 76 is omitted from FIG. 18 for convenience.

FIG. 18 depicts a fixed bias voltage source for amplifier 70 in the form of a battery 324. Battery 324 provides a fixed bias voltage relative to the convergence time of adaptable LUT 282. Those skilled in the art will understand that the fixed bias voltage may nevertheless droop as battery 324 proceeds from a fully charged state toward a discharged state but that the adaptation of LUT 282 will account for this droop. In alternative embodiments, the bias voltage source may be provided by a fixed power supply or by variable bias supply 80 (FIG. 3). In this embodiment, a negative terminal of battery 324 couples to ground potential 126, and a positive terminal of battery 324 couples to common positive node 132. A decoupling capacitor 326 couples in parallel with battery 324 across common positive node 132 and ground 126. Common positive node 132 provides $V_d$ directly to output bias circuit 112 and provides $V_g$ to input bias circuit 110 indirectly through a voltage divider 328. As indicated by a power bus 330, common positive node 132 may also drive, either directly or indirectly, other circuits within transmitter 50 and within the device which incorporates transmitter 50. All capacitance appearing between power bus 330 and ground 126 is represented by decoupling capacitor 138, although many different capacitive devices may be distributed over the entire device which incorporates transmitter 50 to account for this capacitance. Desirably, this capacitance adds up to a large capacitance value.

Output bias circuit 112 is configured as a resonant circuit having inductor 136 and a capacitor 332 coupled in parallel. Output bias circuit 112 is coupled in series between common positive node 132 and the output port (e.g., drain) of HPA 114. In this FIG. 18 embodiment, inductor 136 is preferably a small lumped, discrete inductor. Likewise, input bias circuit 110 is configured as a resonant circuit having inductor 128 and a capacitor 334 coupled in parallel. Input bias circuit 110 is coupled in series between voltage divider 328 and the input port (e.g., gate) of HPA 114. In this FIG. 18 embodiment, inductor 128 is preferably a small lumped, discrete inductor. Capacitors 332 and 334 are configured to achieve resonance with their respective parallel-coupled inductors 136 and 128 at fundamental RF bandwidth 142.

In this FIG. 18 embodiment, network of components 138 again presents an impedance to HPA 114, and this impedance varies over frequency. Network of components 138 includes the components of input and output bias circuits 110 and 112, output matching network 116 and its load (not shown), voltage divider 328, decoupling capacitor 326, battery 324, and all other circuits (not shown) coupled to bus 330.

Figure 19:
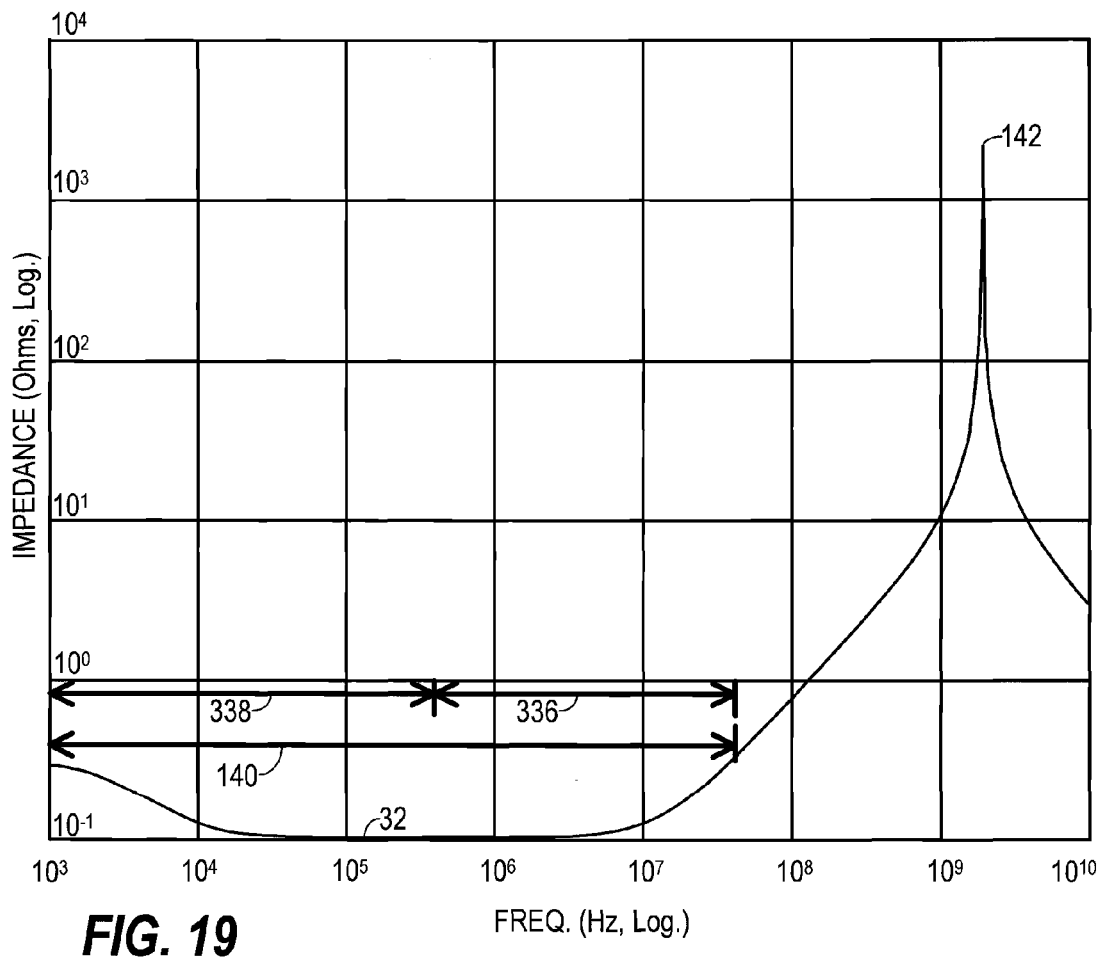
FIG. 19 shows a representative chart of impedances versus frequency presented to the active amplifying device of the alternate amplifier depicted in FIG. 18.

FIG. 19 shows a representative chart of impedances versus frequency presented to HPA 114 of the amplifier 70 through output and input biasing circuits 112 and 110, as depicted in FIG. 18. FIG. 19 does not depict the influence of output matching network 116 and its load on output signal 76 on HPA 114. Output matching network 116 and its load desirably operate in a conventional manner, presenting a high impedance in video bandwidth 140 and low impedance in fundamental RF bandwidth 142. The impedance and frequency axes in FIG. 18 are configured to depict impedance and frequency logarithmically due to the vast ranges of impedance and frequency covered. Due to the logarithmic presentation, video bandwidth 140 appears far larger than fundamental RF bandwidth 142 than it actually is. And, an upper 99% portion 336 of video bandwidth 140 appears to be slightly smaller than a lower 1% portion 338 of video bandwidth 140. Of course, upper 99% portion 336 is 99 times larger than lower 1% portion 338 in reality.

Referring to FIGS. 18 and 19, starting at the lowest, near-DC frequencies in lower 1% portion 338 of video bandwidth 140, an intermediate impedance is presented, but that intermediate impedance quickly diminishes to a much lower impedance as frequency starts to increase. This intermediate impedance results primarily from a source resistance internal to battery 324. At near-DC frequencies, decoupling capacitor 326 exerts little influence. But as frequency increases, decoupling capacitor 326 quickly exerts a diminishing impedance and an increasing influence over the impedance presented to HPA 114. Desirably, capacitor 326 exhibits a large capacitance value, which allows a large amount of charge to be stored, and allows battery 324 and other circuits on bus 330 to become decoupled from each other and HPA 114 as frequency increases.

At near-DC frequencies, the series impedance of inductors 136 and 128 is near zero, but this impedance increases as frequency increases. As some point, this increasing impedance becomes more significant to HPA 114 than the diminishing impedance of capacitor 326. When this happens, an impedance minima 32 has formed, desirably in lower 1% portion 338 of video bandwidth 140, but possibly in the lowest section of upper 99% portion 336 in some embodiments. Desirably, no more than one impedance minima appears in upper 99% portion 336 of video bandwidth 140 to minimize memory effects on the linearity of amplifier 70. Throughout video bandwidth 140, the impedance of capacitors 332 and 334 desirably remain so high that they exert little influence over the combined impedance presented to HPA 114 by the tuned circuits which form input and output bias circuits 110 and 112. Desirably, inductors 136 and 128 are configured so that even at the upper edge of video bandwidth 140 the overall impedance presented to HPA 114 has not increased to an excessive level. In other words, the impedance values of inductors 136 and 128 are small. Accordingly, throughout video bandwidth 140, the impedance presented to HPA 114 by network of components 138 is substantially inductive to minimize memory effects on the linearity of amplifier 70. In other words, impedance increases with increasing frequency, and any impedance minima is confined to an insignificant portion at the lowest section of video bandwidth 140. As discussed above, this increasing impedance with frequency worsens a memoryless distortion, but that memoryless distortion is compensated through the use of a derivative with respect to time of a signal which is responsive to communication signal 54 in forming a predistorted form (e.g., predistorted communication signal 60) of communication signal 54.

At frequencies above video bandwidth 140 but below fundamental RF bandwidth 142, the impedance presented to HPA 114 through input and output bias circuits 110 and 112 continues to increase primarily in response to the operation of inductors 136 and 128. But at the center of fundamental RF bandwidth 142, frequency has increased to such a degree that capacitors 332 and 334 exhibit the same magnitude of impedance as is exhibited by inductors 136 and 128, respectively, and the tuned circuit is at its resonance point. At fundamental RF bandwidth 142, impedance is desirably sufficiently high to effectively block RF energy from propagating from HPA 114 toward bus 330. But at fundamental RF bandwidth 142 the impedance presented through output matching network 116 is considerably lower, and RF energy passes through output matching network 116.

Above fundamental RF bandwidth 142, the impedance presented to HPA 114 through input and output bias circuits 110 and 112 diminishes due to the reducing impedance exhibited by capacitors 334 and 332. If desired, for accelerated diminishment of impedance at these frequencies, RF-trapping capacitors (not shown) may be added to amplifier 70 in a manner understood by those skilled in the art to further diminish impedance at frequencies above fundamental RF bandwidth 142.

While the above-discussed approaches to power amplifier linearization achieve effective and even highly effective linearization along with marked power consumption improvements over approaches based on Volterra models and other approaches that craft predistortion signals that compensate for significant memory effects, additional improvements in power consumption would nevertheless be desirable. And, additional power consumption improvements would be particularly desirable for mass market, battery-powered devices. For the above-discussed approaches, digitally capturing and processing an extra wide bandwidth signal in the feedback path is a contributor to power consumption and to elevated costs. Accordingly, another embodiment of a linearized transmitter in which the feedback path is either eliminated or replaced with a low bandwidth feedback path and the predistorter's adaptable look-up table is replaced with an unadaptable look-up table is discussed below.

The above-discussed approaches to power amplifier linearization result from exploiting the fact that amplifier 70, regardless of the particular one of a vast assortment of amplifier configurations that may be used, can be represented by some sort of conductance manifold, such as is depicted in exemplary form in FIGS. 7 and 14. The conductance manifold accounts for the parameters that makes amplifier 70 capable of amplification. For any given value of the drain-to-source voltage drop across amplifier 70, there is a unique relationship between the gate-to-source voltage and the conductivity between the drain and the source nodes. This conductance manifold is a function of the specific doping profiles and semiconductor design associated with its amplifier device. These characteristics are defined by the semiconductor fabrication process, and the fabrication process is engineered specifically to make every amplifier device virtually identical to every other amplifier device fabricated using the same process. While process alterations are often introduced over time in order to make continuous incremental improvements in performance and/or process yield, throughout any duration over which the process remains unchanged, every single amplifier device should have a nearly identical conductance manifold. Hence, to the extent that an amplifier's characteristics have been captured in the data entries of a look-up table 170, 198, 282, or 282' (FIGS. 8, 9, 13, 15, 16, and 17), no further adaptation of adaptable data entries 172 and 208 (FIGS. 8 and 9) in a look-up table 282 should be required for purposes of characterizing amplifier 70. On the other hand, the adaptable data entries 172 and 208 in a look-up table 282 also characterize variable transmitter parameters other than those reflected in an amplifier's conductance manifold. In order to achieve highly effective linearization, these other variable transmitter parameters should be accounted for.

Figure 20:
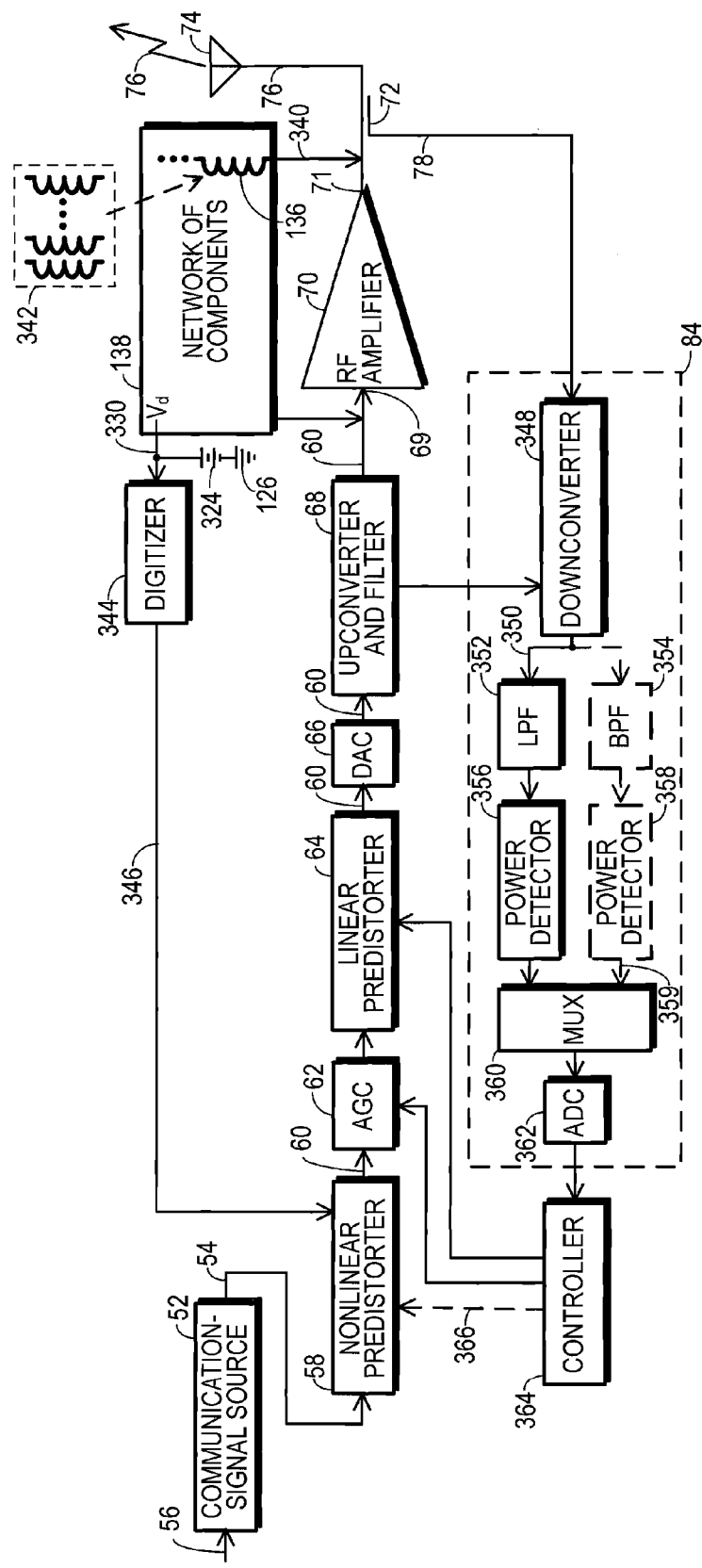
FIG. 20 shows a simplified block diagram of the transmitter configured in accordance with another embodiment of the present invention.

FIG. 20 shows a simplified block diagram of transmitter 50 configured in accordance with another embodiment of the present invention. The FIG. 20 embodiment has many similarities to the FIG. 3 embodiment discussed above, but also has notable differences. In general terms, in this FIG. 20 embodiment predistorter 58 includes a look-up table which stores unadaptable data entries, and feedback section 84 from the FIG. 3 embodiment may be either eliminated or replaced with a low bandwidth, relative slow sample-rate feedback section. The use of a look-up table which stores unadaptable data entries permits the high bandwidth, relatively fast sample-rate adaptive control section 164 (FIGS. 4, 8, 9, 13, 15, 16, and 17) to be omitted, and the look-up table itself may now operate at one-half the number of accesses in a given period of time. A substantial power savings results along with cost savings from omitting a high speed, high precision analog-to-digital component 82 used in the FIG. 3 embodiment.

This FIG. 20 embodiment of transmitter 50 includes communication-signal source 52, nonlinear predistorter 58, automatic gain controller (AGC) 62, linear predistorter 64, digital-to-analog (DAC) controller 66, upconverter and filter section 68, RF amplifier 70, and antenna 74 coupled together as discussed above in connection with FIG. 3. Communication-signal source 52 is desirably configured as discussed above and generates communication signal 54, as discussed above. Nonlinear predistorter 58 is desirably configured to include an unadaptable look-up table as is discussed in more detail below in connection with FIG. 21, and produces predistorted communication signal 60. As discussed above, predistorted communication signal 60 is a wide bandwidth, increased sample rate signal to accommodate the extra wide bandwidth in which spectral regrowth appears. This wide bandwidth is wider than the bandwidth allocated to transmitter 40 for the transmission of RF energy. Predistorted communication signal 60 is processed by and passes through AGC 62, linear predistorter 64, DAC 66, and upconverter section 68 to amplifier input 69 of RF amplifier 70. An output 71 of RF amplifier 70 generates amplified RF signal 76, which is broadcast from antenna 74.

Network of components 138 is desirably configured along the lines discussed above in connection with either of FIG. 5 or 18. But for the sake of clarity, the following discussion will assume that network of components 138 is configured similarly to the FIG. 5 embodiment, with output matching network 116 (FIG. 5) present, but not shown in FIG. 20. As discussed above, network of components 138 includes a variety of bias circuit components that includes inductor 136. In this embodiment, inductor 136 is configured as a discrete RF choke through which an amplifier biasing signal 340 passes as it is applied to output 71 of amplifier 70. In this embodiment, supply voltage source 324 is provided by a dischargeable and rechargeable battery of a type conventionally used in mobile electronics. But other embodiments may use other types of power supplies for supply voltage source 324. Supply voltage source 324, which will also be referred to below as dischargeable and rechargeable battery 324, provides the voltage labeled $V_d$ and couples between common power bus 330 and node 126, which is maintained at a ground potential.

As discussed above in connection with FIG. 14, the conductance of amplifier 70 at any given instant is a nonlinear function of $V_{ds}$. But $V_{ds}$ itself is a function of the conductance of amplifier 70 and other parameters. In particular, the other parameters include the battery voltage $V_d$, the inductance exhibited by inductor 136, and the derivative with respect to time of the magnitude of the predistorted communication signal 60 in video bandwidth 140 (FIGS. 6 and 19). In RF fundamental band 142 (FIGS. 6 and 19), due to the impedance profile of the output matching network (not shown), these other parameters become less significant.

The above-discussed embodiments of transmitter 50 which used adaptable look-up tables mentioned that bias voltages may be either of a fixed variety, or of a variety that may be specifically controlled or modulated in response to communication signal 54 for the purposes of generating a variable bias signal that would yield improved power added efficiency for amplifier 70. The fixed variety was considered to be fixed relative to the convergence time associated with the adaptation of the look-up table. But in comparison to an unadaptable look-up table, a supply voltage source, such as dischargeable and rechargeable battery 324, which may discharge slowly over time, is not truly fixed. Rather, in this embodiment battery voltage $V_d$ varies in response to the state of charge for dischargeable and rechargeable battery 324. In particular, dischargeable and rechargeable battery 324 supplies a voltage that varies within a voltage range associated with a full charge at one end of the range and full discharge at the other end of the range. The actual battery voltage $V_d$ exhibited at power bus 330 at any particular time is referred to as actual voltage $V_d$ below, and falls within this voltage range.

The inductance exhibited by inductor 136 may also vary in two ways. Variance may be observed between discrete individual inductor components within a population of inductors 342. For example, any 50 nH inductor obtained from population of inductors 342 may exhibit an actual inductance within a range of 50±5% nH. The use of an adaptable LUT as discussed above can deliver highly effective linearization because it adapts itself to account for any actual inductance that inductor 136 may exhibit within the ±5% tolerance range. But an unadaptable LUT desirably accounts for the actual inductance of inductor 136 using a technique other than adaptation in order to achieve highly effective linearization. In one embodiment, inductor 136 may be obtained from a population of inductors 342 that exhibits a very tight tolerance (e.g., ±0.5%). But this embodiment leads to a higher cost device. Lower cost techniques are discussed below.

Another way in which variance in the inductance exhibited by inductor 136 may be observed is by operating transmitter 50 over a wide temperature range, causing the inductance exhibited by inductor 136 to vary. For normal operating temperatures, the temperature-induced inductance variation is small and may be ignored. For transmitters 50 required to operate over wider temperature ranges, inductor 136 may be selected from a higher quality and more expensive population of inductors 342 which exhibits an unusually small temperature coefficient. But a lower cost alternative is discussed below.

In one embodiment, power bus 330 couples to an input of a digitizer 344, and an output of digitizer 344 generates an actual voltage signal 344 and couples to an input of nonlinear predistorter 58. Desirably, digitizer 344 may be configured as an inexpensive variety of analog-to-digital converter that operates at a low sampling rate because the actual voltage of dischargeable and rechargeable battery 324 varies slowly and because high precision may not be required.

In one embodiment (not shown), the feedback section 84 discussed above in connection with FIG. 3 may be entirely omitted in this FIG. 20 embodiment. In this embodiment, linear predistorter 64 may be implemented as a fixed FIR filter having coefficients that need not change rather than the adaptable filter discussed above in connection with FIG. 3. And AGC 62 may be controlled in response to a temperature signal obtained from amplifier 70, perhaps in conjunction with actual voltage signal 346.

In another embodiment, feedback path processing section 84 is included in transmitter 50, but it is configured to implement low bandwidth processing in this embodiment. The low bandwidth processing consumes less power than the high bandwidth processing discussed above and uses less expensive components. In particular, directional coupler 72 may reside between amplifier 70 and antenna 74 and generates feedback signal 78. Feedback signal 78 is a low power version of amplified RF signal 76 and conveys energy over an extra wide bandwidth. Feedback signal 78 couples to feedback section 84 at an analog downconverter 348, which desirably operates coherently with upconverter 68. A baseband analog feedback signal 350 is provided by downconverter 348 to a low pass filter (LPF) 352 and, in one embodiment, to a band pass filter (BPF) 354. LPF 352 is configured to pass a signal having a bandwidth approximating the bandwidth allocated to transmitter 50 for the transmission of RF energy. BPF 354 is configured to pass a similar bandwidth signal located in frequency just beyond baseband. LPF 352 couples to an average power detector 356, and BPF 354 couples to an average power detector 358. Power detector 356 includes a low pass filter function (not shown) that provides an analog in-band average power signal to a first input of an analog multiplexer 360, and power detector 358 includes a low pass filter function (not shown) that provides an analog out-of-band average power signal 359 to a second input of analog multiplexer 360. Power detectors 356 and 358 may characterize the respective in-band and out-of-band powers in amplified RF signal 76 at the output of transmitter 50 in either absolute or relative terms.

An output of multiplexer 360 couples to an input of an analog-to-digital converter (ADC) 362. Desirably, ADC 362 is configured as an inexpensive variety of analog-to-digital converter that operates at a low sampling rate because the average in-band and out-of-band power signals are confined to a bandwidth less than the bandwidth allocated to transmitter 50 for the transmission of RF energy due to the low pass filter functions of power detectors 356 and 358.

A digital output from ADC 362 couples to a software programmable controller 364 which controls outputs that couple to inputs of AGC 62 and linear predistorter 64. In one embodiment, an output from controller 364 provides a selection signal 366 to nonlinear predistorter 58. Programmable controller 364 processes low bandwidth signals and may be provided by a programmable digital signal processor, microprocessor, microcontroller, or the like. In one embodiment, ADC 362 may be included within controller 364. And, controller 364 may perform many other tasks (not shown) beside the processing of in-band and out-of-band average power signals.

An embodiment in which controller 364 processes the average out-of-band power signal and generates selection signal 366 includes BPF 354, power detector 358, and selection signal 366 (shown using dotted lines in FIG. 20) and may omit digitizer 344 and actual voltage signal 346 (shown using solid lines in FIG. 20). This alternate embodiment indirectly measures the effects of actual battery voltage by monitoring the out-of-band power in amplified RF signal 76. On the other hand, an embodiment that includes digitizer 344 and actual voltage signal 346 (shown using solid lines in FIG. 20) directly measures the actual battery voltage. This embodiment may then omit BPF 354, power detector 358, and selection signal 366 (shown using dotted lines in FIG. 20).

Controller 364 is desirably configured to operate suitable control loops that adapt filter coefficients for the FIR filter used to implement linear predistorter 64 to minimize linear distortion and to adapt AGC 62 to maintain a steady in-band power level. As discussed above, a control loop bandwidth for the AGC control loop is desirably sufficiently high so that AGC 62 tracks thermal effects in amplifier 70. In another embodiment (not shown) an in-band analog signal which bypasses power detector 356 is obtained directly from LPF 352 through multiplexer 360 and ADC 362. This in-band signal may be used to adapt coefficients in linear predistorter 64.

Figure 21:
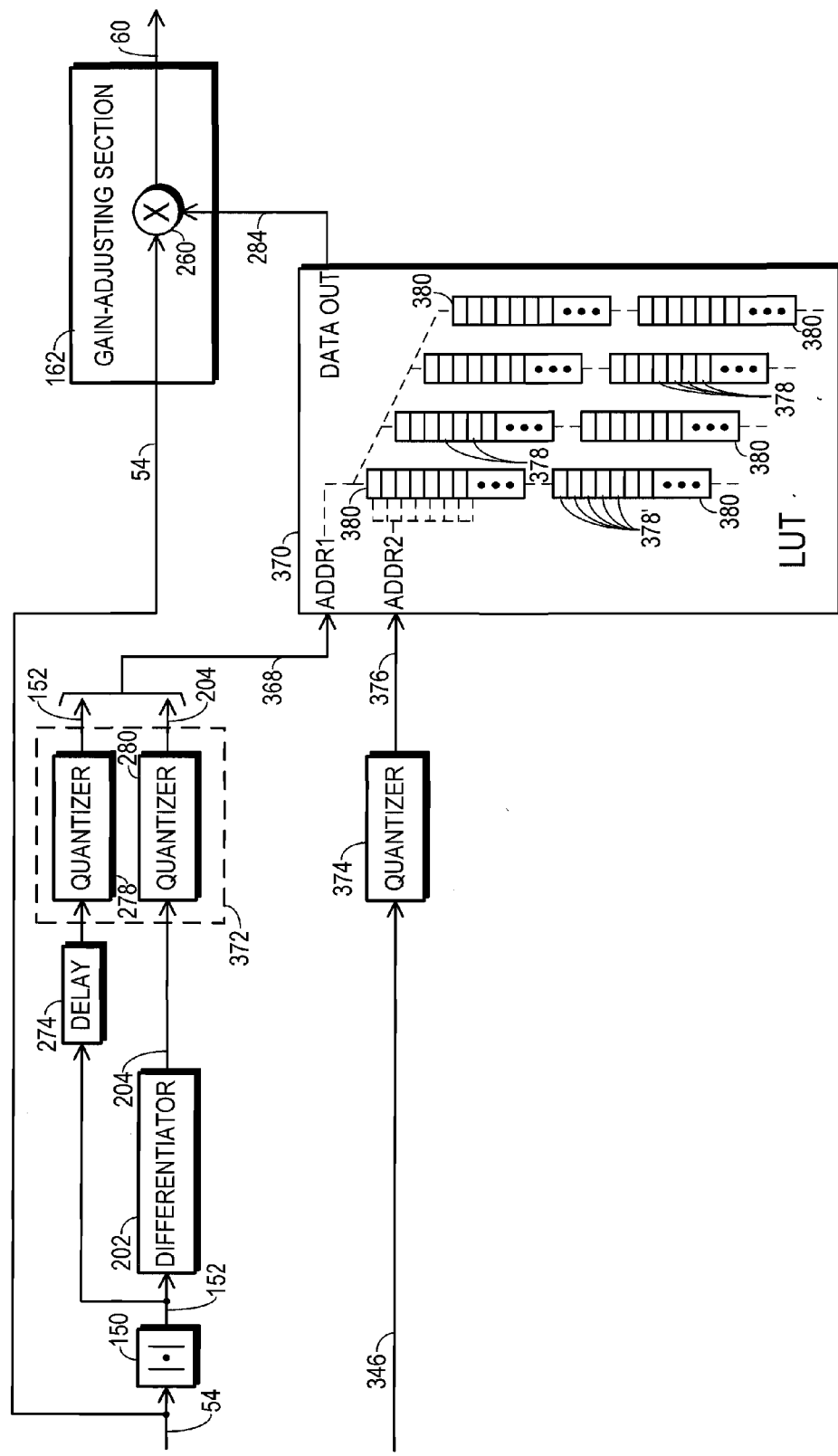
FIG. 21 shows a block diagram of an embodiment of the nonlinear predistorter portion of the transmitter depicted in FIG. 20.

FIG. 21 shows a block diagram of one embodiment of the nonlinear predistorter 58 from the FIG. 20 embodiment of transmitter 50. In this FIG. 21 embodiment the above-discussed variable bias signal parameters have been omitted for the sake of discussion. But these parameters may be added to the FIG. 21 embodiment by following the teaching of FIGS. 13 and 15. As in FIGS. 13, 15, 16, and 17, FIG. 21 drops the complex signal notation used above in FIGS. 8-11.

As in the above-discussed embodiments of nonlinear predistorter 58, communication signal 54 feeds a first input of multiplier 260 within gain-adjusting section 162, and an output of multiplier 260 provides predistortion signal 60. Predistortion signal 60 is the output for gain-adjusting section 162 and for nonlinear predistorter 58. And, communication signal 54 also feeds magnitude extraction section 150 at the increased sample rate, typically in the range of 4-16 times the sampling rate needed to convey signals within the bandwidth allocated to transmitter 50. A magnitude parameter or signal 152 of communication signal 54 is generated by section 150 and provided as an input to delay element 274 and to differentiator 202. Differentiator 202 performs the same derivative-with-respect-to-time function for substantially the same reason as discussed above in connection with FIGS. 9, 13, 15, and 16 and provides magnitude derivative parameter or signal 204 of communication signal 54 at its output. While differentiator 202 is shown as operating on the very same magnitude parameter 152 that is output from magnitude-extracting section 150, this configuration is not a requirement. In another embodiment, differentiator 202 may differentiate a magnitude-squared or other magnitude parameter signal. Delay element 274 is desirably configured so that the versions of magnitude parameter 152 and magnitude derivative parameter 204 appearing at the outputs of delay element 274 and differentiator 202 are aligned in time. These time-aligned versions of magnitude parameter 152 and magnitude derivative parameter 204 are respectively provided to quantizers 278 and 280. Quantizers 278 and 280 are desirably configured to restrict the parameters they quantize to a smaller discrete number of values. Quantized versions of magnitude parameter 152 and magnitude derivative parameter 204 then drive first address inputs 368 of an unadaptable look-up table (LUT) 370. Quantizers 278 and 280 are configured to scale and truncate magnitude parameter 152 and magnitude derivative parameter 204 so that no more first address input bits 368 in LUT 370 are used than are necessary to achieve a desired level of performance. Quantizers 278 and 280 together provide a field 372 of address bits that are directly responsive to communication signal 54 and to magnitude signal 152 and are provided at the increased sampling rate (e.g., 4-16 times the sampling rate needed to convey signals within the bandwidth allocated to transmitter 50).

Actual voltage signal 346 drives an input of a quantizer 374. Quantizer 374 scales and truncates actual voltage signal 346 into a small number of discrete values that drive second address bits 376 of unadaptable LUT 370. Desirably, quantizer 374 is configured so that no more second address bits 376 in LUT 370 are used than are necessary to achieve a desired level of performance. Actual voltage signal 346 is responsive to battery voltage $V_d$ (FIG. 20). Actual voltage signal 346 is substantially unresponsive to communication signal 54 and to magnitude signal 152 and is provided at a decreased sampling rate, and preferably at a vastly decreased sampling rate, relative to the sampling rate of field of address bits 372.

Unadaptable LUT 370 is used by nonlinear predistorter 58 to perform a series of table look-up operations. The series of table look-up operations takes place at the increased sampling rate exhibited by field of address bits 372. But the series of table look-up operations are also performed in conjunction with the lower bandwidth actual voltage signal 346 in this embodiment. As a result of the series of table look-up operations, the data output from unadaptable LUT 370 generates gain correcting signal 284 at the increased sample rate. Gain correcting signal 284 drives a second input of multiplier 260 in gain-adjusting section 162.

Unadaptable LUT 370 differs from above-discussed adaptable LUT's by storing unadaptable data entries 378 rather than adaptable data entries. Unadaptable data entries 378 neither change nor adapt nor are updated nor are overwritten in any significant way in response to the transmission of RF energy from transmitter 50. Unadaptable LUT 370 may be formed as a read only memory (ROM) or programmable ROM (PROM). Or, unadaptable LUT 370 may be formed using flash memory or volatile random access memory (RAM). If RAM is used, then the RAM memory may be battery powered in a manner that renders its stored unadaptable data entries 378 non-volatile, or such volatile memory forms may be used by being loaded with unadaptable data entries 378 from another non-volatile form of memory associated with transmitter 50 when transmitter 50 is powered on.

Unadaptable data entries 378 are predetermined and configured to compensate for nonlinear amplifier transform 98 (FIG. 4) of amplifier 70 (FIG. 20), as represented in the conductance manifold shown in FIGS. 7 and 14. Unadaptable data entries 378 are also collectively predetermined and configured to compensate for a plurality of actual voltages within the voltage range that can be supplied by supply voltage source 324 (FIG. 20). And, unadaptable data entries 378 are further collectively predetermined and configured to compensate for the actual inductance of inductor 136 (FIG. 20) when inductor 136 is obtained from population of inductors 342 (FIG. 20) that exhibits a range of inductance. Exemplary techniques for predetermining unadaptable data entries 378 are discussed below.

Unadaptable LUT 370 may also be viewed as storing a plurality of predetermined low-rate unadaptable data entries 378' for each possible value that can be presented in field of address bits 372, which are high-sampling-rate bits responsive to magnitude signal 152 and magnitude derivative signal 204. In other words, each output sample from unadaptable LUT 370 is generated from a high-rate group 380 of low-rate unadaptable data entries 378', where each high-rate group 380 includes a plurality of low-rate unadaptable data entries 378', each high-rate group 380 is addressed by a different value expressed in first address inputs 368, and each low-rate unadaptable data entry 378' in a given high-rate group 380 provides better nonlinear compensation than the other low-rate unadaptable data entries 378' for that high-rate group 380 at one of the plurality of actual voltages that can be identified in actual voltage signal 346 and at second address bits 376.

Figure 22:
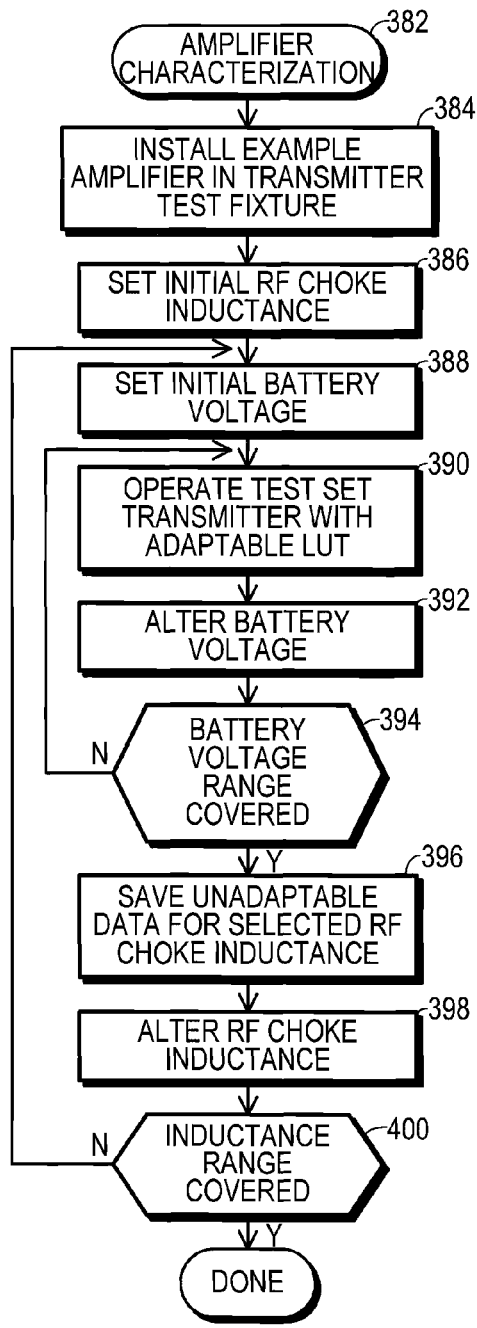
FIG. 22 shows a flow chart of an exemplary process which may be followed to characterize an amplifier prior to manufacturing the transmitter depicted in FIG. 20.

FIG. 22 shows a flow chart of an exemplary process 382 which may be followed to characterize an amplifier 70 prior to manufacturing the transmitter 50 depicted in FIG. 20. In general terms, process 382 generates unadaptable data entries 378 for programming in unadaptable LUT 370 during the manufacture of the embodiments of nonlinear predistorter 58 and transmitter 50 depicted in FIGS. 20 and 21. As discussed above, these unadaptable data entries 378 are not intended to be updated in response to the transmission of RF energy from transmitter 50. Amplifier characterization process 382 may be performed when the semiconductor fabrication process used to manufacture the active amplifying device within RF amplifier 70 is changed. Or, amplifier characterization process 382 may be performed whenever the active amplifying device selected for use within RF amplifier 70 comes from a new batch of manufactured semiconductor devices. Or, process 382 may be performed at any time for statistical testing purposes.

Amplifier characterization process 382 includes a task 384 in which an example active amplifier device of a type to subsequently be used in manufacturing a number of individual transmitter 50 units is installed in a transmitter test fixture (not shown). Desirably, the amplifier test fixture is configured along the lines of the embodiment of transmitter 50 shown in FIG. 3, which includes a high-speed, large bandwidth, feedback processing section 84, adaptive control section 164 (FIG. 13, 15, or 16), and adaptive LUT 282 (FIGS. 13, 15, 16). Otherwise, the test fixture may resemble the transmitter 50 (FIG. 20) that will subsequently be manufactured using an unadaptable LUT 370 (FIG. 21). For example, for the FIG. 21 embodiment of nonlinear predistorter 58, actual voltage signal 346 is desirably used to address the adaptable test set LUT as it is used in the FIG. 21 embodiment to address unadaptable LUT 370.

The test set transmitter desirably includes a couple of enhancements over the FIG. 20 embodiment of transmitter 50. The test set transmitter desirably includes a controllable supply voltage source 324 (FIG. 20) configured to precisely generate a plurality of actual voltages in the voltage range over which a dischargeable and rechargeable battery may be expected to operate. In one embodiment, the plurality of actual voltages are configured as 16 different voltages, equally spaced apart in voltage, and all falling within the voltage range. But other arrangements of actual voltages may be used as well. And, the test fixture desirably includes a variable inductor 136 (FIG. 20). In one embodiment, this variable inductor may be formed using a series arrangement of inductors exhibiting precisely known values. An initial value inductor may exhibit an inductance value precisely known to be at the low end of the inductance range for population 342. The remaining inductors may exhibit precisely known inductances which are much smaller than the initial value. When all the inductors are coupled in series an inductance value precisely known to be at the high end of the inductance range for population 342 is exhibited. But other arrangements of variable inductors may be used as well. Furthermore, the test set transmitter desirably includes circuitry for downloading all data stored in its adaptable LUT to a controller from time to time so that the resulting data set is thereafter available uploading into a transmitter 50 as it is being manufactured.

After task 384, a task 386 sets an initial inductance value for inductor 136 (FIG. 20). The initial value is set so that process 382 may subsequently sweep the range of inductance values exhibited by population 342 (FIG. 20). And, as data are collected for different actual inductance values the actual values are known to a suitable degree of precision. Next, a task 388 sets an initial actual battery voltage for supply voltage source 324 (FIG. 20). The initial value is set so that process 382 may subsequently sweep the voltage range that can be exhibited by dischargeable and rechargeable battery 324. And, as data are collected at different actual voltages, the actual voltages are known to a suitable degree of precision and reflected by actual voltage signal 346.

After task 388, a task 390 operates the test set transmitter at normal sample rates and RF frequencies until its adaptable LUT converges for the currently set inductance and actual voltage values. Desirably, a vast set of random or customized data are used in this operational task, and convergence is declared only after all possible combinations of field of address bits 372 (FIG. 21) have been exhibited many times. Any of a large variety of tests known to those skilled in the art may be applied in determining when convergence has been reached. Then, after convergence a task 392 alters the voltage to a next actual voltage within the voltage range that can be exhibited by dischargeable and rechargeable battery 324. A query task 394 then determines whether the entire voltage range has been covered yet. If not, then process flow returns to task 390 to operate the test set transmitter at the altered actual voltage.

When the entire voltage range has been covered, a task 396 is performed to save the data from the test set's adaptable LUT. Then, a task 398 alters the inductance value of the RF choke or other inductor 136 to exhibit the next inductance, and a query task 400 determines whether the entire inductance range has been covered. If not, then process flow returns to task 388 to operate the test set transmitter to sweep the voltage range again, but at this new inductor setting. During this next sweep of the voltage range, LUT convergences will be separately reached for several different actual voltages, as discussed above.

When the entire inductance range has been covered and separate versions of the adaptable data entries from the test set's adaptable LUT have been saved at different inductance settings, process 382 is done. But those skilled in the art will appreciate that process 382 may nevertheless be configured in a variety of different ways and may include additional tasks. For example, process 382 may also include tasks that use the test set transmitter to converge upon coefficients for linear predistorter 64 (FIG. 20). And, as discussed below in connection with FIGS. 24-26, unadaptable LUT 370 may be configured in a variety of different ways that suggest alterations in the precise process flow and tasks shown in FIG. 22.

Figure 23:
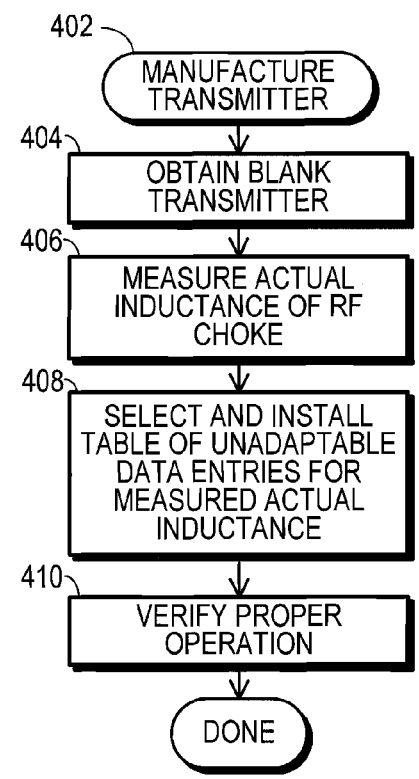
FIG. 23 shows a flow chart of an exemplary process which may be followed in manufacturing the transmitter depicted in FIG. 20.

FIG. 23 shows a flow chart of an exemplary process 402 which may be followed in manufacturing the embodiment of transmitter 50 depicted in FIG. 20. Manufacture transmitter process 402 is intended to be performed for each transmitter 50 being manufactured. Process 402 includes a task 404 in which a blank transmitter 50 is obtained. For the purposes of task 404, a blank transmitter 50 is one in which all, or nearly all, of its hardware has been assembled. But unadaptable data entries 378 have not yet been provided to the transmitter 50. After task 404, a task 406 measures the actual inductance of the RF choke or other inductor 136. In one embodiment, this may be accomplished using a manufacturing jig that measures the actual inductance of inductor 136 to a suitable degree of precision after inductor 136 has been installed. The degree of precision to which the actual inductance is measured is commensurate with the inductance step size used in amplifier characterization process 382 (FIG. 22). In another embodiment, an individual inductor 136 may be obtained from population 342 of inductors during task 406, measured, and installed in transmitter 50 during task 406. Regardless of the specific configuration of task 406, at the end of task 406 inductor 136 has been installed in transmitter 50, and its actual inductance is known to a suitable degree of precision.

Following task 406, a task 408 selects and installs unadaptable data entries 378 in unadaptable LUT 370. The unadaptable data entries 378 that are installed may be the same data set that was saved during one of the iterations of task 396 in process 382 (FIG. 22). The specific iteration is the one for which the test inductance was closest to the inductance measured in task 406. In one embodiment, task 408 may select two data sets saved in two different iterations of task 396 for inductance values immediately above and below the inductance value measured in task 406, then iterate between the two data sets as indicated by the actual measured value. At the completion of task 408, at least a portion of unadaptable data entries 378 are configured and predetermined to compensate for the actual inductance of inductor 136 installed in transmitter 50.

Next, a task 410 is performed to verify the proper operation of transmitter 50. Task 410 may be performed by operating transmitter 50 for a brief period to transmit a random or customized data set, and measuring the resulting amplified RF signal 76 to verify that spectral regrowth remains confined within specifications. Desirably, such a test will also be configured to use a supply voltage source 324 that may be varied between full recharge and full discharge voltages during task 410. After task 410, process 402 is done, and the manufacture of transmitter 50 may be viewed as being complete.

FIG. 24 shows a first alternate embodiment of unadaptable LUT 370, depicted in the predistorter 58 of FIG. 21. In the FIG. 24 embodiment, unadaptable LUT 370 has been subdivided into an array of smaller parts 370', labeled $LUT_{P-1,1}$ to $LUT_{P-M,N}$. The rows of this array contain unadaptable LUT parts 370' distinguished from each other by storing unadaptable data entries 378 which compensate for all magnitude-related influences of the communication signal at the different voltages at which dischargeable and rechargeable battery 324 may operate. The columns of this array contain unadaptable LUT parts 370' distinguished from each other by storing unadaptable data entries 378 which compensate for all magnitude-related influences of the communication signal at the different inductances which may be exhibited by an actual inductor 136 selected from population 342 of inductors, including inductances that may be exhibited over the temperature range of operation for transmitter 50. Each unadaptable LUT part 370' is addressed by the magnitude-responsive field of address bits 372 so that each unadaptable LUT part 370' compensates for all magnitude-related influences of the communication signal. A data output from each unadaptable LUT part 370' is routed to a separate input of a multiplexer 412. An output of multiplexer 412 provides gain correcting signal 284.

In one embodiment, a selection input to multiplexer 412 is driven by selection signal 366 from controller 364 (FIG. 20). As discussed above, controller 364 may, in one embodiment, monitor average out-of-band power at the output of transmitter 50 and control selection signal 366 to minimize the average out-of-band power. Accordingly, a series of table look-up operations are performed in conjunction with a signal that characterizes average out-of-band power to generate gain correcting signal 284 from a plurality of different unadaptable data entries 378. The plurality of different unadaptable data entries 378 are provided by the plurality of different unadaptable LUT parts 370'.

Those skilled in the art may devise a variety of different control algorithms which maintain the selection of multiplexer 412 at the best unadaptable LUT part 370' for a current actual inductance and actual voltage situation. In one approach, during low or brief test duty cycle periods controller 364 may sequentially operate transmitter 50 to test each of the unadaptable LUT parts 370' while monitoring average out-of-band power resulting from the use of the different LUT parts 370'. Then, at high or lengthy normal duty cycle periods, controller 364 may simply cause multiplexer 412 to select the best unadaptable LUT part 370' from the previous test period. In another embodiment, the low duty cycle may merely test transmitter 50 with those unadaptable LUT parts 370' associated with actual inductances and actual battery voltages immediately above and below the actual inductance and actual battery voltage associated with the currently selected unadaptable LUT part 370'. In this version, during an extremely low duty cycle test period, controller 364 may operate transmitter 50 to test all unadaptable LUT parts 370'. But neither of these control algorithms are a requirement, and those skilled in the art may devise others that are effective in keeping average out-of-band emissions within specifications while limiting momentary out-of-band emissions.

The embodiment of LUT 370 presented in FIG. 24 may benefit from modifications to the processes discussed above in connection with FIGS. 22 and 23. For example, during amplifier characterization process 382 a larger number of smaller data sets may be stored for each iteration of inductance and voltage, rather than a smaller number of larger data sets that process 382 stores only for each iteration of inductance alone. And, manufacturing process 402 need not specifically measure the inductance of inductor 136 installed in transmitter 50.

In an alternate embodiment, the FIG. 24 embodiment of LUT 370 may be modified to include only a single column of LUT parts 370', where that one column compensates only for the actual inductance measured for inductor 136 installed in transmitter 50, and measured as discussed above in connection with FIG. 23.

FIG. 25 shows a second alternate embodiment of unadaptable look-up table 370 depicted in the predistorter 58 of FIG. 21. In the FIG. 25 embodiment, unadaptable LUT 370 has been subdivided into a column of smaller LUT parts 370', labeled $LUT_{P-1}$ to $LUT_{P-M}$. In this embodiment, the different unadaptable LUT parts 370' are distinguished from each other by storing unadaptable data entries 378 which compensate for all magnitude-related influences of the communication signal at the different voltages at which dischargeable and rechargeable battery 324 may operate. Each LUT part 370' is configured only for the actual inductance of inductor 136, as measured in process 402 (FIG. 23). Each unadaptable LUT part 370' is addressed by the magnitude-responsive field of address bits 372 so that each unadaptable LUT part 370' compensates for all magnitude-related influences of the communication signal. A data output from each unadaptable LUT part 370' is routed to a separate input of multiplexer 412. An output of multiplexer 412 provides gain correcting signal 284. In this embodiment, the selection input of multiplexer 412 may be supplied from either actual voltage signal 346, as discussed above in connection with FIG. 21, or out-of-band selection signal 366, as discussed above in connection with FIG. 24.

FIG. 26 shows a third alternate embodiment of unadaptable look-up table 370 depicted in the predistorter 58 of FIG. 21. In this FIG. 26 embodiment, unadaptable LUT 370 has been subdivided into two smaller LUT parts 370', labeled $LUT_1$ and $LUT_2$. Each unadaptable LUT part 370' is addressed by the magnitude-responsive field of address bits 372 so that each unadaptable LUT part 370' compensates for all magnitude-related influences of the communication signal. One LUT part 370' is configured to provide compensation for all magnitude-related influences of the communication signal at the actual inductance of inductor 136 and measured in process 402 (FIG. 23) and at the minimum, discharged voltage at which dischargeable and rechargeable battery 324 may operate. The other LUT part 370' is configured to provide compensation for all magnitude-related influences of the communication signal at the actual inductance of inductor 136 and at the maximum, fully charged voltage at which dischargeable and rechargeable battery 324 may operate.

Data outputs from each unadaptable LUT part 370' are provided to inputs of an interpolator 414. During each access to LUT 370, interpolator 414 interpolates between the two unadaptable data entries 378 provided to it by the two LUT parts 370'. The degree of interpolation is controlled by a selection signal, which may be provided either in response to actual voltage signal 346 or to out-of-band power selection signal 366.

The embodiment of LUT 370 presented in FIG. 26 may also benefit from modifications to the processes discussed above in connection with FIGS. 22 and 23. For example, during amplifier characterization process 382 voltage needs to iterate only between a minimum and a maximum voltage. Two data sets may be stored for each iteration of inductance, with one data set being associated with the minimum voltage and the other being associated with the maximum voltage.

If out-of-band power selection signal 366 is used to control the degree of interpolation, then a different control algorithm may be more desirable. For example, during normal operation controller 364 may dither the interpolation degree marginally upward and marginally downward while monitoring the average out-of-band power. A current interpolation degree may be revised in one direction or another when the dithering indicates that improvement will result from a revision in that direction. But this control algorithm is not a requirement, and those skilled in the art may devise other effective control algorithms.

In summary, at least one embodiment of the present invention provides a linearized transmitter and a transmitter linearizing method that expand linearization efforts to address inductively induced distortion, including distortion resulting from video signal bias modulation. In accordance with at least one embodiment, effective amounts of linearization are provided at low power. In accordance with at least one embodiment, a memoryless nonlinear predistorter is provided that compensates for video signal effects. In accordance with at least one embodiment, a network of components coupled to an active amplifying device is configured to minimize memory effects. In accordance with at least one embodiment, a nonlinear predistorter utilizes an unadaptable look-up table that requires either no feedback processing section or requires only a simplified feedback processing section that utilizes low sample rate, low bandwidth processing.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions.

What is claimed is:

1. A linearized transmitter comprising:
    a communication-signal source configured to produce a communication signal;
    a look-up table having an address input coupled to said communication-signal source and having an output, said look-up table storing unadaptable data;
    a gain-adjusting section having an input coupled to said output of said look-up table and configured to generate a predistorted communication signal;
    an amplifier which applies a nonlinear amplifier transform to a signal formed from said predistorted communication signal and applied at an input of said amplifier;
    a supply voltage source;
    a network of components coupled to said amplifier and said supply voltage source, wherein an amplifier biasing signal is provided from said supply voltage source, through said network of components, to said amplifier; and
    a digitizer having an input coupled to said supply voltage source and an output coupled to said look-up table;
    wherein said unadaptable data stored in said look-up table is configured to compensate at least in part for said nonlinear amplifier transform.

2. A linearized transmitter as claimed in claim 1 wherein said look-up table has first address bits responsive to a magnitude parameter of said communication signal and has at least one second address bit responsive to a derivative of said magnitude parameter.

3. A linearized transmitter as claimed in claim 1 wherein:
    said transmitter additionally comprises a feedback section having an input coupled to said amplifier, said feedback section being configured to generate a signal characterizing average out-of-band power at an output of said transmitter;
    said look-up table is controlled in response to said signal characterizing average out-of-band power to generate a gain-correcting signal from a plurality of entries of said unadaptable data; and
    said gain-adjusting section generates said predistorted communication signal in response to said gain-correcting signal.

4. A linearized transmitter as claimed in claim 3 wherein:
    said transmitter is allocated a bandwidth for the transmission of RF energy; and
    said signal characterizing average out-of-band power exhibits a bandwidth less than said bandwidth allocated to said transmitter for the transmission of RF energy.

5. A linearized transmitter comprising:
    a communication-signal source configured to produce a communication signal;
    a look-up table having an address input coupled to said communication-signal source and having an output, said look-up table storing unadaptable data;
    a differentiator coupled to said look-up table and configured to take a derivative with respect to time of a signal responsive to said communication signal and to produce a derivative signal;
    a gain-adjusting section having an input coupled to said output of said look-up table and configured to generate a predistorted communication signal which is responsive to said derivative signal; and
    an amplifier which applies a nonlinear amplifier transform to a signal formed from said predistorted communication signal and applied at an input of said amplifier;
    wherein said unadaptable data stored in said look-up table is configured to compensate at least in part for said nonlinear amplifier transform.

6. A linearized transmitter as claimed in claim 5 wherein said look-up table has first address bits responsive to a magnitude parameter of said communication signal and has at least one second address bit responsive to said derivative signal.

7. A linearized transmitter as claimed in claim 5 additionally comprising a network of components coupled to said amplifier, said network of components being configured to exhibit an impedance to said amplifier that either remains constant with increasing frequency or increases with increasing frequency substantially throughout a video bandwidth.

8. A linearized transmitter as claimed in claim 5 additionally comprising a network of components coupled to said amplifier, said network of components being configured to exhibit an impedance to said amplifier that has no more than one impedance minima in an upper 99% portion of a video bandwidth.

9. A linearized transmitter comprising:
    a communication-signal source configured to produce a communication signal;
    a look-up table having an address input coupled to said communication-signal source and having an output, said look-up table storing unadaptable data;
    a gain-adjusting section having an input coupled to said output of said look-up table and configured to generate a predistorted communication signal;
    an amplifier which applies a nonlinear amplifier transform to a signal formed from said predistorted communication signal and applied at an input of said amplifier;
    a network of components coupled to said amplifier and configured to supply an amplifier biasing signal to said amplifier;
    wherein:
        said network of components includes an inductor configured so that said amplifier biasing signal passes through said inductor;
        said inductor is obtained from a population of inductors which exhibits a range of inductance;
        said unadaptable data stored in said look-up table is configured to compensate at least in part for said nonlinear amplifier transform; and
        at least a portion of said unadaptable data stored in said look-up table are predetermined to compensate for an actual inductance exhibited by said inductor, wherein said actual inductance is within said range of inductance.

10. A linearized transmitter comprising:
a communication-signal source configured to produce a communication signal;
a look-up table having an address input coupled to said communication-signal source and having an output, said look-up table storing unadaptable data;
a gain-adjusting section having an input coupled to said output of said look-up table and configured to generate a predistorted communication signal;
an amplifier which applies a nonlinear amplifier transform to a signal formed from said predistorted communication signal and applied at an input of said amplifier;
a supply voltage source which supplies a voltage that varies within a voltage range; and
a network of components coupled between said amplifier and said supply voltage source;
wherein said unadaptable data stored in said look-up table is configured to compensate at least in part for said nonlinear amplifier transform; and
wherein said unadaptable data stored in said look-up table are predetermined to compensate for a plurality of actual voltages within said voltage range that can be supplied by said supply voltage source.

11. A method as claimed in claim 10 wherein:
said look-up table is addressed by a field of address bits which are responsive to said communication signal;
for each value presented by said field of address bits, said look-up table includes a plurality of unadaptable data entries; and
said plurality of unadaptable data entries included for each value presented by said field of address bits differs from the others by providing compensation for different ones of said plurality of actual voltages.

12. A linearized transmitter as claimed in claim 10 wherein said supply voltage source is a dischargeable and rechargeable battery.

13. A method of linearizing a transmitter having an amplifier which applies a nonlinear amplifier transform to a signal input at said amplifier, said method comprising:
biasing said amplifier from a supply voltage that varies within a voltage range and is applied through a network of components to said amplifier;
providing a communication signal;
performing a series of table look-up operations in response to said communication signal to generate a gain-correcting signal, said series of table look-up operations being performed using a look-up table storing unadaptable data configured to compensate at least in part for said nonlinear amplifier transform of said amplifier, and said unadaptable data stored in said look-up table being predetermined to compensate for a plurality of actual voltages within said voltage range that can be supplied by said supply voltage source;
distorting said communication signal in response to said gain-correcting signal to produce a predistorted communication signal; and
forming said signal input at said amplifier in response to said predistorted communication signal.

14. A method as claimed in claim 13 wherein said look-up table has first address bits responsive to a magnitude parameter of said communication signal and has at least one second address bit responsive to a derivative of said magnitude parameter.

15. A method as claimed in claim 13 wherein:
a supply voltage source generates a supply voltage that varies within a voltage range and provides an amplifier biasing signal through a network of components to said amplifier; and
said gain-correcting signal is responsive to said supply voltage.

16. A method as claimed in claim 13 additionally comprising:
generating a signal characterizing average out-of-band power at an output of said transmitter; and
performing said series of table look-up operations in conjunction with said signal characterizing average out-of-band power to generate said gain-correcting signal from a plurality of entries of said unadaptable data.

17. A method as claimed in claim 16 wherein:
said transmitter is allocated a bandwidth for the transmission of RF energy; and
said method additionally comprises configuring said signal characterizing average out-of-band power to exhibit a bandwidth less than said bandwidth allocated to said transmitter for the transmission of RF energy.

18. A method as claimed in claim 13 wherein
said look-up table is addressed by a field of address bits which are responsive to said communication signal;
for each value presented by said field of address bits, said look-up table includes a plurality of unadaptable data entries; and
said plurality of unadaptable data entries included for each value presented by said field of address bits differ from each other by providing compensation for different ones of said actual voltages.

19. A method as claimed in claim 13 wherein said supply voltage is provided by a dischargeable and rechargeable battery.

20. A method of linearizing a transmitter having an amplifier which applies a nonlinear amplifier transform to a signal input at said amplifier, said method comprising:
providing a communication signal;
performing a series of table look-up operations in response to said communication signal to generate a gain-correcting signal, said series of table look-up operations being performed using a look-up table storing unadaptable data configured to compensate at least in part for said nonlinear amplifier transform of said amplifier;
taking a derivative with respect to time of a signal responsive to said communication signal to produce a derivative signal;
distorting said communication signal in response to said gain-correcting signal and said derivative signal to produce a predistorted communication signal; and
forming said signal input at said amplifier in response to said predistorted communication signal.

21. A method as claimed in claim 20 wherein said look-up table has first address bits responsive to a magnitude parameter of said communication signal and has at least one second address bit responsive to said derivative signal.

22. A method of linearizing a transmitter having an amplifier which applies a nonlinear amplifier transform to a signal input at said amplifier and having a network of components coupled to said amplifier, said method comprising:
configuring said network of components to exhibit an impedance to said amplifier that either remains constant with increasing frequency or increases with increasing frequency substantially throughout a video bandwidth;
providing a communication signal;

performing a series of table look-up operations in response to said communication signal to generate a gain-correcting signal, said series of table look-up operations being performed using a look-up table storing unadaptable data configured to compensate at least in part for said nonlinear amplifier transform of said amplifier;

distorting said communication signal in response to said gain-correcting signal to produce a predistorted communication signal; and forming said signal input at said amplifier in response to said predistorted communication signal.

23. A method of linearizing a transmitter having an amplifier which applies a nonlinear amplifier transform to a signal input at said amplifier, said method comprising:

supplying an amplifier biasing signal to said amplifier through a network of components having an inductor through which said amplifier biasing signal passes, wherein said inductor is obtained from a population of inductors which exhibits a range of inductance;

providing a communication signal;

performing a series of table look-up operations in response to said communication signal to generate a gain-correcting signal, said series of table look-up operations being performed using a look-up table storing unadaptable data configured to compensate at least in part for said nonlinear amplifier transform of said amplifier, wherein at least a portion of said unadaptable data stored in said look-up table are predetermined to compensate for an actual inductance exhibited by said inductor, wherein said actual inductance is within said range of inductance;

distorting said communication signal in response to said gain-correcting signal to produce a predistorted communication signal; and forming said signal input at said amplifier in response to said predistorted communication signal.

24. A linearized transmitter having an amplifier which applies a nonlinear amplifier transform to a signal input at said amplifier, said transmitter comprising:

a dischargeable and rechargeable battery which provides a supply voltage that varies within a voltage range;

a network of components coupled to said battery and to said amplifier, said network of components being configured to exhibit an impedance to said amplifier that either remains constant with increasing frequency or increases with increasing frequency substantially throughout a video bandwidth, and said network of components providing an amplifier biasing signal to said amplifier which is generated in response to said supply voltage;

a communication-signal source configured to produce a communication signal;

a look-up table having first address bits responsive to a magnitude parameter of said communication signal and at least one second address bit responsive to a derivative of said magnitude parameter, said look-up table storing unadaptable data configured to compensate at least in part for said nonlinear amplifier transform; and a gain-adjusting section having an input coupled to said look-up table and configured to generate a predistorted communication signal responsive to said magnitude parameter of said communication signal, said derivative of said magnitude parameter, and said supply voltage;

wherein said signal input at said amplifier is formed from said predistorted communication signal.

25. A linearized transmitter as claimed in claim 24 wherein:

said network of components includes an inductor configured so that said amplifier biasing signal passes through said inductor;

said inductor is obtained from a population of inductors which exhibits a range of inductance; and at least a portion of said unadaptable data stored in said look-up table are predetermined to compensate for an actual inductance exhibited by said inductor, wherein said actual inductance is within said range of inductance.

26. A linearized transmitter as claimed in claim 24 wherein said unadaptable data stored in said look-up table are predetermined to compensate for supply voltage variation among a plurality of actual voltages within said voltage range that can be supplied by said dischargeable and rechargeable battery.

* * * * *